United States Patent [19]

Korff William W.

[11] 4,357,665
[45] Nov. 2, 1982

[54] PROGRAMMABLE ELECTRONIC REAL-TIME LOAD CONTROLLER PROVIDING DEMAND LIMIT CONTROL

[75] Inventor: William W. Korff, Seattle, Wash.

[73] Assignee: Butler Manufacturing Company, Kansas City, Mo.

[21] Appl. No.: 107,582

[22] Filed: Dec. 27, 1979

[51] Int. Cl.³ .................... G01R 21/00; G06F 15/06
[52] U.S. Cl. .................................. 364/492; 364/493; 307/35; 307/39
[58] Field of Search ............... 364/492, 493, 483, 103, 364/900, 120, 138, 188; 324/103 R; 307/35, 38, 39, 41, 52, 62, 40

[56] References Cited

U.S. PATENT DOCUMENTS

| | | | |
|---|---|---|---|
| 3,964,676 | 6/1976 | Rooks et al. | 236/46 R |
| 4,064,485 | 12/1977 | Leyde | 307/39 |
| 4,071,745 | 1/1978 | Hall | 364/104 |
| 4,125,782 | 11/1978 | Pollnow, Jr. | 364/493 |
| 4,136,392 | 1/1979 | Westphal et al. | 364/492 |
| 4,153,936 | 5/1979 | Schmitz et al. | 364/493 |
| 4,180,744 | 12/1979 | Helwig, Jr. | 307/39 |
| 4,181,950 | 9/1977 | Carter | 364/492 |
| 4,213,182 | 7/1980 | Eichelberger et al. | 364/120 |
| 4,216,384 | 8/1980 | Hurley | 307/39 |
| 4,217,646 | 8/1980 | Caltagirone et al. | 364/493 |
| 4,293,915 | 10/1981 | Carpenter et al. | 364/493 |

OTHER PUBLICATIONS

"W977 Load Management System Reduces Electric Bills by Restricting Kilowatt Demand and Programming Loads On and Off for Time of Day", published by Honeywell in Dec., 1977.

Primary Examiner—Krass Errol A.
Assistant Examiner—Gary Chin
Attorney, Agent, or Firm—Christensen, O'Connor, Johnson & Kindness

[57] ABSTRACT

A programmable electronic real-time load controller includes: a plurality of load control circuits, each being adapted to be interconnected with a load; a hardware clock; and, a data processor, operating under control of a set of program instructions stored in a program memory thereof, for implementing real-time control by comparing real-time information from the hardware clock with a time schedule stored in an event memory, and accordingly establishing an on state or an off state for each load, the on state representing a desired load-on state for the associated load control circuit and the off state representing a desired load-off state for the associated load control circuit. In order that the controller may also implement demand limit control, the controller is provided with additional components including a sensor for measuring the actual rate of power consumption by the loads, a set point selector for selecting a set point representing a desired rate of power consumption, and an additional program memory storing a set of program instructions for demand limit control. The data processor is responsive to this set of program instructions to: obtain the actual power rate and the set point from the sensor and the set point selector, respectively; compare the actual power rate with the set point; and, for those loads in an on state under real-time control, vary the number of loads actually energized and de-energized so as to maintain the actual rate substantially equal to the set point. The additional components for demand limit control are preferably mounted on a printed circuit card adapted to be inserted into a housing of the controller and interconnected with the data processor therein.

23 Claims, 38 Drawing Figures

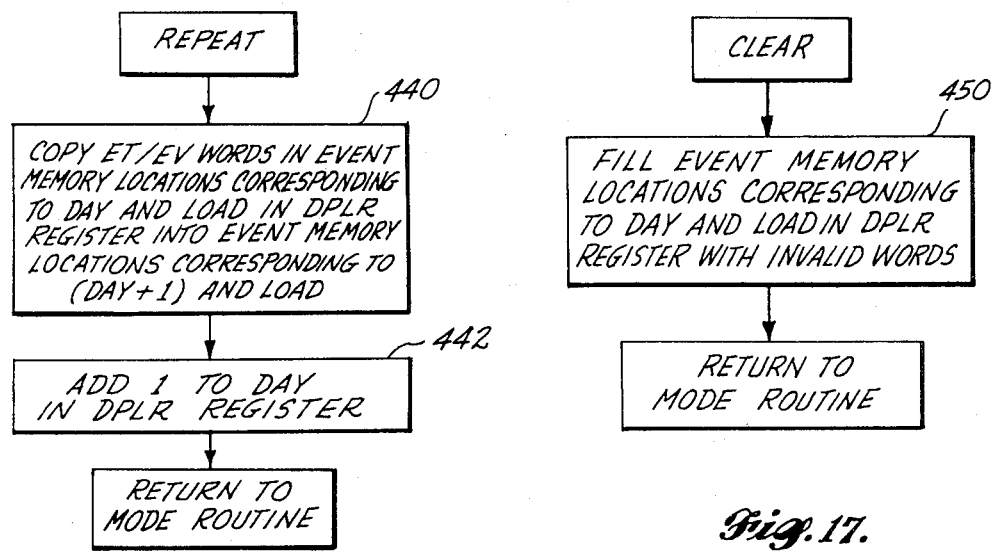
Fig. 16.
Fig. 17.
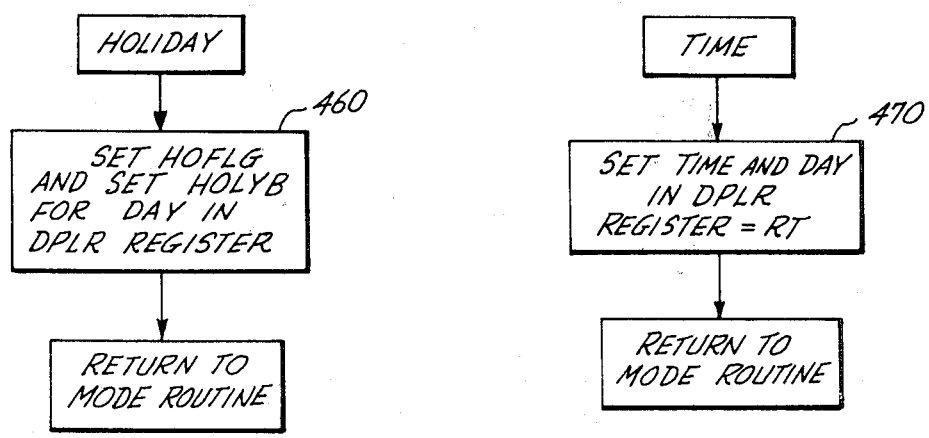
Fig. 18.
Fig. 19.

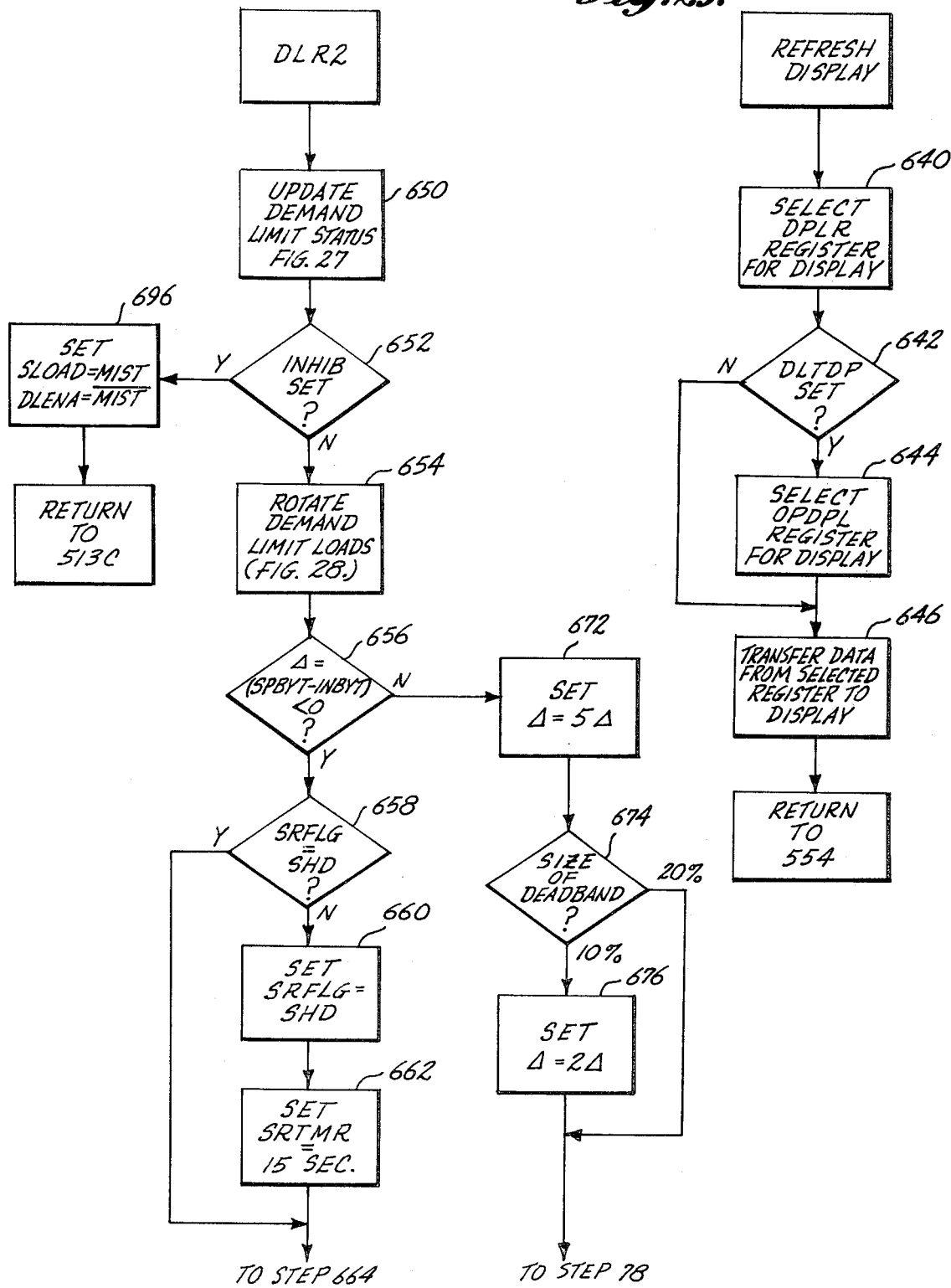

*Fig. 32.*

| OUTPUT STATUS LOGIC MAP | | | |
|---|---|---|---|
| TIME SCHEDULE | DEM. SELECT SW. | DEMAND LIMITER | OUTPUT STATUS |
| ON | DE-SELECT | SHED, RESTORED | ON |
| ON | SELECT | RESTORED | RESTORED |
| ON | SELECT | SHED | SHED |
| OFF | SELECT, DE-SELECT | SHED, RESTORED | OFF |

| OUTPUT STATUS TRANSITION | MINIMUM TIMER MUST HAVE TIMED OUT | START MINIMUM TIMER |
|---|---|---|
| 1) ON → RESTORED | — | RESTORE TIMER |
| 2) ON → SHED | (NOT ALLOWED) | |
| 3) ON → OFF | — | — |
| 4) RESTORED → ON | — | — |
| 5) RESTORED → SHED | RESTORE TIMER | SHED TIMER |
| 6) RESTORED → OFF | — | — |
| 7) SHED → ON | SHED TIMER | — |
| 8) SHED → RESTORED | SHED TIMER | RESTORE TIMER |
| 9) SHED → OFF | — | — |
| 10) OFF → ON | — | — |
| 11) OFF → RESTORED | — | RESTORE TIMER |
| 12) OFF → SHED | (NOT ALLOWED) | |

*Fig. 33.*

| PROGRAM STEP | PASS #1 TIME 00:00 POWER UP | PASS #2 00:30 OPERATOR SELECTS LOADS 6 & 7 FOR DEMAND CONTROL | PASS #3 01:00 TIME ELAPSE SO THAT LOADS 4&8 ARE ON | PASS #4 02:00 TIME ELAPSE SO THAT LOADS 2,4&5 ARE OFF | PASS #5 02:30 OPERATOR DE-SELECTS LOADS 1&6 FOR DEMAND CONTROL | PASS #6 03:00 NO CHANGE | PASS #7 03:00 +1 PASS NO CHANGE |
|---|---|---|---|---|---|---|---|
| | MIST= 00000000<br>MINT= 00000000<br>SLOAD= 11111111<br>ASSUME:<br>RTBYT= 00110011<br>DSLEC= 00001111 | RTBYT= 00110011<br>DSLEC= 01101111 | RTBYT= 10110111<br>DSLEC= 01101111 | RTBYT= 10100011<br>DSLEC= 01101111 | RTBYT= 10100001<br>DSLEC= 01001110 | | |
| 700 | MIST= 00000000<br>DSLEC= 00001111<br>RTBYT= 00110011<br>DLOAD= 00000011 | MIST= 00000011<br>DSLEC= 01101111<br>RTBYT= 00110011<br>DLOAD= 00100011 | MIST= 00000011<br>DSLEC= 01101111<br>RTBYT= 10110111<br>DLOAD= 00100011 | MIST= 00000011<br>DSLEC= 01101111<br>RTBYT= 10100001<br>DLOAD= 00100001 | MIST= 00000001<br>DSLEC= 01001110<br>RTBYT= 10100001<br>DLOAD= 00000001 | MIST= 00000001<br>DSLEC= 01001110<br>RTBYT= 10100001<br>DLOAD= 00000001 | MIST= 00000000<br>DSLEC= 01001110<br>RTBYT= 10100001<br>DLOAD= 00000001 |
| 702 | SLOAD= 11111111<br>DLOAD= 00000000<br>SLOAD= 00000011 | SLOAD= 00000011<br>DLOAD= 00100011<br>SLOAD= 00000011 | SLOAD= 00000011<br>DLOAD= 00100011<br>SLOAD= 00000011 | SLOAD= 00000011<br>DLOAD= 00100001<br>SLOAD= 00000001 | SLOAD= 00000001<br>DLOAD= 00000001<br>SLOAD= 00000001 | SLOAD= 00000001<br>DLOAD= 00000001<br>SLOAD= 00000001 | SLOAD= 00000001<br>DLOAD= 00000001<br>SLOAD= 00000001 |
| 704 | DLOAD= 00000011<br>SLOAD= 11111100<br>(NEW)RLOAD= 00100000 | DLOAD= 00100011<br>SLOAD= 11111100<br>(NEW)RLOAD= 00100000 | DLOAD= 00100011<br>SLOAD= 11111100<br>(NEW)RLOAD= 00101000 | DLOAD= 00100001<br>SLOAD= 11111110<br>(NEW)RLOAD= 00100000 | DLOAD= 00000001<br>SLOAD= 11111110<br>(NEW)RLOAD= 00000000 | DLOAD= 00000001<br>SLOAD= 11111110<br>(NEW)RLOAD= 00000000 | DLOAD= 00000000<br>SLOAD= 11111111<br>(NEW)RLOAD= 00000000 |
| 706 | (NEW)RLOAD= 00000000<br>(OLD)RLOAD= ?<br>(ADDED)RLOAD= 00000000 | (NEW)RLOAD= 00100000<br>(OLD)RLOAD= 11111111<br>(ADDED)RLOAD= 00100000 | (NEW)RLOAD= 00101000<br>(OLD)RLOAD= 11011111<br>(ADDED)RLOAD= 00001000 | (NEW)RLOAD= 00100000<br>(OLD)RLOAD= 10101010<br>(ADDED)RLOAD= 00000000 | (NEW)RLOAD= 00000001<br>(OLD)RLOAD= 11011111<br>(ADDED)RLOAD= 00000000 | (NEW)RLOAD= 00000000<br>(OLD)RLOAD= 11111111<br>(ADDED)RLOAD= 00000000 | (NEW)RLOAD= 00000000<br>(OLD)RLOAD= 11111111<br>(ADDED)RLOAD= 00000000 |
| 708 | YES → | NO → | NO → | NO → | NO → | NO → | NO → |
| 710, 712, 714 | CLEAR RSET<br>MINT 1 = 3 MINUTES<br>MINT 2 = 3 "<br>MINT 3 = 0 "<br>MINT 4 = 0 "<br>MINT 5 = 0 "<br>MINT 6 = 0 "<br>MINT 7 = 0 "<br>MINT 8 = 0 " | MINT 1 = 2.5 MINUTES<br>MINT 2 = 2.5 "<br>MINT 3 = 0 "<br>MINT 4 = 0 "<br>MINT 5 = 0 "<br>MINT 6 = 3 "<br>MINT 7 = 0 "<br>MINT 8 = 0 " | MINT 1 = 2 MINUTES<br>MINT 2 = 2 "<br>MINT 3 = 0 "<br>MINT 4 = 3 "<br>MINT 5 = 0 "<br>MINT 6 = 2.5 "<br>MINT 7 = 0 "<br>MINT 8 = 0 " | MINT 1 = 1 MINUTES<br>MINT 2 = 1 "<br>MINT 3 = 0 "<br>MINT 4 = 2 "<br>MINT 5 = 0 "<br>MINT 6 = 1.5 "<br>MINT 7 = 0 "<br>MINT 8 = 0 " | MINT 1 = 0.5 MINUTES<br>MINT 2 = 0 "<br>MINT 3 = 0 "<br>MINT 4 = 0 "<br>MINT 5 = 0 "<br>MINT 6 = 1 "<br>MINT 7 = 0 "<br>MINT 8 = 0 " | MINT 1 = 0 MINUTES<br>MINT 2 = 0 "<br>MINT 3 = 0 "<br>MINT 4 = 0 "<br>MINT 5 = 0 "<br>MINT 6 = 0 "<br>MINT 7 = 0 "<br>MINT 8 = 0 " | MINT 1 = 0 MINUTES<br>MINT 2 = 0 "<br>MINT 3 = 0 "<br>MINT 4 = 0 "<br>MINT 5 = 0 "<br>MINT 6 = 0 "<br>MINT 7 = 0 "<br>MINT 8 = 0 " |
| 716 | MINT= 00000011 | MINT= 00100011 | MINT= 00101011 | MINT= 00101011 | MINT= 00100001 | MINT= 00000000 | MINT= 00000000 |

Fig. 34(a).

| PROGRAM STEP | PASS #1 (CONT.) | PASS #2 (CONT.) | PASS #3 (CONT.) | PASS #4 (CONT.) | PASS #5 (CONT.) | PASS #6 (CONT.) | PASS #7 (CONT.) |
|---|---|---|---|---|---|---|---|
| 718 | MINT = 00000011<br>SLOAD = 00000011<br>MIST = 00000011 | MINT = 00100011<br>SLOAD = 00000011<br>MIST = 00000011 | MINT = 00101011<br>SLOAD = 00000011<br>MIST = 00000011 | MINT = 00101011<br>SLOAD = 00000001<br>MIST = 00000001 | MINT = 00100001<br>SLOAD = 00000001<br>MIST = 00000001 | MINT = 00000000<br>SLOAD = 00000001<br>MIST = 00000000 | MINT = 00000000<br>SLOAD = 00000001<br>MIST = 00000000 |
| 720 | MINT = 00000011<br>RLOAD = 00000000<br>MIRT = 00000000 | MINT = 00100011<br>RLOAD = 00100000<br>MIRT = 00100000 | MINT = 00101011<br>RLOAD = 00101000<br>MIRT = 00101000 | MINT = 00101011<br>RLOAD = 00100000<br>MIRT = 00100000 | MINT = 00100001<br>RLOAD = 00000000<br>MIRT = 00000000 | MINT = 00000000<br>RLOAD = 00000000<br>MIRT = 00000000 | MINT = 00000000<br>RLOAD = 00000000<br>MIRT = 00000000 |
| 722 | MIST = 00000011<br>MIRT = 00000000<br>MINT = 00000011 | MIST = 00000011<br>MIRT = 00100000<br>MINT = 00100011 | MIST = 00000011<br>MIRT = 00101000<br>MINT = 00101011 | MIST = 00000011<br>MIRT = 00100000<br>MINT = 00100001 | MIST = 00000001<br>MIRT = 00000000<br>MINT = 00000001 | MIST = 00000000<br>MIRT = 00000000<br>MINT = 00000000 | MIST = 00000000<br>MIRT = 00000000<br>MINT = 00000000 |
| 724 | MINT1 = 3 MINUTES<br>MINT2 = 3<br>MINT3 = 0<br>MINT4 = 0<br>MINT5 = 0<br>MINT6 = 0<br>MINT7 = 0<br>MINT8 = 0 | MINT1 = 2.5 MINUTES<br>MINT2 = 2.5<br>MINT3 = 0<br>MINT4 = 0<br>MINT5 = 0<br>MINT6 = 3<br>MINT7 = 0<br>MINT8 = 0 | MINT1 = 2 MINUTES<br>MINT2 = 2<br>MINT3 = 0<br>MINT4 = 3<br>MINT5 = 0<br>MINT6 = 2.5<br>MINT7 = 0<br>MINT8 = 0 | MINT1 = 1 MINUTES<br>MINT2 = 0<br>MINT3 = 0<br>MINT4 = 0<br>MINT5 = 0<br>MINT6 = 1.5<br>MINT7 = 0<br>MINT8 = 0 | MINT1 = 0.5 MINUTES<br>MINT2 = 0<br>MINT3 = 0<br>MINT4 = 0<br>MINT5 = 0<br>MINT6 = 0<br>MINT7 = 0<br>MINT8 = 0 | MINT1 = 0 MINUTES<br>MINT2 = 0<br>MINT3 = 0<br>MINT4 = 0<br>MINT5 = 0<br>MINT6 = 0<br>MINT7 = 0<br>MINT8 = 0 | MINT1 = 0 MINUTES<br>MINT2 = 0<br>MINT3 = 0<br>MINT4 = 0<br>MINT5 = 0<br>MINT6 = 0<br>MINT7 = 0<br>MINT8 = 0 |
| 670 | $\overline{DLOAD}$ = 11111100<br>RLOAD = 00000000<br>DLENA = 11111100 | $\overline{DLOAD}$ = 11011100<br>RLOAD = 00100000<br>DLENA = 11111100 | $\overline{DLOAD}$ = 11010100<br>RLOAD = 00101000<br>DLENA = 11111100 | $\overline{DLOAD}$ = 11011110<br>RLOAD = 00100000<br>DLENA = 11111110 | $\overline{DLOAD}$ = 11111110<br>RLOAD = 00000000<br>DLENA = 11111110 | $\overline{DLOAD}$ = 11111110<br>RLOAD = 00000000<br>DLENA = 11111110 | $\overline{DLOAD}$ = 11111111<br>RLOAD = 00000000<br>DLENA = 11111111 |
| 513C | RTBYT = 00110011<br>DLENA = 11111100<br>OBYTE = 00110000 | RTBYT = 00110011<br>DLENA = 11111100<br>OBYTE = 00110000 | RTBYT = 10111011<br>DLENA = 11111100<br>OBYTE = 10111000 | RTBYT = 10100001<br>DLENA = 11111110<br>OBYTE = 10100000 | RTBYT = 10100001<br>DLENA = 11111110<br>OBYTE = 10100000 | RTBYT = 10100001<br>DLENA = 11111110<br>OBYTE = 10100000 | RTBYT = 10100001<br>DLENA = 11111111<br>OBYTE = 10100001 |

Fig. 34(b).

PROGRAMMABLE ELECTRONIC REAL-TIME LOAD CONTROLLER PROVIDING DEMAND LIMIT CONTROL

FIELD OF THE INVENTION

This invention generally relates to apparatus for controlling the energization states of a plurality of electrical load circuits at a facility, and, more particularly, to such an apparatus in which such energization states are controlled in real-time in accordance with a time schedule and so as to maintain the total rate of power being consumed at the facility at or near a predetermined rate of power consumption.

BACKGROUND OF THE INVENTION

As disclosed in U.S. Pat. No. 4,293,915, issued Oct. 6, 1981, entitled "Programmable Electronic Real-Time Load Controller", Carpenter et al., and assigned to the assignee of the present invention, a programmable electronic real-time load controller includes: a plurality of load control circuits, each being adapted to be interconnected with an electrical load circuit or "load"; a hardware clock; and, a programmed data processor for responding to real-time information from the hardware clock to effect control of the energization state of each load in accordance with a time schedule that has been entered by a user into the data processor. The user is permitted to flexibly program the time schedule by selecting, in advance, a number of control events and associated event times for each of the plurality of loads and for each day in a week. Each selected control event either causes the load to be turned on, to be turned off, or to be duty-cycled, from a time in real-time corresponding to the associated event time to a time in real-time corresponding to a subsequent event time. Accordingly, the "on time" of each load is conformed to the periods during which energization of the load is required so as to limit energy consumption at the facility at which the loads are located.

Other electrical load control systems, sometimes referred to as power demand monitoring and limiting systems, continuously measure and compare the actual rate of power being consumed by a plurality of loads at a facility with a predetermined rate of power consumption, sometimes referred to as a set point. If the actual rate exceeds the set point, then one or more of the loads are turned off to decrease the actual rate of power consumption. If the converse exists, then one or more of the loads are turned on to increase the actual rate of power consumption.

The preferred application for such power demand monitoring and limiting systems lies in the regulation of power consumption by electrical utility customers. As is well known, the charge made to each utility customer by the utility is dependent not only on the total energy consumption over a substantial period of time, such as a month, but also on whether or not the total energy consumption over any of a succession of shorter time periods, referred to as demand intervals, has exceeded a maximum energy demand established by the utility.

When used in such applications, the power demand monitoring and limiting systems may include a power monitoring and regulating circuit which produces an analog signal representing the actual rate of power being consumed. The analog signal is compared within the power monitoring and regulating circuit with a reference signal representing the set point. When the analog signal exceeds or is less than the reference signal, the power monitoring and regulating circuit functions to produce output signals for effecting load control. An example of such a power monitoring and regulating circuit can be seen in U.S. Pat. No. 4,034,233, entitled "Power Monitoring and Regulating Circuit and Method Having an Analog Input Representing Power Rate and Digital Output for Controlling the On/Off States of a Plurality of Loads", Leyde, issued July 5, 1977 to the assignee of the present invention.

The output signals from the power monitoring and regulating circuit are supplied to a load control circuit that is adapted to control the on/off states of the loads. As an example, the output signals may be in the form of one or more shed pulses that direct the load control circuit to shed a load for each shed pulse, with the number of shed pulses being related to the amount by which the actual rate of power consumption exceeds the set point. Similarly, when the actual rate of power consumption is less than the set point, one or more add pulses are produced, each such add pulse directing the load control circuit to add one load. The load control circuit may include provisions for determining the sequence in which the plurality of loads at the facility are to be added or shed in accordance with the add and shed pulses from the power monitoring and regulating circuit. For example, a priority sequence may be established in which certain essential loads, such as air conditioning equipment or the like, are shed only after other loads, such as lighting, have been shed, and in which such essential loads are added before such other loads are added. Provision may also be made for adding and shedding certain loads in a variable, rotating order in response to the add and shed pulses. Examples of such load control circuits may be seen in U.S. Pat. No. 4,031,406, entitled "Method and Apparatus for Controlling Electrical Loads", Leyde et al., issued June 21, 1977 to the assignee of the present invention, and U.S. Pat. No. 4,064,485, entitled "Digital Load Control Circuit and Method for Power Monitoring and Limiting System", Leyde, issued Dec. 20, 1977 to the assignee of the present invention.

Heretofore, such power demand monitoring and limiting systems have not included any provision for real-time control of the loads associated therewith, e.g., that in which the loads are turned on, turned off, or duty-cycled in real-time in accordance with a time schedule. Conversely, the programmable electronic real-time load controllers have not included any provision for demand limit control, e.g., that in which the loads are turned on or turned off in order to maintain total energy consumption over each demand interval below the maximum energy demand established by the utility. As a result, the use of a power demand monitoring and limiting system will not permit the user to conform the "on time" of each load to that for which energization of the load is required, and the use of a programmable electronic real-time load controller may result in the maximum energy demand being exceeded.

It is therefore an object of this invention to provide an apparatus that permits demand limit control to be provided by a programmable electronic real-time load controller.

It is another object of this invention to provide such an apparatus which functions to provide demand limit control that is coordinated with the real-time control provided by the programmable electronic real-time load controller.

It is yet another object of this invention to provide such an apparatus which allows the user to select or de-select any given load for demand limit control.

It is still another object of this invention to provide such an apparatus whose implementation of demand limit control can be enabled or disabled in response to an external device, or, at predetermined times established by the programmable electronic real-time load controller.

It is a further object of this invention to provide such an apparatus which permits the controller to maintain any load selected for demand limit control either on or off for predetermined, minimum times so as to avoid excessive on-off cycling of the load.

It is yet a further object of this invention to provide such an apparatus which permits the controller to rotate the off states of those loads selected for demand limit control so as to minimize the maximum off time of any such load.

It is still a further object of this invention to provide such an apparatus which permits the controller to rotate the on/off states of loads selected for demand limit control in a predetermined order.

It is still a further object of this invention to provide such an apparatus which can be implemented in an easy and inexpensive manner by the use of readily available, integrated circuit, microprocessor components which are compatible with and which function under control of the data processor within the programmable electronic real-time load controller.

SUMMARY OF THE INVENTION

The foregoing objects, and other objects and advantages that will be apparent from a consideration of the specification, are achieved in an apparatus that permits an electronic controller, adapted to provide real-time control of the energization states of the plurality of electrical loads, to also provide demand limit control of the loads. The apparatus is particularly adapted for use with a controller of the type including a clock means determining real-time, an event memory storing a time schedule for real-time control, a program memory storing a set of program instructions for real-time control, and a processing means for executing the set of program instructions to implement real-time control by comparing real-time from the clock means with the time schedule in the event memory, and accordingly determining an on state or an off state for each load, and by energizing those loads in an on state and by deenergizing those loads in an off state.

The apparatus comprises:

A second program memory storing a set of program instructions for demand limit control;

first means for providing an input analog signal representing the actual rate of power consumption by the plurality of electrical loads;

second means for providing a set point analog signal representing a desired rate of power consumption;

digital-to-analog signal conversion means for converting a digital signal from the processing means into a corresponding analog signal;

a first comparator for comparing the input analog signal with the analog signal from the digital-to-analog signal conversion means to provide a first digital signal representative of the difference therebetween;

a second comparator for comparing the set point analog signal with the analog signal from the digital-to-analog signal conversion means to provide a second digital signal representative of the difference therebetween; and, input/output port means for transferring the first and the second digital signals to the processing means, and for transferring a digital signal which selectively represents an approximation of the actual rate of power consumption and the desired rate of power consumption from the processing means to the digital-to-analog signal conversion means.

The processing means is operative to execute the set of program instructions stored in the second program memory to implement demand limit control by:

obtaining actual power rate and set point data by causing the digital signal transferred to the digital-to-analog signal conversion means through the input/output port means to selectively approximate the actual rate of power consumption and the desired rate of power consumption and by selectively monitoring, through the input/output port means, of the first and second digital signals from the first and second comparators, respectively;

comparing the actual rate data with the set point data; and, for those loads in an on state under real-time control, varying the number of loads actually energized and de-energized so as to maintain the actual rate substantially equal to the set point.

The foregoing objects, as well as other objects and advantages, are also realized in an electronic controller for controlling the energization states of the plurality of electrical loads to implement both real-time control and demand limit control thereof. A plurality of load control circuits are provided, each said load control circuit being adapted to be interconnected with a load, and having a load-on state when its load is to be on, and a load-off state when its load is to be off. Also provided are a clock means for determining real-time; a sensor means for measuring the actual rate of power consumption by the plurality of electrical loads; and, set point selector means for selecting a set point representing a desired rate of power consumption by the plurality of electrical loads. An event memory means is provided for storing a time schedule for real-time control, and a program memory means is provided which stores a set of program instructions.

A processing means is responsive to the set of program instructions for:

determining a desired real-time control output status for each load by: obtaining real-time from the clock means; obtaining the time schedule from the event memory means; and, through comparison of real-time with the time schedule, establishing an on state or an off state for each load, the on state representing a desired load-on state for the associated load control circuit and the off state representing a desired load-off state for the associated load control circuit;

determining a desired demand limit control output status for each load by: obtaining the actual power rate from the sensor means; obtaining the set point from the set point selector means; determining a shed condition when the actual power rate equals or exceeds the set point, and determining a restore condition when the actual power rate is less than the set point; establishing a demand group of the plurality of electrical loads; transferring a load into the demand group upon occurrence of an on state for the load and transferring a load out of the demand group upon occurrence of an off state for the load; establishing a shed group and a restored group within the demand group, the loads within the shed group having a shed state representing a desired load-off state for the associated load control circuit and the loads within the restored group having a restored state representing a desired load-on state for the associated load control circuit; upon determination of the shed condition, transferring at least one load from the restored group to the shed group; and, upon determination of the restore condition, transferring at least one load from the shed group to the restored group; and, controlling the actual energization state of each load by, for each load in the demand group, placing the load control circuit for the load into the load-on state upon occurrence of the restored state for the load and into the load-off state upon occurrence of the shed state for the load, and, for each remaining load, placing the load control circuit for the load into the load-on state upon occurrence of the on state for the load and into the load-off state upon occurrence of the off state for the load.

BRIEF DESCRIPTION OF THE DRAWINGS

The invention can best be understood by reference to the following portion of the specification, taken in conjunction with the accompanying drawings, in which:

FIG. 16 is a flow chart of the program steps undertaken by the microprocessor in a REPEAT subroutine;

FIG. 17 is a flow chart of the program steps undertaken by the microprocessor in a CLEAR subroutine;

FIG. 18 is a flow chart of the program steps undertaken by the microprocessor in a HOLIDAY subroutine;

FIG. 19 is a flow chart of the program steps undertaken by the microprocessor in a TIME subroutine;

FIG. 25 is a flow chart of the program steps undertaken by the microprocessor in a REFRESH DISPLAY subroutine;

FIGS. 26(a) and 26(b) are a flow chart of the program steps undertaken by the microprocessor in a DLR2 routine;

FIG. 32 is a logic map illustrating how the output status of each load is determined by both real-time control and demand limit control;

FIG. 33 is a chart illustrating various load output status transitions and certain restrictions associated therewith; and, FIGS. 34(a) and 34(b) are a chart illustrating the operation of the UPDATE DEMAND LIMIT STATUS subroutine of FIG. 27 under various real-time conditions.

DESCRIPTION OF A PREFERRED EMBODIMENT

GENERAL DESCRIPTION OF PROGRAMMABLE ELECTRONIC REAL-TIME LOAD CONTROLLER

The apparatus of the present invention is particularly adapted to be used with a programmable electronic real-time load controller of the type described and claimed in U.S. Pat. No. 4,298,915. In particular, the apparatus is embodied in a set of components, and associated interconnections, that are mounted on a printed circuit card (FIG. 22) adapted to be inserted into the housing of the controller and interconnected therewith, and a set of program instructions (FIGS. 24(a), 24(b), 26(a), 26(b), 27, 28, 29, 30, and 31) that are stored within a program memory located on the printed circuit card and particularly adapted to be executed by a microprocessor of the controller. The power demand limiter also requires that certain modifications be made to the program instructions normally used by the microprocessor in implementing real-time control. Accordingly, it is necessary to describe in detail the structure and operation of the controller before proceeding to a detailed description of the structure and operation of the apparatus in FIG. 22.

Figure 1:
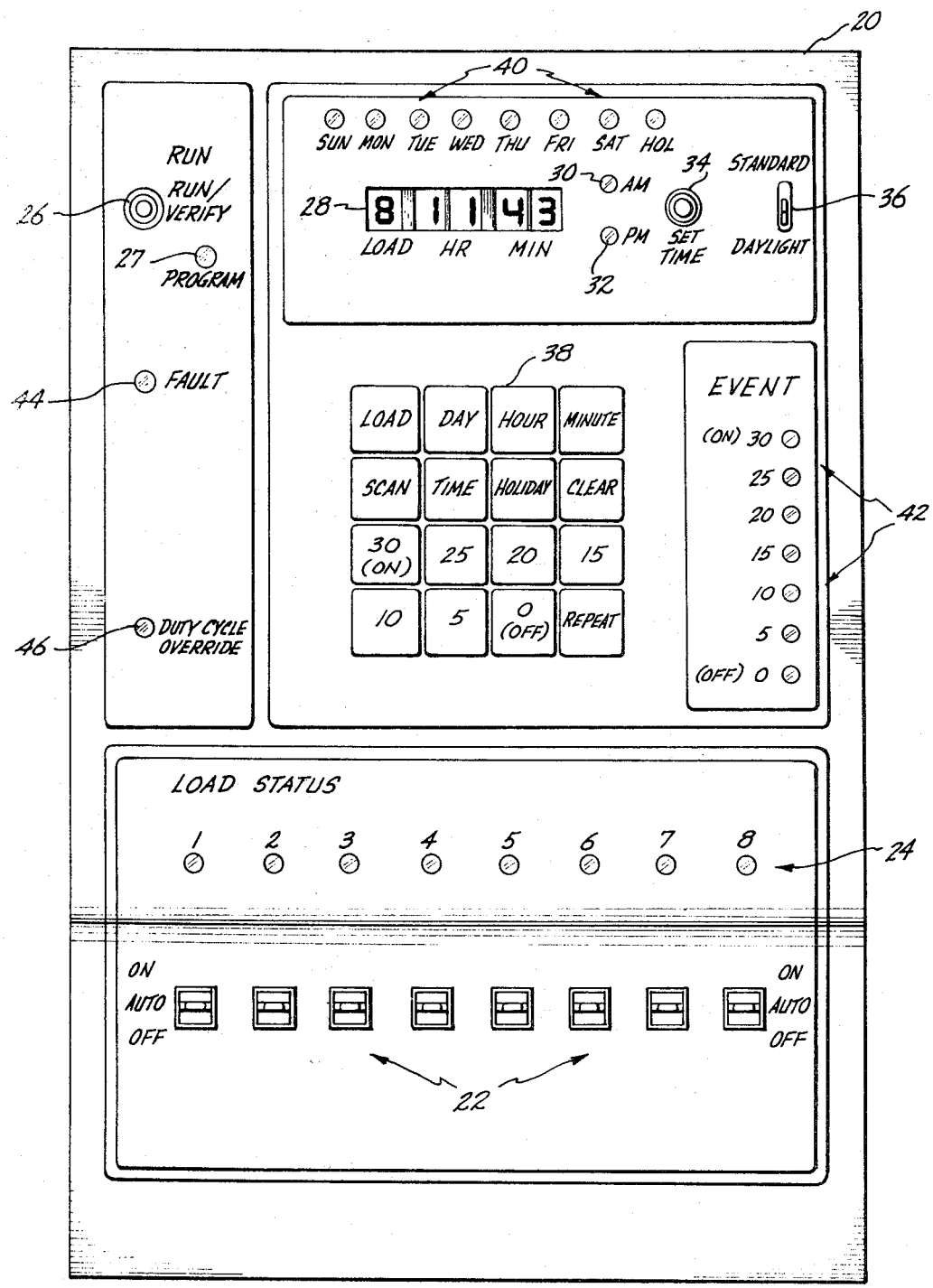
FIG. 1 is a pictorial view of a front panel of a programmable electronic real-time load controller with which the apparatus of the present invention is particularly adapted to be used.

With reference to FIG. 1, a preferred embodiment of the programmable electronic real-time load controller includes a housing 20 on whose top panel are located a plurality of controls and displays that permit a user to transmit information to and receive information from a data processor, preferably a microprocessor and related components, located within the housing 20, and that also permit the user to override the control actions being undertaken by the controller if desired.

A plurality of load control switches 22 (one for each load circuit to be controlled, e.g., eight) are provided, with each load control switch 22 having three positions respectively labelled ON, AUTO and OFF. As described hereinafter with reference to FIGS. 2 and 3, each load control switch 22 forms part of a load control circuit which includes a load relay having normally-open, SPST contacts adapted for series interconnection with a load circuit (hereinafter referred to for convenience as a "load"). When each load control switch 22 is in its ON or its OFF position, its associated load is respectively turned on or turned off, irrespective of the operation of the microprocessor within the controller. When each load control switch 22 is in its AUTO position, the energization state of its associated load is controlled by the microprocessor through control of the energization state of the corresponding load relay.

A plurality of LEDs 24 labelled LOAD STATUS are provided, one for each load, with each LED 24 being lit when its associated load is turned on, and being extinguished when its associated load is turned off.

Figure 2:
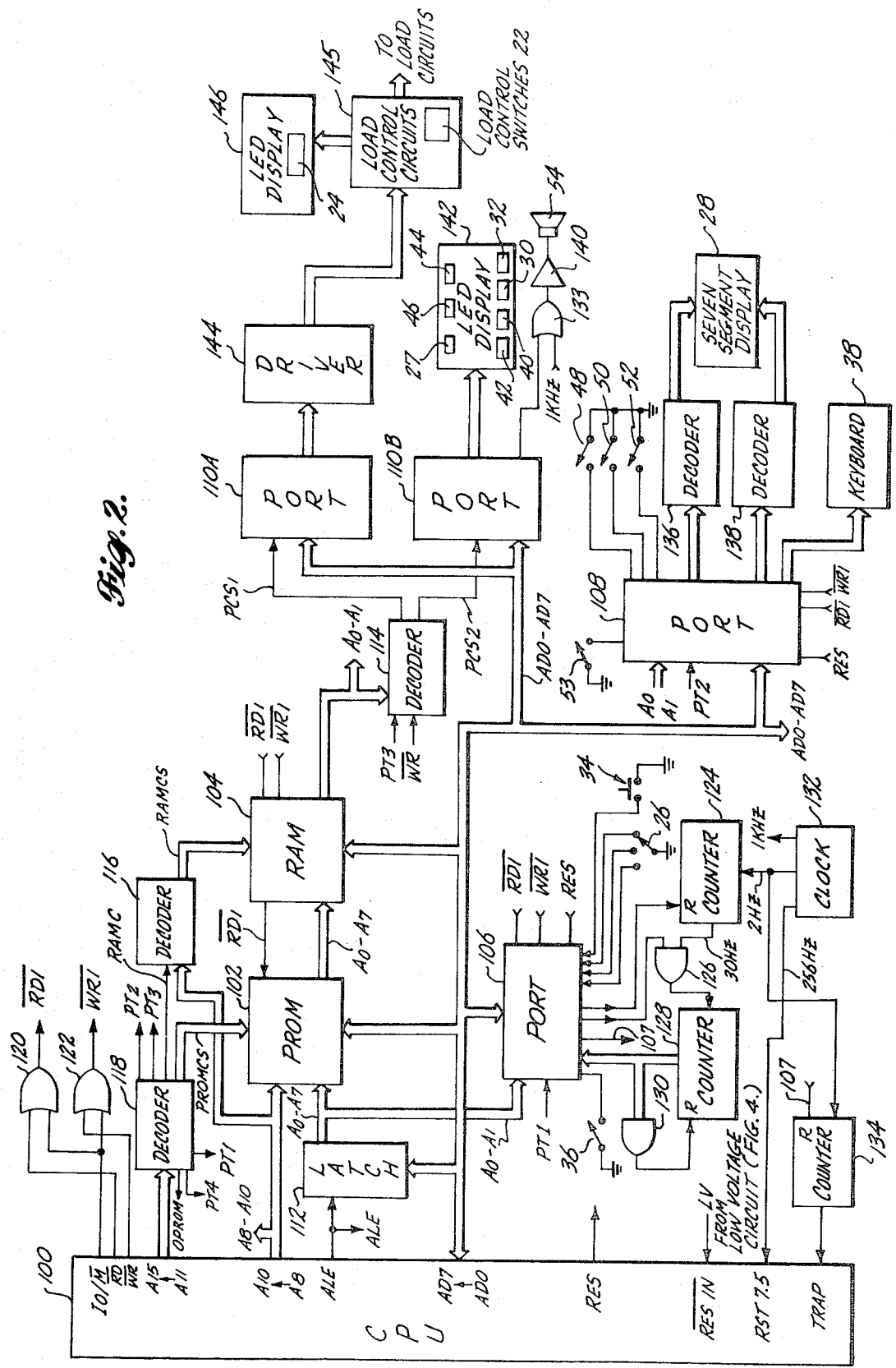
FIG. 2 is an electrical block diagram of the controller, including a microprocessor, and particularly adapted to implement not only real-time control but also demand limit control when used with the components of the apparatus illustrated in FIG. 22.

The microprocessor has three modes of operation, denominated "program," "run/verify," and "run" which can be selected by the user through the positioning of a mode switch 26 to respective PROGRAM, RUN/VERIFY or RUN positions. When the microprocessor is in the program mode of operation, the load relays are maintained in the energization states established prior to the time that the microprocessor entered the program mode of operation, and the user is permitted to enter a time schedule into the microprocessor for load control, or to alter any schedule that has been previously entered. When the microprocessor is in either the run/verify or the run modes of operation, the energization states of the load relays are controlled by the microprocessor in accordance with the time schedule, but the user is not permitted to alter the time schedule. To prevent inadvertent changes to the schedule, the microprocessor will enter the program mode of operation only if the user places the mode switch 26 to its PROGRAM position within a predetermined period of time, e.g., five seconds, after the user has actuated a "hidden" program enable switch 48 (FIG. 2). When the microprocessor is in the program mode of operation, an LED 27 is lit.

In order to provide certain information to the user regarding the operation of the controller, there is provided a display 28, an LED 30 labelled AM, an LED 32 labelled PM, and a plurality of LEDs 40 respectively labelled SUN, MON, TUE, WED, THU, FRI, SAT and HOL. The display 28 has a plurality of seven-segment, alpha-numeric character displays including a LOAD character display (which displays a number identifying a load, e.g., "1" to "8"), two HR character displays (tens and units), and two MIN character displays (tens and units). As described hereinafter, the controller includes a hardware clock which provides real-time information to the microprocessor. In the run mode, the microprocessor normally causes the LOAD character display to be blanked, and the remaining character displays and LEDs 30, 32 and 40 to display real-time. In the program mode of operation, the time within the hardware clock may be adjusted upon actuation of a switch 34 labelled SET TIME. In all three modes of operation, the real-time information used by the microprocessor for load control may be advanced by one hour from the time in the hardware clock in accordance with the setting of a switch 36 labelled STANDARD/DAYLIGHT.

A keyboard 38, which is enabled only when the microprocessor is in either the run/verify or the program mode, permits the user to enter a schedule for load control into the microprocessor, or to alter any previously-entered schedule, and also permits the user to obtain a display of the schedule and of real-time. Included in the keyboard 38 are a plurality of keys labelled LOAD, DAY, HOUR, MINUTE, SCAN, TIME, HOLIDAY, CLEAR, 30(ON), 25, 20, 15, 10, 5, 0(OFF) and REPEAT.

At this point, it should be noted that the controller permits the scheduling of a plurality of control events, or, changes in the load control function being effected by the controller, for each load for each day of a week, plus a holiday schedule for each load. Each control event has associated therewith a unique event time. A control interval, e.g., thirty minutes, is established, and each control event is defined as the number of minutes during each successive control interval subsequent to the event time that a load will be turned on.

In the preferred embodiment, three load control functions are provided, these being "on," "off" and "duty-cycle." To schedule a control event representing either the "on" or "off" control functions, the user selects the desired load and event time by actuation of the appropriate keys in keyboard 38, and actuates either the 30(ON) or 0(OFF) keys. To schedule a control event having a "duty-cycle" control function, the user selects the desired load and event time by actuation of the appropriate keys in keyboard 38, and actuates one of the 25, 20, 15, 10, or 5 keys.

When either the "on" or "off" control functions have been so scheduled, the microprocessor, when placed in the run or run/verify modes, will maintain the selected load either on or off, from a time in real-time corresponding to the event time of the control event to a time in real-time corresponding to a subsequent event time of another control event. When a "duty-cycle" control function has been scheduled, the microprocessor will maintain the selected load on for a selected portion of each subsequent control interval in real-time from the event time of the control event to a subsequent event time of another control event. For example, if the 25 key has been actuated, the microprocessor will maintain the selected load on for the first twenty-five minutes of each successive thirty minute interval in real-time subsequent to the event time.

While the microprocessor is in the program or run/verify modes, display of a selected load, day, and event time is made by the display 28 and LEDs 30, 32, and 40, and display of a selected event is made by a plurality of LEDs 42 whose labels correspond to those of the event keys (e.g., 30(ON), 25, 20, 15, 10, 5, 0(OFF)) in keyboard 38.

In order to schedule control events, the user first places the microprocessor into the program mode as previously described. The user then actuates: the LOAD key until the desired load number appears in display 28; the DAY key until the LED 40 corresponding to the desired day is lit; and, the HOUR and MINUTE keys until the desired event time is displayed by display 28 and LEDs 30, 32. The desired control event is then entered into an event memory within the microprocessor by actuation of the corresponding event key, and is acknowledged by the microprocessor by the lighting of the corresponding LED 42. After entry of all the desired control events for a given day and for a given load, scheduling of control events may be effected for another day after the user actuates the DAY key until the LED 40 corresponding to the desired day is lit. Alternatively, the schedule of control events for a given load and for a given day may be repeated for subsequent days, one at a time, by actuation of the REPEAT key in keyboard 38. After all control events have been scheduled for a given load and for an entire week, the scheduling process is repeated for the remaining loads in a manner identical to that previously described.

The microprocessor also permits a separate holiday schedule to be established for each load, with the holiday schedule having any sequence of control events that may be desirable. To enter the holiday schedule, the DAY key is actuated while the microprocessor is in the program mode until the LED 40 labelled HOL is lit. The holiday schedule for each load is then entered in a manner identical to that previously described.

Any previously-entered schedule can be altered by rescheduling control events and event times when the microprocessor is in the program mode. Also, the schedule for a given load and for a given day (including a holiday) may be deleted by actuation of the LOAD and DAY keys until the desired load number and day (including holiday) are displayed, and by subsequent actuation of the CLEAR key.

In order to obtain display of real-time information when the microprocessor is in either the run/verify or the program modes, the TIME switch may be actuated.

As previously described, the time within the hardware clock may also be changed through actuation of the SET TIME switch 34. Specifically, the DAY, HOUR and MINUTE keys are actuated until a desired time is displayed. Subsequent actuation of the SET TIME switch 34 will cause the microprocessor to change the time within the hardware clock to the time as displayed.

While the microprocessor is in either the run/verify or the program modes, the user may obtain a display of the schedule for each load and for each day (including a holiday). To obtain such a display, the user actuates the LOAD and DAY keys until the desired load number and day are displayed. Actuation of the SCAN key then causes the microprocessor to display the scheduled event times and control events, in a sequence of successive event times, through display 28, LEDs 30 and 32, and LEDs 42.

Let it be assumed that a schedule for load control has been entered (or altered), and that the microprocessor is now placed in its run/verify mode (by appropriate positioning of the mode switch 26). Thereupon, the LOAD character display in display 28 is blanked, and the remaining character displays in display 28, and LEDs 30, 32, and 40, display real-time information obtained from the hardware clock. In effecting load control, the microprocessor continuously compares real-time information obtained from the hardware clock with the schedule, and effects the control functions represented by the control events in the schedule at the times in real-time corresponding to the event times in the schedule. If no control events have been scheduled for a given load for the day in real-time, the microprocessor automatically scans back through the previous six days in the schedule and controls the load in accordance with the control function represented by the last-entered control event. If no control events have been entered in the schedule for the load, the load is maintained off.

To avoid a large inrush of power in the case where the schedule calls for more than one load to be turned on at the time that the microprocessor is placed in either the run or run/verify modes, the microprocessor turns on the loads in a predetermined sequence and at predetermined intervals.

As previously described, the schedule cannot be entered or altered when the microprocessor is in the run or run/verify modes. However, when the microprocessor is in the run/verify mode, one or more of the days in any given week in real-time can be selected as a holiday, whereupon the microprocessor follows the holiday schedule for all loads upon occurrence of that day or days in real-time. To accomplish this selection, the DAY key is actuated until LED 40 corresponding to the desired day is lit, and the HOLIDAY key is actuated. When the thus-selected day occurs in real-time, the LED 40 corresponding to the thus-selected day and the LED 40 labelled HOL will be lit, and the microprocessor will control all loads in accordance with the holiday schedule. After occurrence of the thus-selected day in real-time, the microprocessor will adhere to the regular schedule upon the next occurrence of that day in real-time, unless the day is again selected as a holiday.

An LED 44 labelled FAULT and an audible alarm 54 (FIG. 2) are also provided. When a proper keyboard entry is made by the user, the audible alarm 54 is actuated for a short period of time. When an improper keyboard entry is attempted, however, the FAULT LED is lit for a short period of time and the entry is not accepted by the microprocessor. An internal check is also made by the microprocessor of its event memory. If an event memory malfunction is detected, the microprocessor causes the FAULT LED 44 and the audible alarm 54 to be energized, whereupon the user must return the microprocessor to its program mode of operation and reschedule all control events before the microprocessor can be returned to its run or run/verify modes of operation.

Provision is also made for allowing an external device to override the operation of the microprocessor in certain circumstances. Specifically, a set of terminals is provided to which may be connected a set of external contacts 50 (FIG. 2). The contacts 50, referred to hereinafter as the load 1 enable switch 50, must be closed in order for the microprocessor to control load number 1 in accordance with the schedule entered therein. For example, switch 50 may comprise the contacts of a photocell, which open during daylight, and load number 1 may comprise a lighting load. In such a case, the microprocessor will be enabled to turn on or turn off load number 1 only during non-daylight hours, and load number 1 will otherwise be maintained off.

Figure 22:
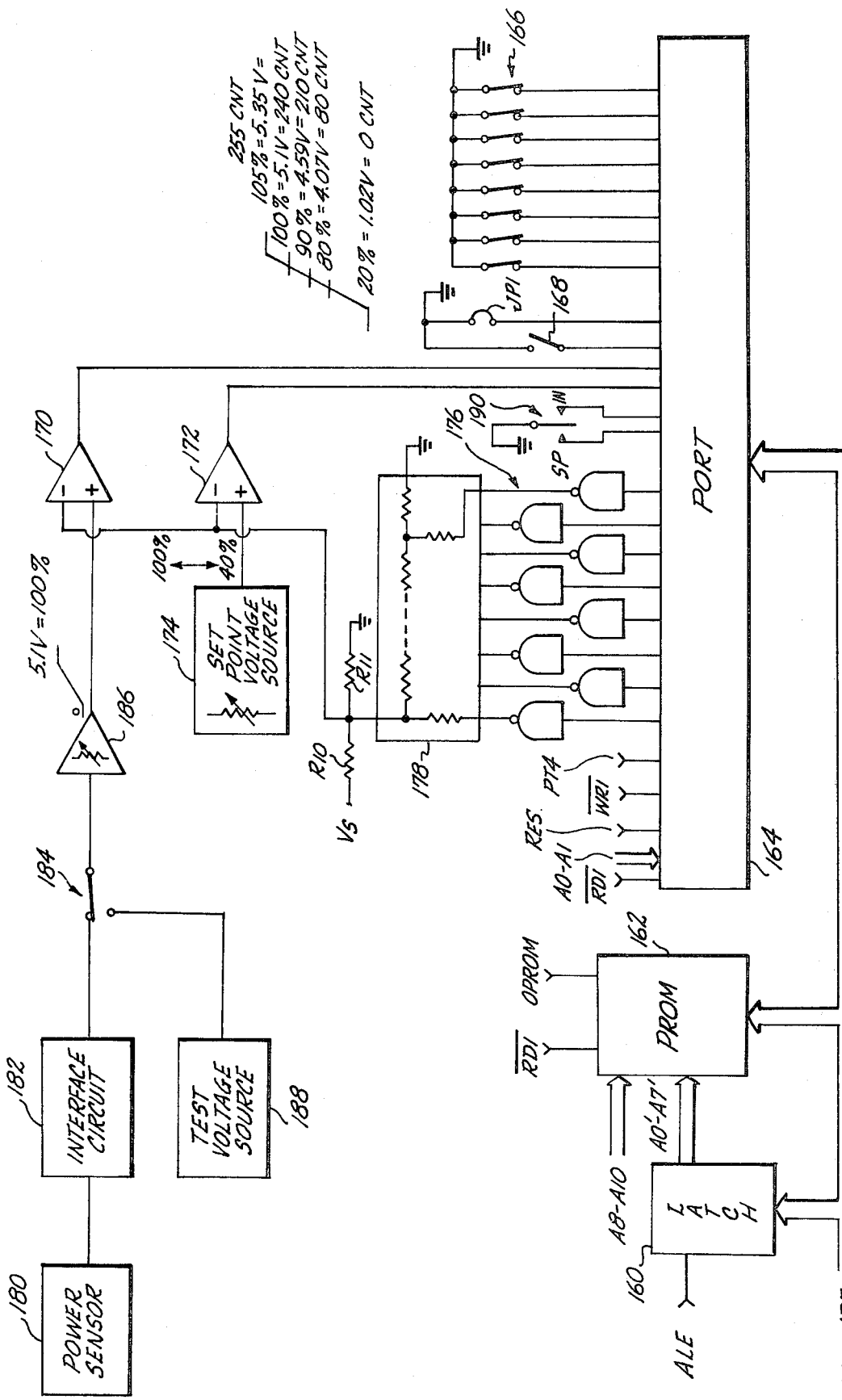
FIG. 22 is an electrical block diagram of the components of the apparatus required for the controller to implement demand limit control.

There is also provided a set of terminals adapted to be connected to a set of contacts 52 (FIG. 2) which are hereinafter referred to as the duty-cycle override switch 52. Whenever switch 52 is closed, all loads whose current control events represent a "duty-cycle" control function are maintained on, and an LED 46 labelled DUTY-CYCLE OVERRIDE is lit. For example, switch 52 may comprise the contacts of a thermostat which close when a set temperature is reached. The microprocessor may accordingly function to provide duty-cycle control functions for loads such as cooling equipment only until the cooling equipment has brought the facility's temperature to that set in the thermostat, thereby allowing more efficient cooling. Finally, a demand limit option switch 53 (FIG. 2) is closed whenever the printed circuit card containing the components of the apparatus of FIG. 22 is inserted into housing 20 and interconnected with the microprocessor, so that the microprocessor can be informed that demand limit control is to be implemented in addition to real-time control.

MICROPROCESSOR STRUCTURE AND GENERAL OPERATION

With reference now to FIG. 2, the microprocessor in the preferred embodiment of the controller has a plurality of components including a CPU (Central Processing Unit) 100, a PROM (Programmable Read Only Memory) 102, a RAM (Random Access Memory) 104, a first port 106, a second port 108, and a third port divided into ports 110A, 110B. The foregoing components may comprise one or more, commercially-available integrated circuit chips, of which the following are representative:

TABLE I

| Component | Designation |
|---|---|
| CPU 100 | Intel 8085 Microprocessor |
| PROM 102 | Two Intel 2716 16K (2KX8) UV Erasable PROM |
| RAM 104 | Ten Intel M5101L-4 256×4-bit Static CMOS RAMs |
| Ports 106, 108 | Intel 8255 Programmable Peripheral Interface |
| Port 110A | 74LS374 8-bit Latch (available from a number of manufacturers) |
| Port 110B | Three 74LS374 |

A low address/data bus, comprising leads AD0–AD7, interconnects corresponding terminals of CPU 100, PROM 102, RAM 104, ports 106, 108, 110A, 110B, and a latch 112. A lead ALE interconnects corresponding terminals of CPU 100 and latch 112. A plurality of leads A0–A7 interconnect corresponding output terminals of latch 112 with corresponding terminals of PROM 102 and RAM 104. In addition, leads A0–A1 interconnect latch 112 with ports 106, 108 and with a decoder 114.

A first group of high address terminals of CPU 100 are interconnected with PROM 102 and with a decoder 116 by leads A8–A10. A second group of high address terminals of CPU 100 are interconnected with a decoder 118 by leads A11–A15.

Decoder 118 has a plurality of output terminals which are interconnected with port 106, port 108, decoder 114, and decoder 116 by respective leads PT1, PT2, PT3 and RAMC. Decoder 118 also has a plurality of output terminals which are interconnected with the integrated circuit chips within PROM 102 by corresponding leads PROMCS. Likewise, decoder 116 has a plurality of output terminals which are interconnected with the integrated circuit chips within RAM 104 by corresponding 11111 RAMCS. Decoder 114 has a plurality of output terminals which are interconnected with port 110A and port 110B by respective leads PCS1 and PCS2.

Terminals IO/$\overline{\text{M}}$ and $\overline{\text{RD}}$ of CPU 100 are connected to corresponding inputs of an OR gate 120, and terminals IO/$\overline{\text{M}}$ and $\overline{\text{WR}}$ of CPU 100 are connected to corresponding inputs of an OR gate 122. The output of OR gate 120 is connected by a lead $\overline{\text{RD1}}$ to PROM 102, RAM 104, port 106 and port 108, and the output of OR gate 122 is connected by a lead $\overline{\text{WR1}}$ to RAM 104, port 106, port 108 and decoder 114. Finally, a RES terminal of CPU 100 is interconnected with corresponding terminals of ports 106, 108.

In order to permit the controller to effect demand limit control in addition to real-time control, a number of leads of the microprocessor in FIG. 2 are connected (through an appropriate connector) to corresponding leads of the components of the apparatus in FIG. 22, including leads A0–A1, A8–A10, AD0–AD7, $\overline{\text{RD1}}$, $\overline{\text{WR1}}$, ALE and RES. In addition, respective output terminals of decoder 118 are connected by leads OPROM and PT4 to corresponding leads of the apparatus in FIG. 22.

The foregoing components, and their interconnections, form a largely conventional microprocessor, in which PROM 102 contains a program memory comprising a set of program instructions for various routines and subroutines which are described hereinafter with reference to FIGS. 7–21, and in which RAM 104 contains a scratch pad memory which is organized as described hereinafter with reference to FIG. 5, and an event memory which is organized as described hereinafter with reference to FIG. 6. Ports 106 and 108 function as input/output ports, whereas ports 110A, 110B function as output ports.

Within each routine or subroutine, the set of program instructions in PROM 102 are addressed and executed by CPU 100 in a predetermined sequence, established by a program counter within CPU 100. For each program instruction so addressed, CPU 100 undertakes an instruction cycle, with each instruction cycle including a plurality of machine cycles. The machine cycles permit CPU 100 to retrieve an instruction from PROM 102 and to execute the instruction by the addressing and transmission of data to and from CPU 100, RAM 104 and ports 106, 108 and 110A, 110B. Within each instruction cycle, addresses or data are transmitted on leads AD0-AD7. When an address is being transmitted by CPU 100 on leads AD0-AD7, a signal is provided on lead ALE therefrom which causes latch 112 to store therein the address, and to present the address thus stored on leads A0-A7. At all other times, leads AD0-AD7 are used for the transmission of data. The address on leads A0-A7, together with further address information on leads A8-A10, is used to signify a memory location within the chips in PROM 102. Likewise, the address on leads A0-A7 is used to signify a memory location within the chips in RAM 104. The address on leads A0-A1, plus address information on leads AD0-AD7 is used to signify that ports 106 and 108 should connect one of their input or output terminals, to be described hereinafter, with leads AD0-AD7 for the transmission or reception of data. Likewise, address information on leads AD0-AD7 is used to signify that ports 110A, 110B should connect one or more of their output terminals, to be described hereinafter, to leads AD0-AD7 for the reception of data.

In order to signify which of the thus-addressed components of the microprocessor is to be interconnected with the leads AD0-AD7 for the transmission or reception of data, CPU 100 provides signals on leads A11-A15 to decoder 118, which responsively provides chip select signals on leads PT1, PT2, PT3, or PROMCS to respectively enable port 106, port 108, ports 110A and 110B, or one of the chips within PROM 102. Decoder 118 is also responsive to the signals on leads A11-A15 from CPU 100, together with the signals on leads A8-A10 therefrom, to provide chip select signals on leads RAMCS to respectively enable one of the chips within RAM 104. Likewise, decoder 114 is responsive to signals on leads A0-A1, and to the chip select signal on lead PT3, to provide chip select signals on leads PCS1 or PCS2 to respectively enable either port 110A or port 110B.

Actual data transmission on leads AD0-AD7, however, is not permitted until times during each instruction cycle as determined by CPU 100 and as signified by signals on terminals IO/$\overline{M}$, $\overline{RD}$ and $\overline{WR}$. By combining these signals in OR gates 120, 122, the signals on leads $\overline{RD1}$ and $\overline{WR1}$ permits all ports to be treated as if they were memory locations (memory-mapped I/O). Upon provision of a signal on lead $\overline{RD1}$, the data in an addressed memory location in an enabled chip within PROM 102 or RAM 104 is placed on the leads AD0-AD7. Likewise, the data represented by signals on any addressed input terminal in ports 106, 108, when enabled, is placed on leads AD0-AD7. Upon the provision of a signal on lead $\overline{WR1}$, any data on leads AD0-AD7 is written into an addressed memory location in an enabled chip within RAM 104, or, supplied to any addressed and enabled output terminal in ports 106, 108, 110A, 110B.

Finally, various buffers within ports 106, 108 110A, 110B, that are used for temporary storage of data being received from or transmitted to one of the input or output terminals thereof, are reset or cleared upon the provision of a signal on lead RES from CPU 100 to ports 106, 108, and by the provision of suitable data on leads AD0-AD7 to ports 110A, 110B.

Further details regarding the structure and operation of the microprocessor may be found in the "Intel Component Data Catalog 1978" and in the "MCS-85 User's Manual", copyright 1977, Intel Corporation, both of which are expressly incorporated by reference herein.

A first group of input terminals of port 106 is respectively connected to SET TIME switch 34 and to respective terminals of the mode switch 26, in order to determine the actuation of SET TIME switch 34 and the positioning of mode switch 26 to either the RUN, RUN/VERIFY, or PROGRAM positions. A first output terminal of port 106 is connected to the reset (R) input of a counter 124, and a second output terminal of port 106 is connected to a first input of an OR gate 126 whose other input is connected to the output of counter 124. The output of OR gate 126 is connected to the signal input of a counter 128 which has a plurality of output terminals that are interconnected with a second group of input terminals of port 106 and with corresponding inputs of an AND gate 130. The output of AND gate 130 is connected to the reset (R) input of counter 128. Another input terminal of port 106 is interconnected with STANDARD/DAYLIGHT switch 36 in order to determine the positioning thereof to either the STANDARD or DAYLIGHT positions.

A clock 132 provides a plurality of clock signals comprising: a first clock signal (e.g., at a frequency of 1 kHz) which is connected by an appropriate lead to a first input of an AND gate 133 to be described hereinafter; a second clock signal (e.g., at a frequency of 2 Hz) which is applied to the signal inputs of counter 124 and a counter 134; and, a third clock signal (e.g., at a frequency of 256 Hz) which is connected by an appropriate lead to an RST 7.5 (interrupt) input of CPU 100. A third output terminal of port 106 is connected by a lead 107 to a reset (R) input of counter 134, and the output of counter 134 is connected to a TRAP input of CPU 100.

Clock 132, counter 124, gate 126, counter 128, and gate 130 comprise the hardware clock which accumulates real-time information used by the microprocessor. Clock 132 preferably comprises a crystal-stabilized oscillator and a counter which divides a signal from the oscillator to provide the aforementioned clock signals. Counter 124 preferably comprises a counter which functions to divide the frequency of the second clock signal from clock 132 to provide an output signal (e.g., at a frequency of 30 Hz) to gate 126. Normally, gate 126 functions to pass the output signal from counter 124 to the signal input of counter 128, with counter 128 being responsive to the output signal from counter 124 so as to accumulate a count representing the number of minutes that have transpired, in real-time, during a week. The count within counter 128 is coupled to the microprocessor through the output terminals of counter 128 and the second group of input terminals of port 106. When counter 128 has accumulated a count representing the total number of minutes in a week, gate 130 provides an output signal to reset counter 128, whereupon counter 128 again begins to accumulate a count representative of the number of minutes, in real-time, during a subsequent week.

As previously noted, the microprocessor is capable of setting the time (or count) within the hardware clock to a desired time (or count) upon actuation of the SET TIME switch 34. To accomplish this function, the microprocessor provides a signal on the first output terminal of port 106 to reset counter 124, and provides a high frequency signal on the second output terminal of port 106 which is gated through gate 126 to advance the count within counter 128 until that count is at the desired time.

Provision is also made for monitoring the timing of the execution of program instructions by CPU 100. To accomplish this function, the counter 134 is set to overflow, and to accordingly provide an output signal, after an interval determined by a predetermined number of pulses in the second output signal from clock 132. When counter 134 overflows, the output signal therefrom at the TRAP input of CPU 100 causes CPU 100 to reset its program counter and to reinitialize its operations. However, if CPU 100 is executing program instructions in a timely manner, a signal is provided on the third output terminal of port 106 at periodic intervals, each of which is less than the overflow interval of counter 134, which causes counter 134 to be reset without overflowing.

The third clock signal from clock 134 causes CPU 100 to undertake an INTERRUPT subroutine, to be described hereinafter, in which the displays of the microprocessor are refreshed and in which certain internal timers in RAM 104 are decremented.

A first group of input and output terminals of port 108 is interconnected with keyboard 38 and is used to scan and detect key actuations therein in a conventional manner. Second and third groups of output terminals of port 108 are interconnected by decoders 136, 138 with scan and display inputs of the character displays within display 28, with decoders 136 and 138 functioning in a conventional manner to provide demultiplexing and subsequent display of data obtained from port 108. The remaining input terminals of port 108 are interconnected, respectively, with the program enable switch 30 48, with the load 1 enable switch 50, with the duty-cycle override switch 52 and with the demand limit option switch 53, in order to detect actuation of those switches.

Port 110B has a first output terminal which is connected to a second input of gate 133. The presence of a signal on the first output terminal of port 110B causes the first clock signal (at 1 kHz) from clock 132 to be gated through an amplifier 140 to cause actuation of the audible alarm 54. Port 110B also has a group of output terminals which are interconnected with a conventional LED display 142 including the "PROGRAM" LED 27, the AM LED 30, the PM LED 32, the LEDs 40, the LEDs 42, the FAULT LED 44, and the DUTY-CYCLE OVERRIDE LED 46, whereupon a signal on any one of the output terminals of port 110B causes the corresponding LED to be lit.

Port 110A has a plurality of output terminals which are interconnected by means of a driver circuit 144 with a plurality of load control circuits 145, each of which includes one of the load control switches 22 and which is described in more detail hereinafter with reference to FIG. 3. Each of the load relays within the plurality of load control circuits 145 is adapted to be interconnected with an electrical load circuit, and each load control circuit 145 is interconnected with a corresponding one of the LEDs 24 forming part of a conventional LED display 146.

LOAD CONTROL CIRCUITS 145

Figure 3:
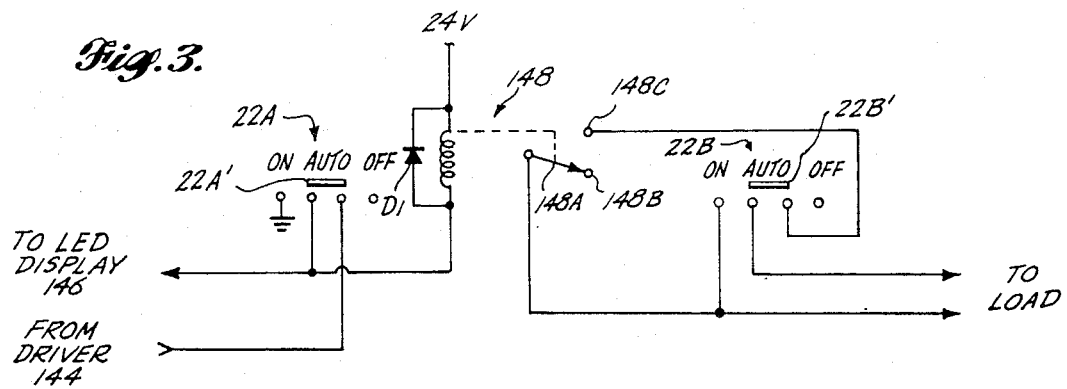
FIG. 3 is an electrical schematic diagram of a load relay circuit illustrated more generally in FIG. 2.

With reference now to FIG. 3, each load control circuit 145 includes the load control switch 22 which is divided into first and second, ganged sections 22A, 22B. Each switch section 22A, 22B includes a plurality of stationary contacts, of which the left hand contact is labelled ON, the middle two contacts are labelled AUTO, and the right hand contact is labelled OFF (corresponding to the labelled positions illustrated in FIG. 1). Switch section 22A is provided with a movable contact member 22A', and switch section 22B is provided with a movable contact member 22B', each of which is adapted to bridge two of the stationary contacts thereof. The ON stationary contact of switch section 22A is connected to ground, and the right-hand AUTO stationary contact thereof is connected to a corresponding output terminal of the driver circuit 144. The left-hand AUTO stationary contact of switch section 22A is connected to a corresponding LED 24 in LED display 146, and to one side of the coil of a load relay 148 whose other side is connected to a source of supply voltage by lead 24 V. A diode D1 connected in shunt with the coil of load relay 148 provides reverse-voltage protection for the output transistor in the corresponding driver circuit 144. A movable contact arm 148A of load relay 148 is connected to a first lead going to the associated load circuit, and to the ON stationary contact of switch section 22B. Upon de-energization of the load relay 148, movable contact arm 148A engages stationary contact 148B thereof, which is unconnected. Upon energization of load relay 148, movable contact arm 148A is in engagement with stationary contact 148C thereof, which is connected to the right-hand AUTO stationary contact in switch section 22B. The left-hand AUTO stationary contact in switch section 22B is connected to a second lead going to the load circuit.

With the movable contact members 22A', 22B' in the position illustrated in FIG. 3, the energization state of the load relay 148 is under control of the microprocessor. When the microprocessor is maintaining the load off, driver circuit 144 provides a high impedance level on its output which, when coupled through switch section 22A, causes load relay 148 to be de-energized. As a result, the leads going to the load circuit are disconnected from each other, inasmuch as movable contact arm 148 is in engagement with stationary contact 148B thereof. When the microprocessor is maintaining the load on, driver circuit 144 provides a low level signal which, when coupled through switch section 22A, permits load relay 148 to be energized from the supply voltage appearing on lead 24 V. The low level signal from driver circuit 144 is also coupled through switch section 22A to the corresponding LED 24 in LED display 146 to provide a current path thereto. When load relay 148 is energized, a connection is made between the leads going to the load circuit, through switch section 22B and contacts 148C, 148A.

As can be noted, no connection is made to the OFF stationary contacts of switch sections 22A, 22B. Accordingly, when the movable contact members 22A', 22B' are moved to bridge the OFF and right-hand AUTO stationary contacts of switch sections 22A, 22B, the connections between the leads going to the load circuit and between the driver circuit 144 and the LED display 146 are broken. Accordingly, the associated load circuit is maintained off, and the associated LED 24 is extinguished, notwithstanding the nature of the signal from driver circuit 144. Likewise, if the movable contact members 22A', 22B' are moved so as to bridge the ON and left-hand AUTO stationary contacts of switch sections 22A, 22B, a connection is made between the leads going to the load circuit, and between the associated LED 24 in LED display 146 and a low level signal (e.g., ground), whereby the associated load circuit is maintained on and the associated LED 24 is lit, notwithstanding the nature of the signal from driver circuit 144.

POWER SUPPLY

Figure 4:
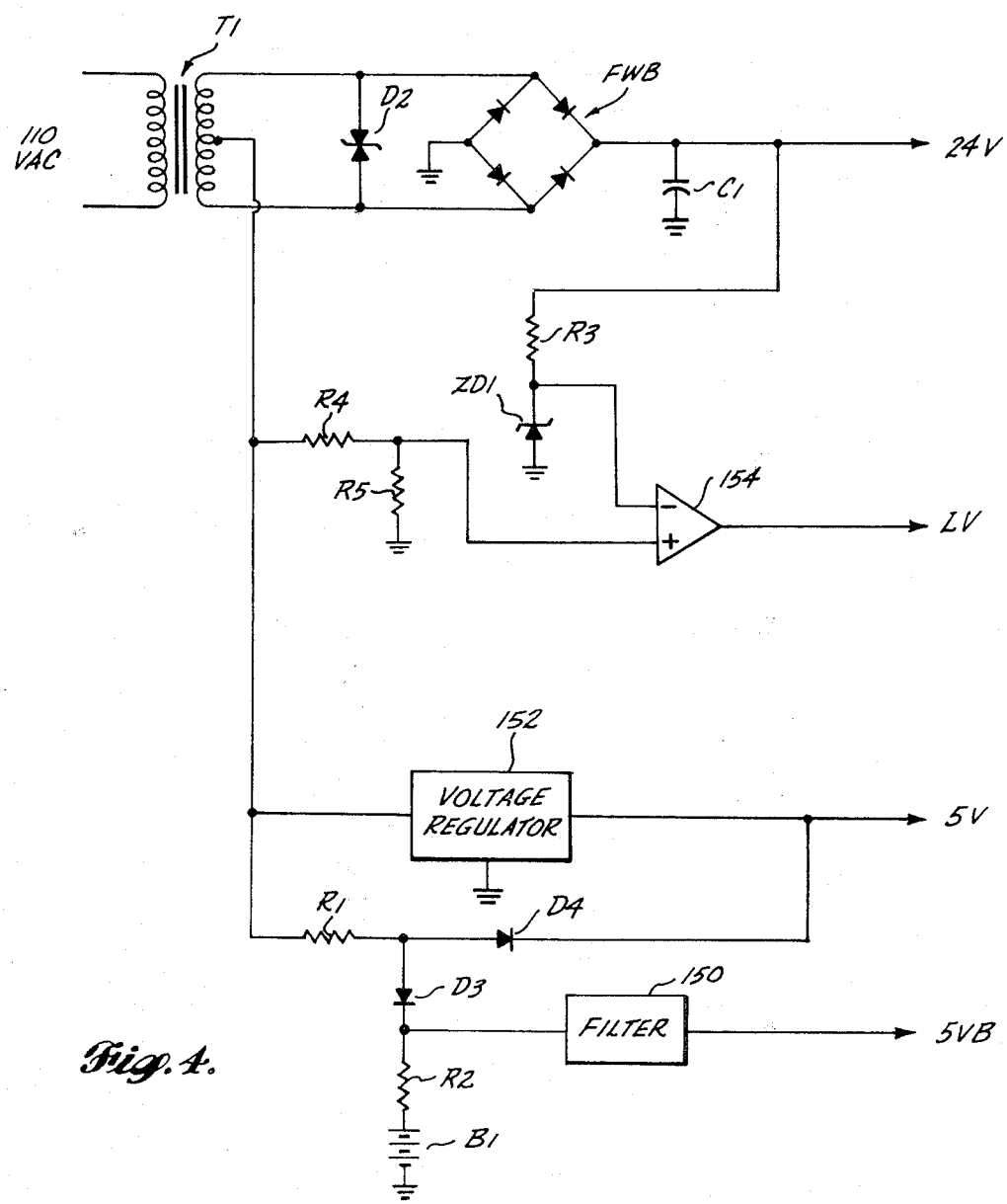
FIG. 4 is an electrical schematic diagram of a power supply and low voltage detection circuit usable with the controller of FIG. 2.

With reference now to FIG. 4, a power supply capable of providing appropriate dc supply voltages for the components of the controller from a source of alternating current, and also capable of detecting a low voltage condition in the source of alternating current, is illustrated. The source of alternating current (nominally at 110 vac) is connected across the primary winding of a transformer T1. The resultant ac voltage appearing across a center-tapped secondary winding of transformer T1 is applied across a grounded full wave bridge rectifier FWB to whose output is connected the lead 24 V (whose dc voltage is nominally 24 volts), with a voltage transient protection diode D2 being connected across bridge FWB to prevent noise transients from appearing on lead 24 V. The ac voltage on the center tap of the secondary winding of transformer T1 (e.g., 12 vac) is connected by a resistor R1, a diode D3, and a resistor R2 to the positive terminal of a battery B1, whose negative terminal is connected to ground. The common junction of diode D3 and resistor R2 is coupled through a filter circuit 150 to a lead 5 VB, upon which appears a dc supply voltage (nominally at 5 vols) for the components of the hardware clock (clock 132, counters 124, 128 and 134, and gates 126, 130) and for RAM 104. A diode D4 is connected from the common junction of resistor R1 and diode D3 to a lead 5 V, upon which appears a dc supply voltage (nominally at 5 volts) for the remaining components of the controller illustrated in FIG. 2. The dc supply voltage on lead 5 V is regulated by a grounded voltage regulator 152 connected in shunt with resistor R1 and diode D4. Resistors R1 and R2 and diode D3 also function as a trickle charger for the battery B1, so that battery B1 is minatained in a state of full charge during the times that power is being supplied from the source of alternating current.

If a power outage should be experienced, it is desirable to terminate the operation of the microprocessor in effecting load control, but to maintain the hardware clock in an operating condition and to maintain the contents of the scratch pad memory and event memory within RAM 104 so that the microprocessor may resume load control upon power restoration. Accordingly, capacitor C1 is connected from lead 24 V to ground, and series-connected resistor R3 and zener diode ZD1 are connected from lead 24 V to ground. The common junction of resistor R3 and zener diode ZD1 is connected to the negative input of a fast acting comparator 154 whose output is connected by a lead LV to a RES IN terminal of CPU 100 (FIG. 2). Resistors R4 and R5 are connected from the center tap of the secondary winding of transformer T1 to ground, and the common junction of resistors R4 and R5 is connected to the positive input of comparator 154. The values of resistors R3, R4 and R5, and the reference voltage of zener diode ZD1, are chosen so that the signal applied to the positive input of comparator 154 is greater than the signal applied to the negative input of comparator 154 when the ac voltage from the source of alternating current is at its nominal value thereof (110 vac). If the ac voltage from the source of alternating current should suddenly drop, as in the case of a power outage, the signal at the negative input of comparator 154 will decrease at a slower rate (due to the action of capacitor C1) than the signal at the positive input thereof. As the ac voltage from the source of alternating current continues to drop, a point will be reached, e.g., at 95 vac, at which the signal at the negative input of comparator 154 becomes greater than the signal at the positive input thereof. As a result, comparator 154 provides a low logic level signal on line LV which places CPU 100 in a reset condition, whereby ports 106, 108, 110A, 110B are reset to thereby effect blanking of all displays and de-energization of the load relays 148 within load control circuits 145. As the ac voltage from the source of alternating current continues to drop, the supply voltages present on leads 5 V, 24 V will not be sufficient to maintain the components connected thereto in operation, and the microprocessor will cease to function. However, the supply voltage on lead 5 VB will now be supplied from the battery B1, and will continue to maintain the hardware clock in operation and to maintain the contents of the scratch pad memory and the event memory within RAM 104. By appropriate choice of the battery B1, the hardware clock may be maintained in operation and the contents of the scratch pad memory and event memory in RAM 104 may be maintained for a considerable period of time in the case of power outage, e.g., fourteen days.

MICROPROCESSOR—SCRATCH PAD MEMORY IN RAM 104

Figure 5:
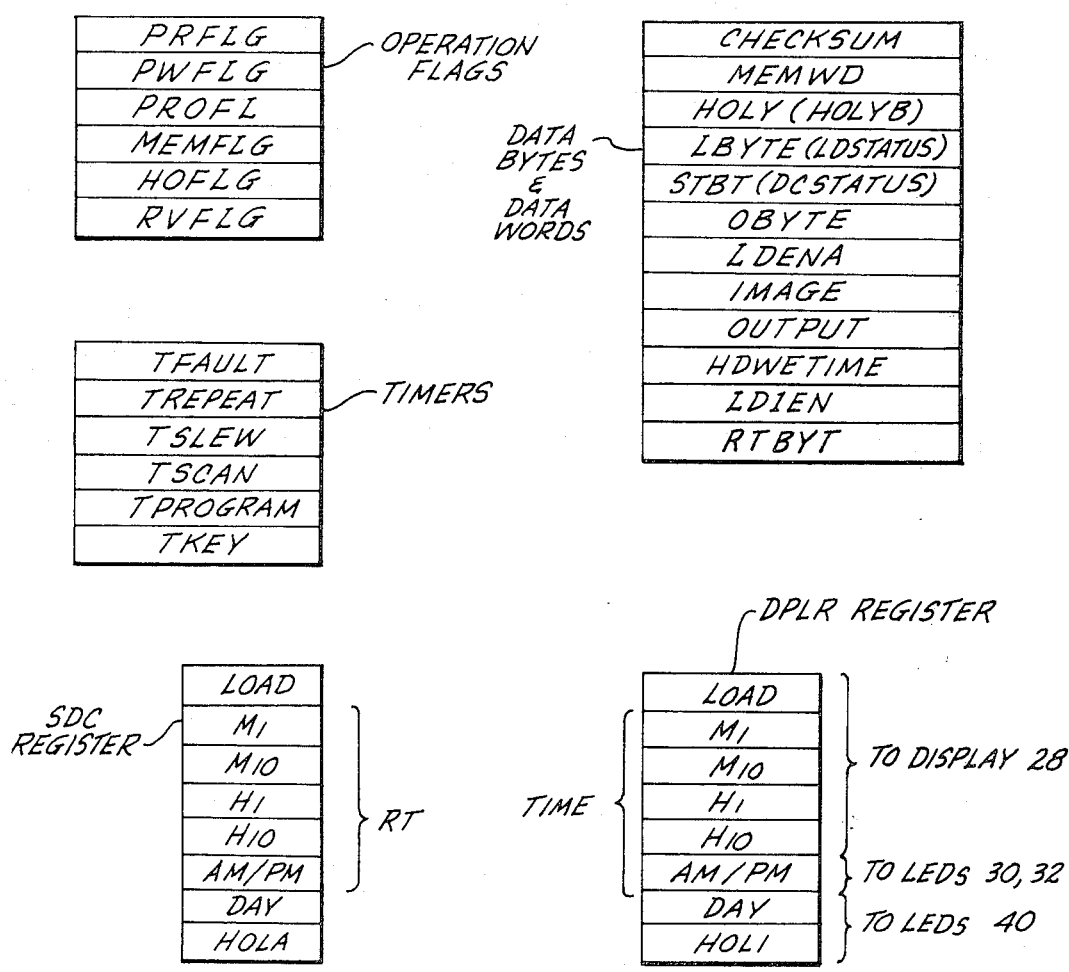
FIG. 5 is a schematic representation of various operation flags, timers, data bytes and registers contained within a scratch-pad memory within the microprocessor.

With reference now to FIG. 5, the scratch pad memory within RAM 104 is organized into a plurality of operation flags, a plurality of timers, a plurality of data bytes and data words, an SDC (seven-day clock) register and a DPLR (display) register, with each operation flag, timer, data byte and each field within the SDC and DPLR registers having a unique memory location within RAM 104. Each of the operation flags comprises a single data bit which is set or cleared by CPU 100 upon execution of cetain program instructions in the routines and subroutines to be described hereinafter. Each of the timers comprises a data byte which is set to a predetermined count, and decremented in response to signals from the hardware clock during an INTERRUPT subroutine described hereinafter, in order to provide timing for various operations utilized in the routines and subroutines. The data bytes and data words comprise 8-bit data bytes and 16-bit data words (excepting the LD1EN byte) whose format and use will be described hereinafter. The SDC register includes a plurality of fields, collectively referred to as RT, and a DAY field which contain the real-time within any week corresponding to real-time information obtained from the hardware clock. Specifically, the RT fields within the SDC register consist of: $M_1$ and $M_{10}$ fields, repesenting real-time minutes in units and tens; $H_1$ and $H_{10}$ fields, representing real-time hours in units and tens; and, an AM/PM field, representing whether real-time minutes and real-time hours are am or pm. The SDC register also has a LOAD field which always contains invalid data, and a single-bit HOLA field which is set when the real-time day is a holiday.

The DPLR register has a plurality of fields, including TIME and DAY fields whose organization corresponds to the RT and DAY fields within the SDC register. The DPLR register also has a LOAD field whose contents represent a load number, and a single-bit HOLI field which is set in certain circumstances to correspond to the HOLA field in the SDC register. Program instructions (not illustrated) are provided which cause CPU 100 to transfer the contents of the DPLR register to the display 28, to LEDs 30, 32 and to LEDs 40 (FIGS. 1 and 2) with such transfer occurring during the INTERRUPT subroutine described hereinafter.

When the microprocessor is also to implement demand limit control, the scratch pad memory within RAM 104 includes additional data as described hereinafter with reference to FIG. 23.

MICROPROCESSOR—EVENT MEMORY IN RAM 104

Figure 6:
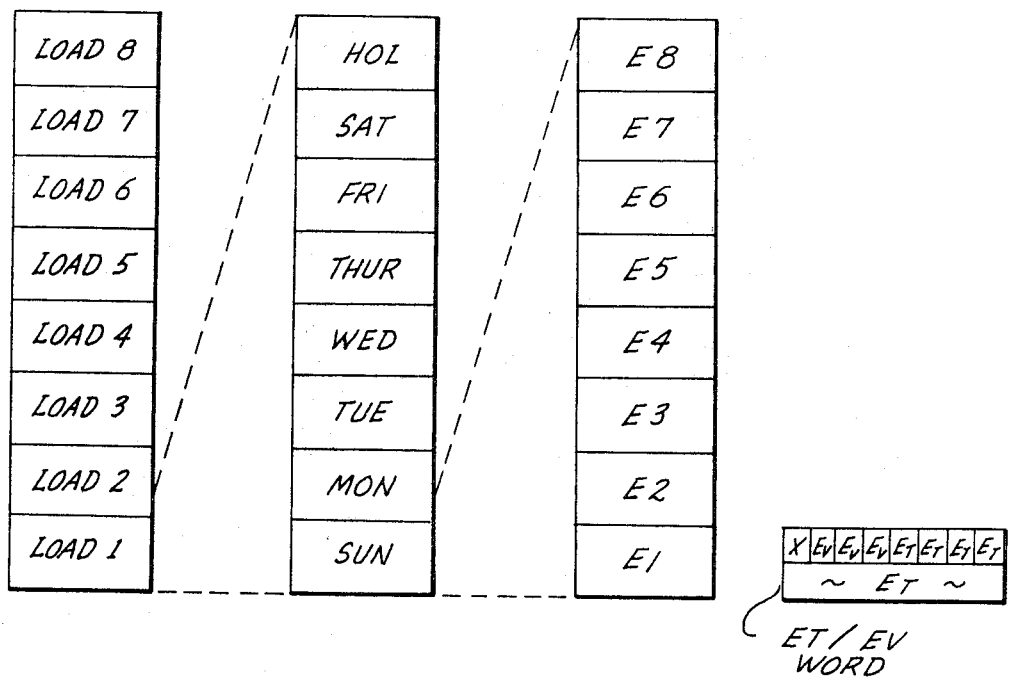
FIG. 6 is a schematic representation of the organization of an event memory within the microprocessor.

The event memory within RAM 104 is organized as illustrated in FIG. 6. Specifically, information relating to the schedule utilized by the microprocessor is stored in the form of ET/EV data words, with each such ET/EV data word including three bits representing a predetermined code for a control event (EV), and twelve bits representing the event time (ET) of that control event. The event memory locations for the ET/EV words are grouped first by loads (e.g., LOAD 1, LOAD 2, etc.). Within each such load group, the ET/EV words are grouped by days within a week (e.g., SUN, MON, etc.). In addition, event memory locations are provided within each load grouping for the ET/EV data words relating to a holiday schedule (e.g., HOL). Within each day group, and within the holiday group, event memory locations are provided for eight ET/EV data words (e.g., E1, E2, etc.). As illustrated, the event memory therefore provides storage for eight control events for each day of the week, plus a holiday, for each one of eight loads, for a total of 512 control events.

MICROPROCESSOR—MAIN PROGRAM LOOP

Figure 7A:
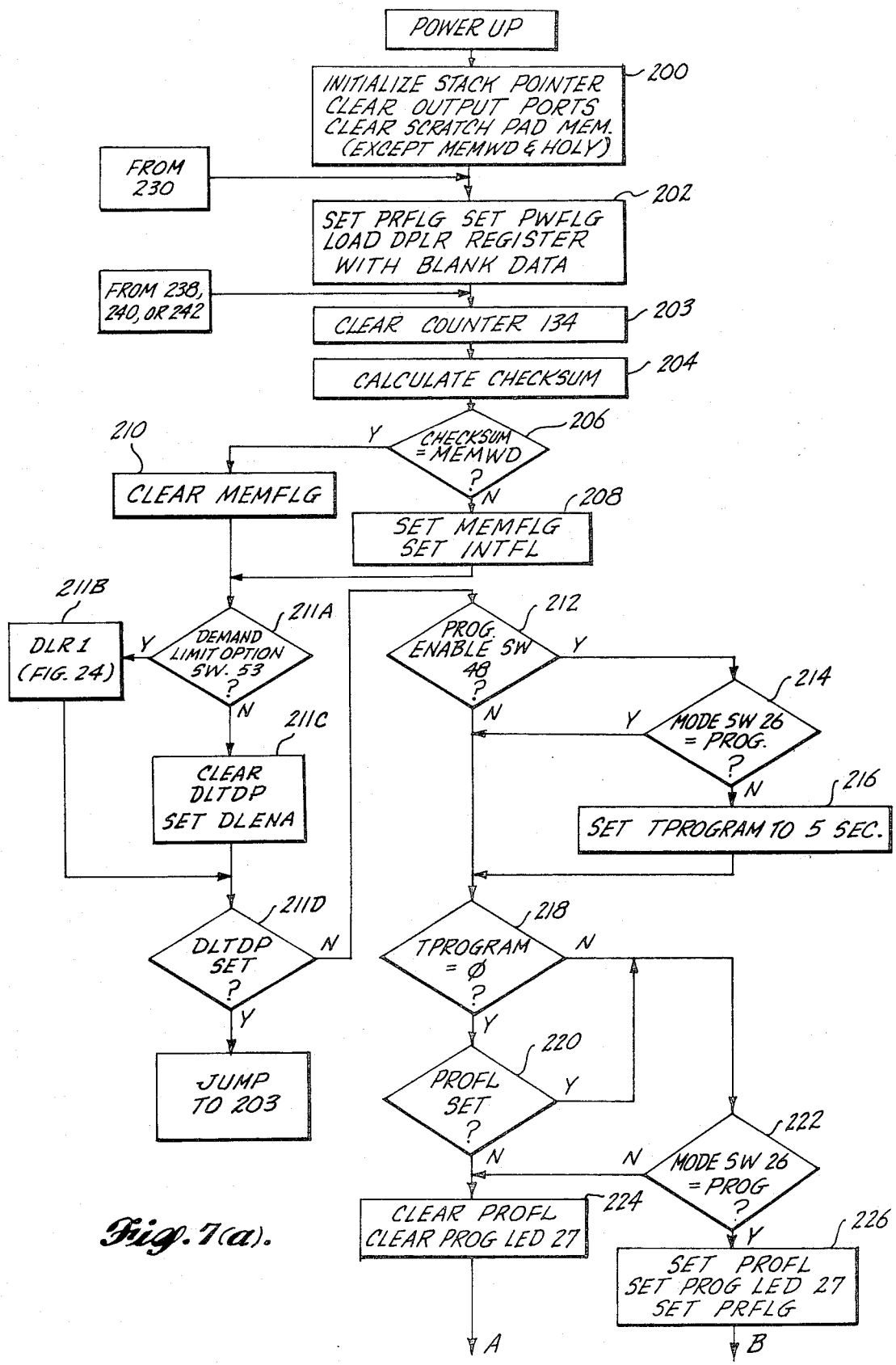
FIGS. 7(a) and 7(b) are a flow chart illustrating the program steps undertaken by the microprocessor in a main program loop.
Figure 7C:
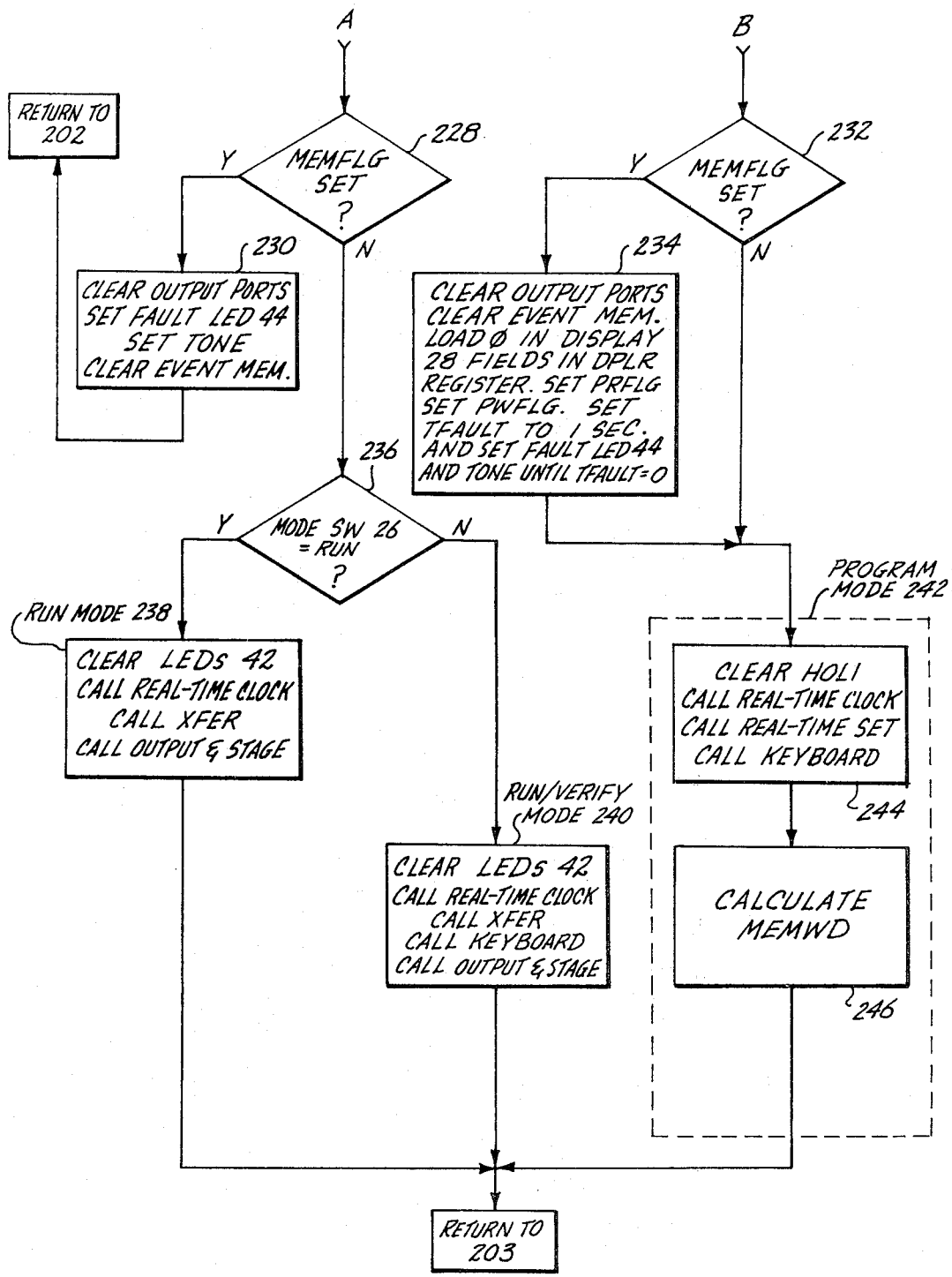

FIGS. 7(a) and 7(b) illustrate the main program loop of program instructions stored within PROM 102.

Upon application of power to the microprocessor, a POWER UP condition is detected by CPU 100 which enables CPU 100 to enter step 200, in which a stack pointer in RAM 104 is initialized. RAM 104, in addition to the scratch pad memory previously described, includes a stack, or holding, register which is used by CPU 100 to temporarily store certain information relating to the program step being executed by CPU 100 when a control signal from the hardware clock (e.g., the third clock signal at 256 Hz) appears on input terminal RST 7.5 thereof. Upon the production of each such control signal, CPU 100 is programmed to immediately enter into the INTERRUPT subroutine. Accordingly, the stack register is provided to provide temporary storage of program information so that CPU 100 can return to a specific program step after completion of the INTERRUPT subroutine. The stack register is configured as a circulating register, with the address of the first byte in the program step then being executed being located in the stack pointer. Also in step 200, all output terminals in ports 106, 108 and 110A, 110B are cleared, and all contents of the scratch pad memory (FIG. 5), excepting the MEMWD and HOLY data bytes, are cleared.

CPU 100 then proceeds, in step 202, to set the PRFLG and PWFLG operation flags (FIG. 5) and to load all the fields in the DPLR register with blank data, whereupon the display 28 is blanked and the LEDs 30, 32 and all LEDs 40 are extinguished. In step 203, CPU 100 enters its main program loop and clears (i.e., resets) counter 134. Normally, CPU 100 will pass through the main program loop and return to step 203 in less time than is required for counter 134 to overflow. However, if CPU 100 should in some manner be inhibited from timely completing a pass through the main program loop, counter 134 will overflow as previously described, whereby CPU 100 is programmed (not illustrated) to return to step 200 and to reinitialize its operations. CPU 100 then proceeds, in step 204, to calculate and store the CHECKSUM data word, with CHECKSUM comprising the numerical sum of all data bits within the event memory (FIG. 6). CPU 100 then makes a test, in step 206, to determine if the CHECKSUM data word equals the MEMWD data word. As described hereinafter, MEMWD is calculated when the microprocessor is in the program mode and also equals the numerical sum of all data bits within the event memory. If power has been applied to the microprocessor for the first time, MEMWD will have not been previously calculated and accordingly the determination in step 206 will be negative. If power has been restored to the microprocessor after a power outage, MEMWD should equal CHECKSUM, provided that power has been restored within the hold-up period established by battery B1 (e.g., fourteen days), and the determination in step 206 will be affirmative. In any case, if the event memory malfunctions, the determination in step 206 will be negative. If the determination in step 206 is negative, CPU 100 proceeds, in step 208, to set the MEMFLG operation flag and to set an INTFL operation flag used to initialize the apparatus in FIG. 22, as described hereinafter. If the determination in step 206 is affirmative, CPU 100 proceeds, in step 210, to clear MEMFLG. When MEMFLG is set, the microprocessor forces the user to select the program mode, as described hereinafter.

Figure 24A:
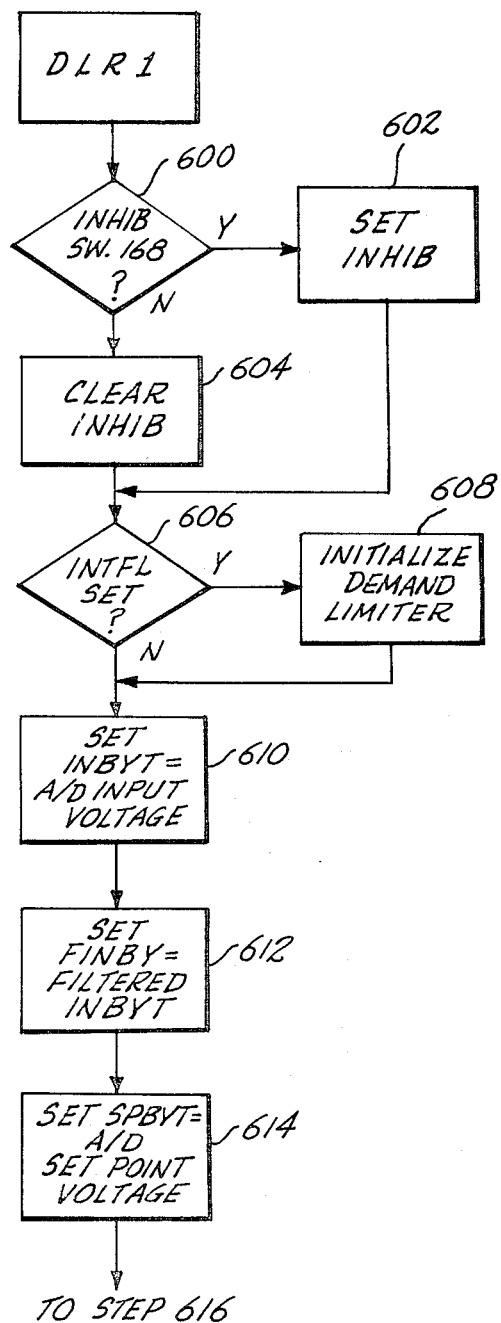
FIGS. 24(a) and 24(b) are a flow chart illustrating the program steps undertaken by the microprocessor in a DLR1 routine.
Figure 24:
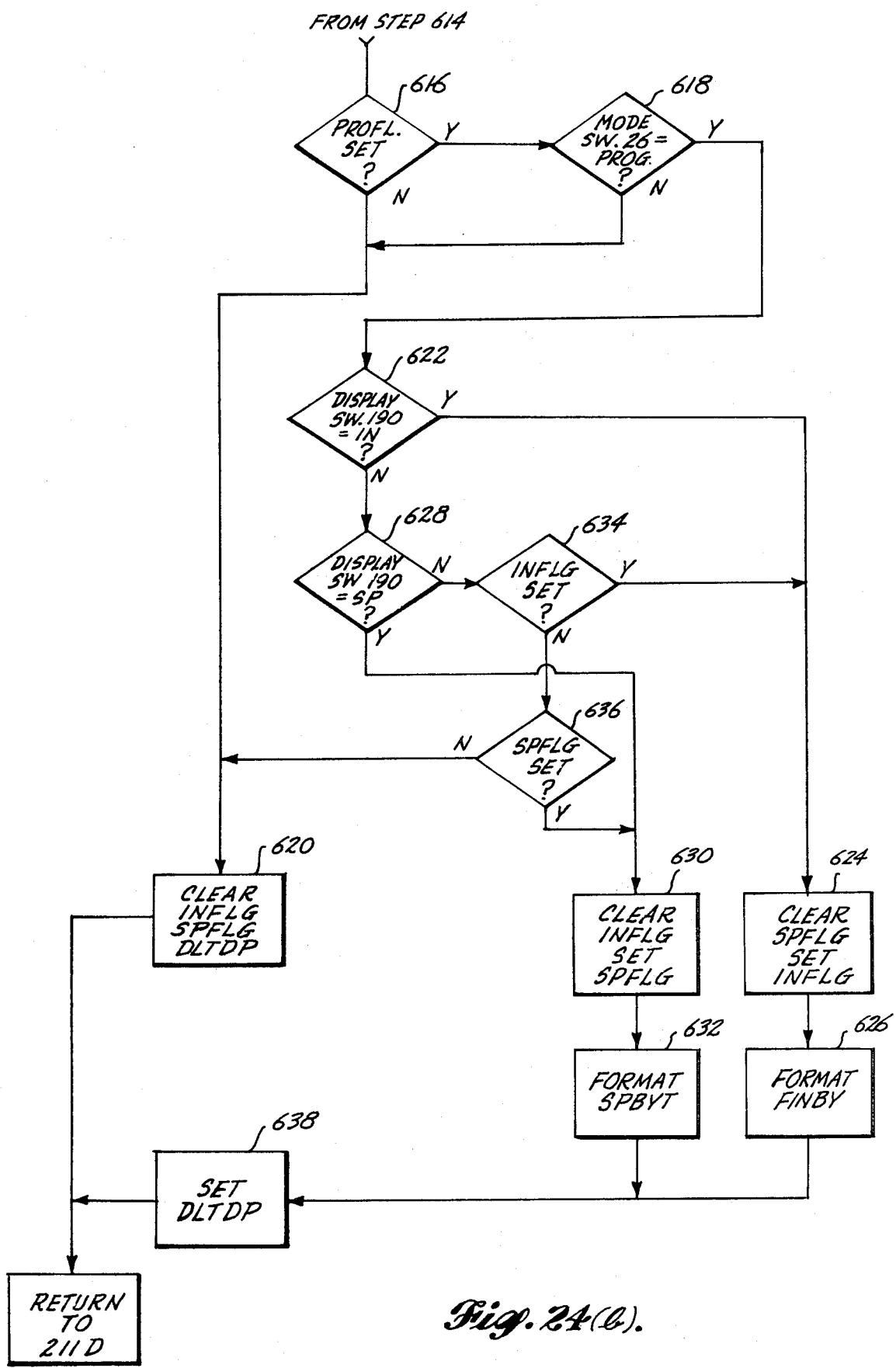

From either step 208 or step 210, CPU 100 proceeds, in step 211A, to determine if the demand limit option switch 53 has been actuated. If the determination in step 211A is affirmative, CPU 100 proceeds, in step 211B, to the DLR1 routine described hereinafter with reference to FIG. 24. If the determination in step 211A is negative, CPU 100 proceeds, in step 211C, to clear a DLTDP operation flag and to set a DLENA data byte. As explained hereinafter, the DLTDP operation flag is set when certain information relating to demand limit control is to be displayed by display 28. When the DLTDP operation flag is cleared, the information displayed by display 28 is that obtained from the DPLR register. As also explained hereinafter, the DLENA data byte comprises the demand limit control output and includes eight bits, one for each load, with each bit being set when its associated load is to be maintained on under demand limit control or when its associated load is not subject to demand limit control, and being cleared its associated load is to be maintained off under demand limit control. Accordingly, if demand limit control has not been chosen, e.g., demand limit option switch 53 has not been actuated, the operations in step 211C insure that only the information within the DPLR register will be displayed by display 28, and that the energization states of the loads will be under real-time control only, inasmuch as all bits in the DLENA data byte are set.

From either step 211C or step 211B, CPU 100 proceeds, in step 211D, to determine if the DLTDP operation flag has been set. If the determination in step 211D is affirmative, CPU 100 jumps to step 203. However, for purposes of the following discussion and until consideration of demand limit control in specific connection with FIGS. 22–34(a), 34(b), it will assumed that demand limit control is not to be implemented. Under such an assumption, the determination is step 211D is accordingly negative, whereby CPU 100 proceeds, in step 212, to determine if the program enable switch 48 is being actuated. Let it be assumed that the user has not so actuated the program enable switch 48, whereupon the determination in step 212 is negative. As a result, CPU 100 proceeds, in step 218, to determine if the TPROGRAM timer is at zero. Since TPROGRAM has been cleared in step 200, the determination in step 218 is affirmative, whereupon CPU 100, in step 220, determines if the PROFL operation flag has been set. Since PROFL has been cleared in step 200, the determination in step 220 is negative, whereupon CPU 100, in step 224, clears PROFL and the PROGRAM LED 27.

Thereafter, in step 228, CPU 100 determines if MEMFLG has been set. Let it be assumed that power has been initially applied to the microprocessor, or that an event memory malfunction has occurred, and that MEMFLG has been set in step 208. The determination in step 228 is therefore affirmative, whereupon CPU 100, in step 230, clears the output terminals in ports 106, 108 and 110A, 110B, and clears all memory locations within the event memory. CPU 100 also sets (i.e., lights) the FAULT LED 44, and causes the production of a tone by audible alarm 54, to accordingly signify to the user that the microprocessor must be placed in its program mode. CPU 100 then returns to step 202, and continues to circulate in the loop described until the user has actuated the program enable switch 48.

MAIN PROGRAM LOAD—PROGRAM MODE

Upon actuation of the program enable switch 48, the determination in step 212 is affirmative, whereupon CPU 100, in step 214, determines if the mode switch 26 has been set to its PROGRAM position. If the user has set the mode switch 26 to its PROGRAM position before actuating the program enable switch 48, the determination in step 214 is affirmative, whereby CPU 100 proceeds through steps 218 et seq. as previously described, whereupon the FAULT LED 44 and the tone from audible alarm 54 are maintained on to signify to the user that the program mode must be entered in a proper manner.

If the user has not set the mode switch 26 to its PROGRAM position before actuating the program enable switch 48, however, the determination in step 214 is negative, whereupon CPU 100, in step 216, sets the TPROGRAM timer to a count representing five seconds.

Upon setting of TPROGRAM, the determination in step 218 is negative, whereupon CPU 100, in step 222, again determines if the mode switch 26 has been set to the PROGRAM position. If the determination in step 222 is negative, CPU 100 continues to loop through steps 224, 228, 230, 202, 203, 204, 206, 208, 211A, 211C, 211D, 212, 218, 220 and 222 for a period of five seconds (i.e., until TPROGRAM has decremented to zero), accordingly giving the user that period of time in which to set the mode switch 26 to the PROGRAM position.

Assuming that the user has set the mode switch 26 to the PROGRAM position within the five-second period, the determination in step 222 is affirmative, whereupon CPU 100, in step 226, sets the PROFL operation flag, sets the PROGRAM LED 27, and sets the PRFLG operation flag. CPU 100 then proceeds, in step 232, to determine if MEMFLG has been set. If the determination in step 232 is affirmative, CPU 100, in step 234, proceeds to clear the output terminals in ports 106, 108 and 110A and 110B, to clear the event memory locations in the event memory, to load the fields within the DPLR register which are coupled to the display 28 with zeros (excepting the LOAD field in the DPLR register which is loaded with blank data), whereupon the LOAD character display in display 28 is blanked and the remaining character displays in display 28 each display "0," and to set the PRFLG and PWFLG operation flags. CPU 100 also sets TFAULT to one second, and sets the FAULT LED 44 and the tone from audible alarm 54 until the count within TFAULT is decremented to zero. The indication provided by the momentary lighting of the FAULT LED 44, and the concurrent production of a tone from audible alarm 54, signifies to the user that the event memory has been cleared and that a new schedule must be entered therein. From step 234, CPU 100 proceeds to its PROGRAM mode 242.

If the determination in step 232 is negative (e.g., there is no event memory malfunction and the user wishes to alter a previously-entered schedule), CPU 100 does not undertake the actions in step 234, but rather proceeds directly to its PROGRAM mode 242.

Within step 244 in the PROGRAM mode 242, the HOLI field in the DPLR register is cleared. As explained hereinafter, the HOLI field is set when the day in real-time corresponds to a day selected as a holiday. Also, the HOLY data byte in the scratch pad memory (FIG. 5) within RAM 104 includes seven HOLYB bits, one for each day of the week, with each HOLYB bit being set, during the time that the microprocessor is in its run/verify mode of operation, when the user selects the corresponding day as a holiday upon actuation of the HOLIDAY key in keyboard 38.

After clearing HOLI, CPU 100 calls a REAL-TIME CLOCK routine, a REAL-TIME SET routine, and a KEYBOARD routine in sequence, along with their associated routines and subroutines, as described in detail hereinafter. In summary, the actions undertaken by CPU 100 in step 244 allow: for the updating of the fields within the SDC register in accordance with real-time information obtained from the hardware clock; for setting of the time within the hardware clock to any desired time; and, for the servicing of a keyboard entry by the user through use of the keyboard 38. From step 244, CPU 100 proceeds, in step 246, to calculate and store MEMWD. From step 246, CPU 100 then exits from the PROGRAM mode 242 and returns to step 203. The determination in step 206 is now affirmative, as a result of which CPU 100 proceeds in step 210, to clear MEMFLG. Assuming that the mode switch 26 remains at the PROGRAM position, CPU 100 will again return to its PROGRAM mode 242. As an example, let it be assumed that TPROGRAM has decremented to zero. Accordingly, the determination in step 218 is affirmative. However, since PROFL has been set, the determination in step 220 is affirmative, whereupon CPU 100 proceeds through steps 222 and 226 to step 232. Since MEMFLG has been cleared, the determination in step 232 is negative, whereupon CPU 100 returns to the PROGRAM mode 242.

As can be appreciated, CPU 100 will continue to pass through the portion of the main program loop including the PROGRAM mode 242 for as long as the mode switch 26 is set to the PROGRAM position. Therefore, the user is permitted whatever time is required to enter a schedule into the microprocessor.

ENTERING OR ALTERATION OF TIME SCHEDULE

Figure 12:
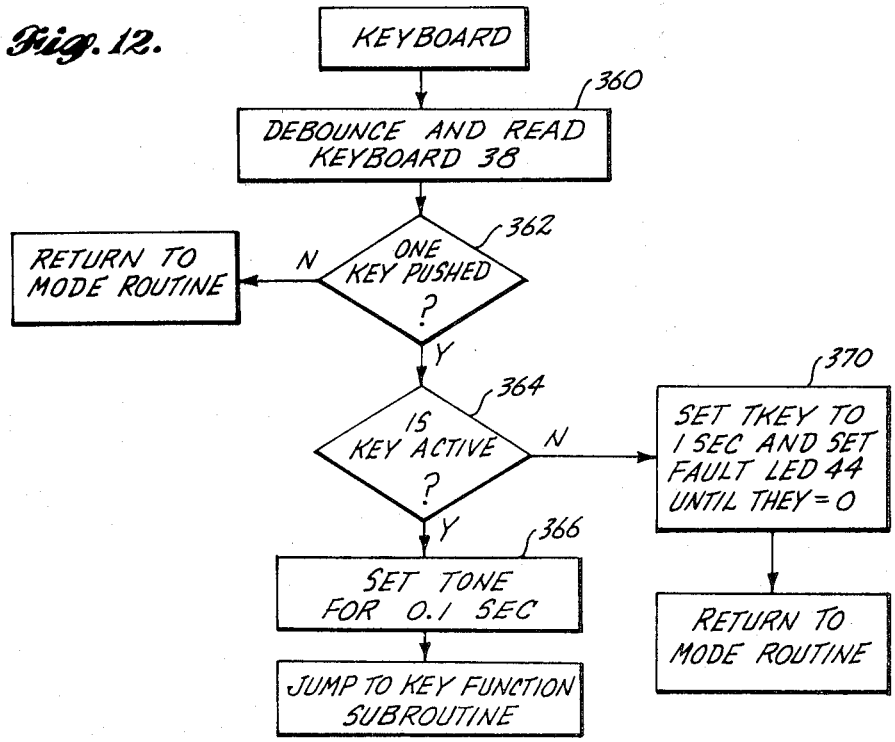
FIG. 12 is a flow chart of the program steps undertaken by the microprocessor in a KEYBOARD routine.
Figure 13:
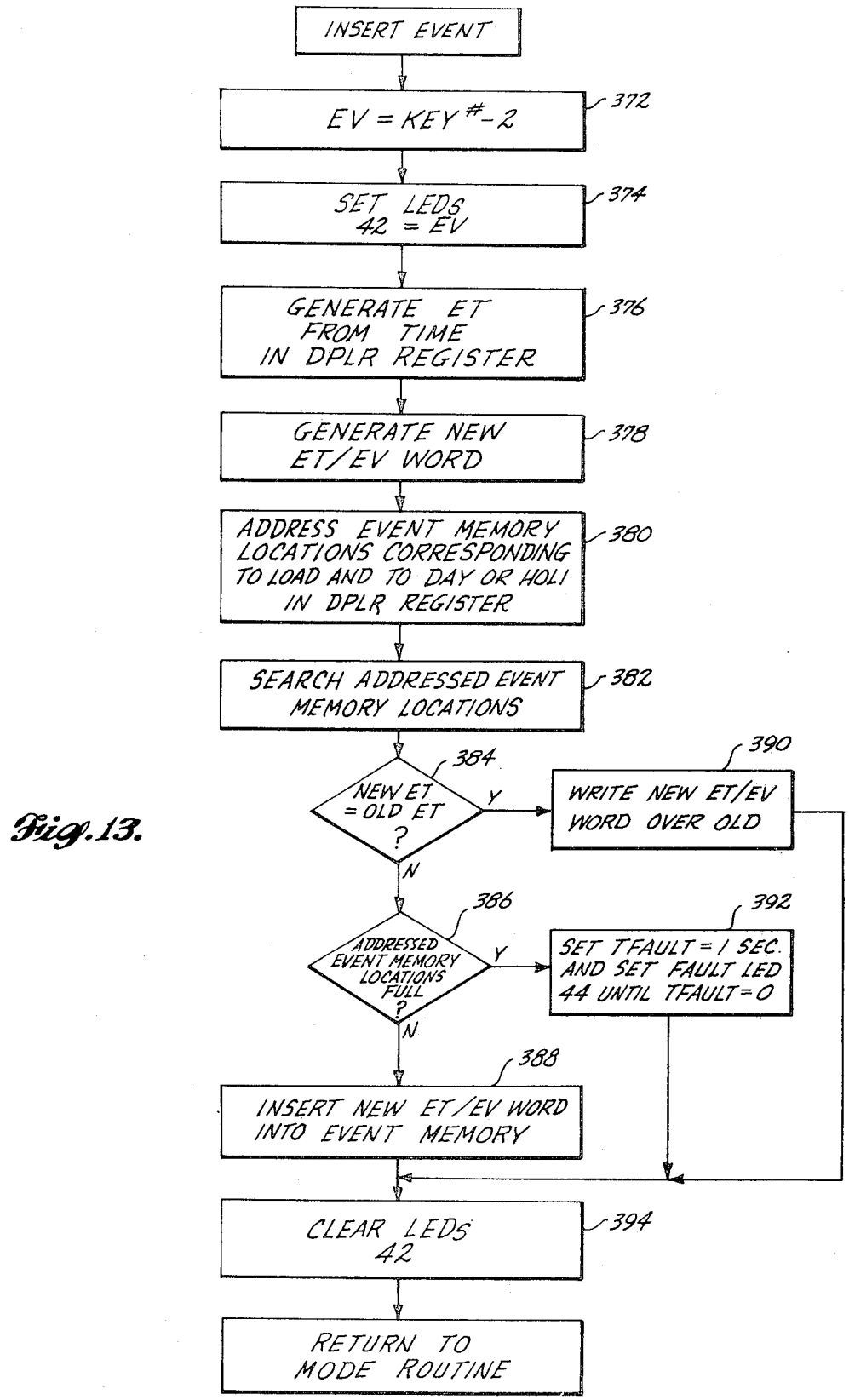
FIG. 13 is a flow chart of the program steps undertaken by the microprocessor in an INSERT EVENT subroutine.
Figure 14:
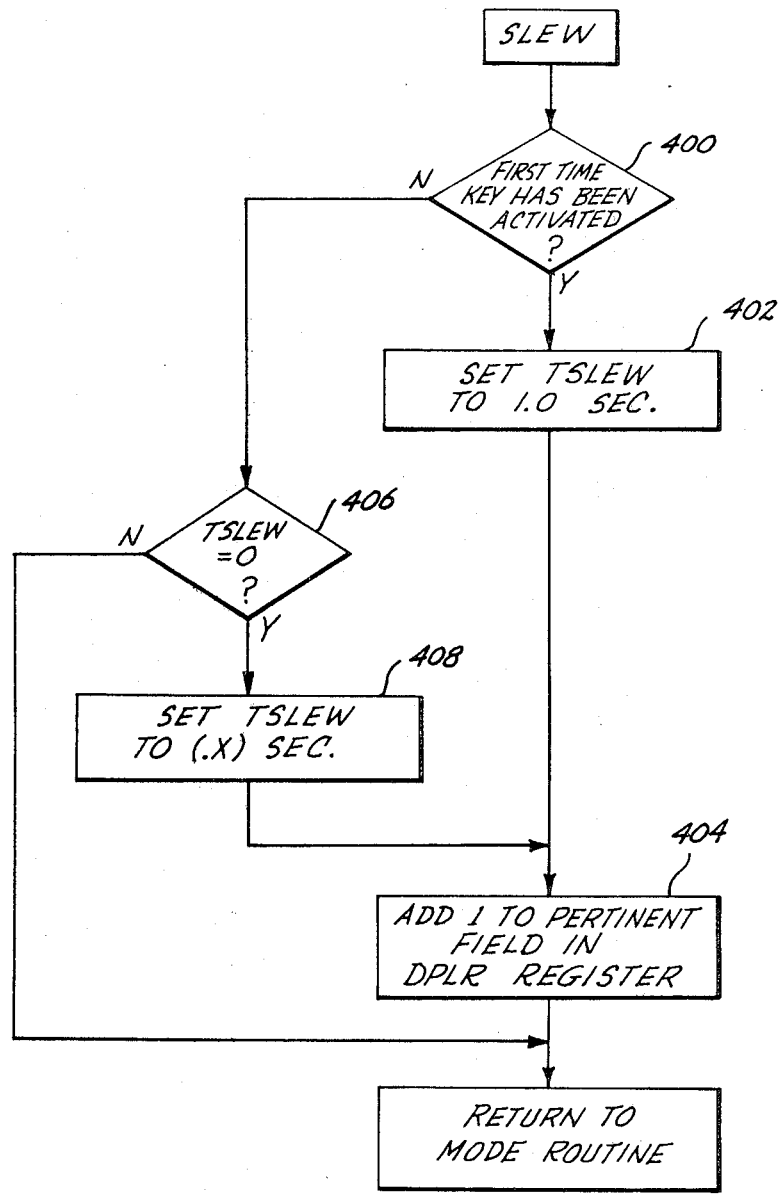
FIG. 14 is a flow chart of the program steps undertaken by the microprocessor in a SLEW subroutine.
Figure 15:
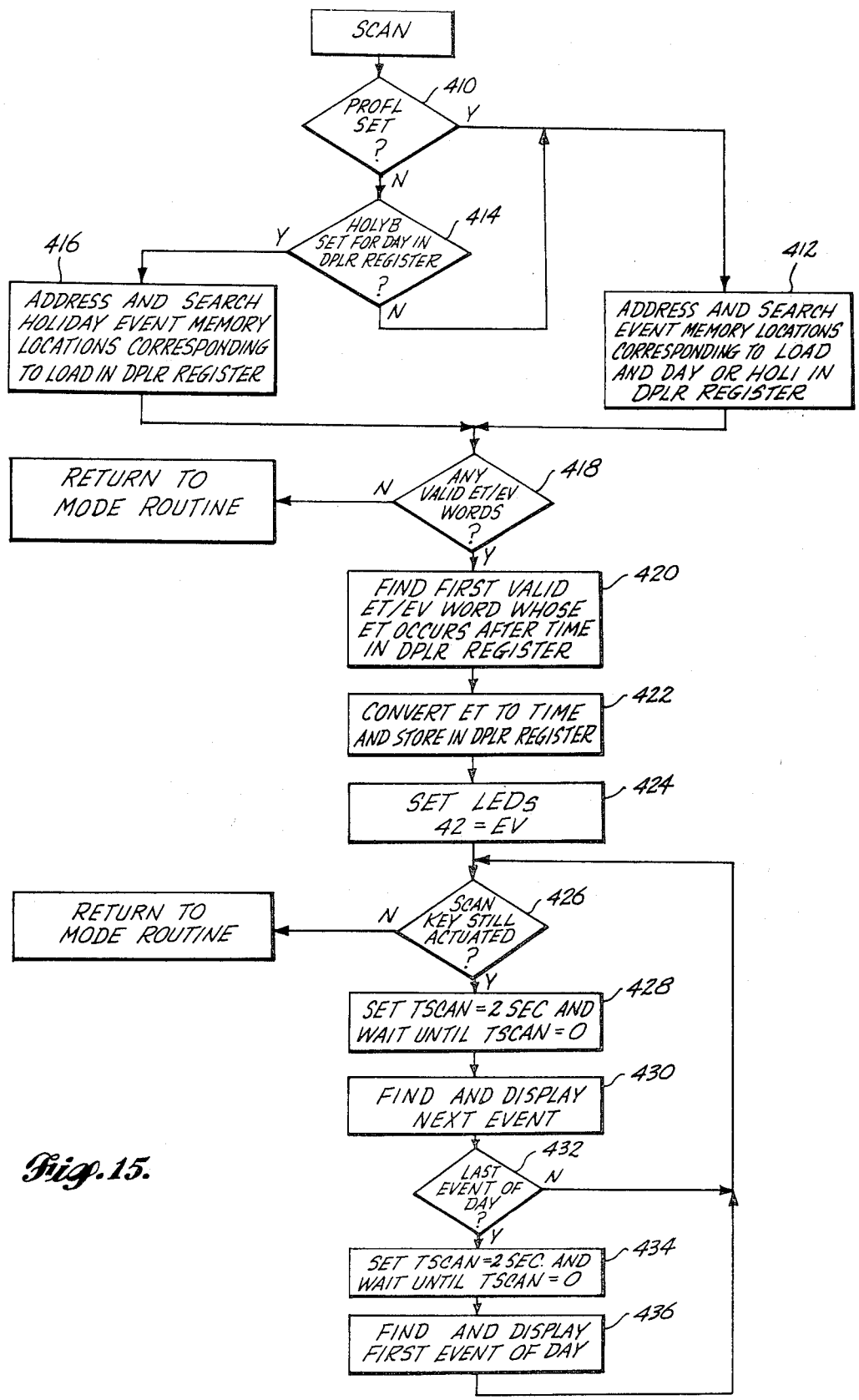
FIG. 15 is a flow chart of the program steps undertaken by the microprocessor in a SCAN subroutine.

Let it be assumed that CPU 100 has processed the REAL-TIME CLOCK and REAL-TIME SET routines within step 244 in the PROGRAM mode 242, and has proceeded to the KEYBOARD routine illustrated in FIG. 12. Initially, CPU 100, in step 360, debounces and reads the keyboard 38, and effects transfer of data from the input terminals of port 108 to internal registers within CPU 100. In step 362, CPU 100 then determines if one, and only one, key has been actuated. If the determination in step 362 is negative, i.e., the user has made an error in data entry by actuating more than one key, CPU 100 returns to the mode routine currently being processed (in the case being discussed, the PROGRAM mode 242). Whenever CPU 100 is stated, in the ensuing discussion, as "returning to the mode routine," it should be understood that CPU 100 jumps to the next routine, or branch routine, in the step then being executed, or to the next step in the mode routine then being executed. For example, if CPU 100 is in the PROGRAM mode 242, and if the determination in step 362 is negative, CPU 100 jumps to step 246.

If the determination in step 362 is affirmative, however, CPU 100 proceeds, in step 364, to determine if the key that has been actuated is an "active" key. In this regard, only certain of the keys in the keyboard 38 are active when the microprocessor is in its program mode of operation, and only certain of the keys in keyboard 38 are active when the microprocessor is in its run/verify mode of operation. CPU 100 makes the determination in step 364 by referring to a look-up table in PROM 102 which contains a listing of pertinent information relating to the keys in keyboard 38. Table II sets forth an example of such a listing.

TABLE II

| Key # | Key Label | Mode Run/Verify | Mode Program | Key Function Subroutine |
|---|---|---|---|---|
| 1 | REPEAT | E | A | REPEAT |
| 2 | (OFF) 0 | E | A | INSERT EVENT |
| 3 | 5 | E | A | INSERT EVENT |
| 4 | 10 | E | A | INSERT EVENT |
| 5 | 15 | E | A | INSERT EVENT |
| 6 | 20 | E | A | INSERT EVENT |
| 7 | 25 | E | A | INSERT EVENT |
| 8 | (ON) 30 | E | A | INSERT EVENT |
| 9 | CLEAR | E | A | CLEAR |
| 10 | HOLIDAY | A | E | HOLIDAY |
| 11 | TIME | A | A | TIME |
| 12 | SCAN | A | A | SCAN |
| 13 | MINUTE | A | A | SLEW |
| 14 | HOUR | A | A | SLEW |
| 15 | DAY | A | A | SLEW |
| 16 | LOAD | A | A | SLEW |
| E - ERROR | | | A - ACTIVE | |

If the determination in step 364 is affirmative, CPU 100, in step 366, sets the audible alarm 54 for a period of 0.1 second, whereupon a momentary tone is sounded thereby to signify to the user that a proper data entry has been made, and then jumps to a key function subroutine for the particular key that has been pressed. Table II also contains a listing of the key function subroutines for each of the keys within keyboard 38.

If the determination in step 364 is negative, i.e., the actuated key is not active (reference again Table II), CPU 100 proceeds, in step 370, to set the TKEY timer to a count representing one second, and sets the FAULT LED 44 until the count within TKEY equals zero, thereby signifying to the user that an improper data entry has been attempted. From step 370, CPU 100 returns to the mode routine then being executed.

The user will have been instructed to enter the schedule for load control into the microprocessor by selecting each load and each day and by selecting each event time and corresponding control event for the thus-selected load and day. In order to select a load, the user actuates the LOAD key in keyboard 38, and in order to select the event time and day, the user actuates the MINUTE, HOUR and DAY keys in keyboard 38. The actuation of any of these keys causes CPU 100 to jump to the SLEW key function subroutine illustrated in FIG. 14. Initially, CPU 100, in step 400, determines if the key actuation is the first such actuation for the key in the processing of the mode routine then being executed. If the determination in step 400 is affirmative, CPU 100, in step 402, sets the TSLEW timer to a count representing one second, and then proceeds, in step 404, to add a decimal "1" to the pertinent field in the DPLR register. Let it be assumed that the LOAD key has been actuated and that the LOAD field in the DPLR register contains blank data (e.g., step 234, FIG. 7(b)). The LOAD field in the DPLR register will contain data, after step 404, representing "1" which will result in the numeral "1" being displayed by the LOAD character display in display 28. From step 404, CPU 100 returns to the mode routine.

If the key remains actuated, CPU 100 returns to the SLEW key function subroutine upon its next pass through the main program loop. At this time, the determination in step 400 is negative, whereupon CPU 100 proceeds, in step 406, to determine if the count in TSLEW is equal to zero. The initial determination in step 406 will be negative (since TSLEW has been set to a count representing one second), whereupon CPU 100 returns to the mode routine. CPU 100 continues to pass through the main program loop in this manner until TSLEW has been decremented to zero, whereupon the determination in step 406 is affirmative. Thereafter, CPU 100, in step 408, sets the TSLEW to a count representing o.x second (with x being dependent on the key that has been actuated), and then returns to step 404, wherein the pertinent field in the DPLR register is incremented so that the display afforded by the corresponding character display in display 28 is incremented by decimal "1". Accordingly, the user may select a desired load by actuating and holding the LOAD key until the desired load number appears in the display 28. Likewise, the user may select a desired event time and day by actuating and holding the MINUTE, HOUR, and DAY keys until the desired event time is displayed by display 28, LEDs 30, 32 and LEDs 40. Since it is desired to increment the display of minutes at a faster rate than the load number, hour and day displays, the factor x utilized in step 408 for the MINUTE key is preferably much less than that utilized for the LOAD, HOUR and DAY keys. At this point, it should be noted that when the DAY field in the DPLR register has been incremented to its full count (i.e., seven days), continued actuation of the DAY key will cause the DAY field to overflow and the HOLI field to be set. Upon overflow of any field in the DPLR register, that field will be cleared so that the corresponding display can be continuously advanced for as long as the corresponding key is actuated.

With the load, day, and event time thus selected, the operator will have been instructed to select a control event by actuation of one of the event keys in the keyboard 38. Upon actuation of an event key, CPU 100 jumps to the INSERT EVENT key function subroutine illustrated in FIG. 13. Initially, CPU 100, in step 372, generates an EV number, representing the desired control function, as equal to the key number (reference Table II) minus 2. For convenience, the EV numbers are listed in Table III.

TABLE III

| EV | KEY | |
|---|---|---|
| 6 | 30(ON) | |
| 5 | 25 | |
| 4 | 20 | |
| 3 | 15 | DUTY-CYCLE CONTROL FUNCTION |
| 2 | 10 | |
| 1 | 5 | |
| 0 | 0(OFF) | |

In step 374, CPU 100 lights the corresponding LED 42. In step 376, CPU 100 generates an event time ET from the TIME fields within the DPLR register (which represent the selected event time). In step 378, CPU 100 then generates a new ET/EV data word from the EV number and event time ET generated in steps 372 and 376, with the format of the ET/EV data word corresponding to that illustrated in FIG. 6.

CPU 100 then proceeds, in step 380, to address the event memory locations corresponding to the LOAD field and to the DAY or HOLI fields in the DPLR register. In step 382, CPU 100 searches the addressed event memory locations. CPU 100 then determines, in step 384, if the ET in the new ET/EV data word corresponds to an ET in the addressed event memory locations, i.e., the selected event time corresponds to an event time of a previously entered control event. If the determination in step 384 is negative (e.g., the event memory has been cleared), CPU 100, in step 386, determines if the addressed event memory locations are full. If the determination in step 386 is negative, CPU 100 proceeds, in step 388, to insert or store the new ET/EV data word into an appropriate location in the event memory. CPU 100 then proceeds, in step 394, to clear the LED 42 which was lit in step 374, and thereafter returns to the mode routine.

Let it be assumed that the event memory already contains one or more ET/EV data words in the event memory locations addressed in step 382. If the ET in the new ET/EV data word corresponds to any ET in the addressed event memory locations, the determination in step 384 is affirmative so that CPU 100 proceeds, in step 390, to write the new ET/EV data word over the old ET/EV data word having the same ET, and then returns to step 394. Likewise, if the addressed event memory locations are full, e.g., they contain eight ET/EV data words, the determination in step 386 is affirmative, whereupon CPU 100, in step 392, sets TFAULT to a count representing one second, and sets the FAULT LED 44 until the count within TFAULT goes to zero, to thereby signify to the user that an improper data entry has been attempted. From step 392, CPU 100 proceeds to step 394.

In this manner, the schedule for load control for an entire week can be entered into the event memory. If the user wishes to copy the schedule for a selected load and for a selected day into the event memory locations for that load and for one or more, succeeding days, the user will actuate the REPEAT key in keyboard 38. Actuation of the REPEAT key causes CPU 100 to jump to the REPEAT key function subroutine illustrated in FIG. 16. Initially, CPU 100, in step 440, copies the ET/EV data words in the event memory locations corresponding to the selected day and load (represented by the DAY and LOAD fields in the DPLR register) into the event memory locations corresponding to the succeeding day and to the selected load. In step 442, CPU 100 then proceeds to increment the DAY field in the DPLR register by one, whereupon the LED 40 for the succeeding day is lit to accordingly signify to the user that the schedule has been copied, and then returns to the mode routine. If desired, the user may copy the schedule for additional succeeding days by subsequent actuations of the REPEAT key.

Likewise, the user may wish to erase the schedule for a selected day and load. Accordingly, the user, after selecting the day and load by actuation of the DAY and LOAD keys in the manner previously described, actuates the CLEAR key in keyboard 38, whereupon CPU 100 jumps to the CLEAR subroutine illustrated in FIG. 17. In step 450, the event memory locations corresponding to the thus-selected day and load (represented by the DAY and LOAD fields in the DPLR register) are filled with invalid data words, e.g., zeros. Thereafter, CPU 100 returns to the mode routine.

TRANSFER OF REAL-TIME INFORMATION FROM CLOCK

Figure 10:
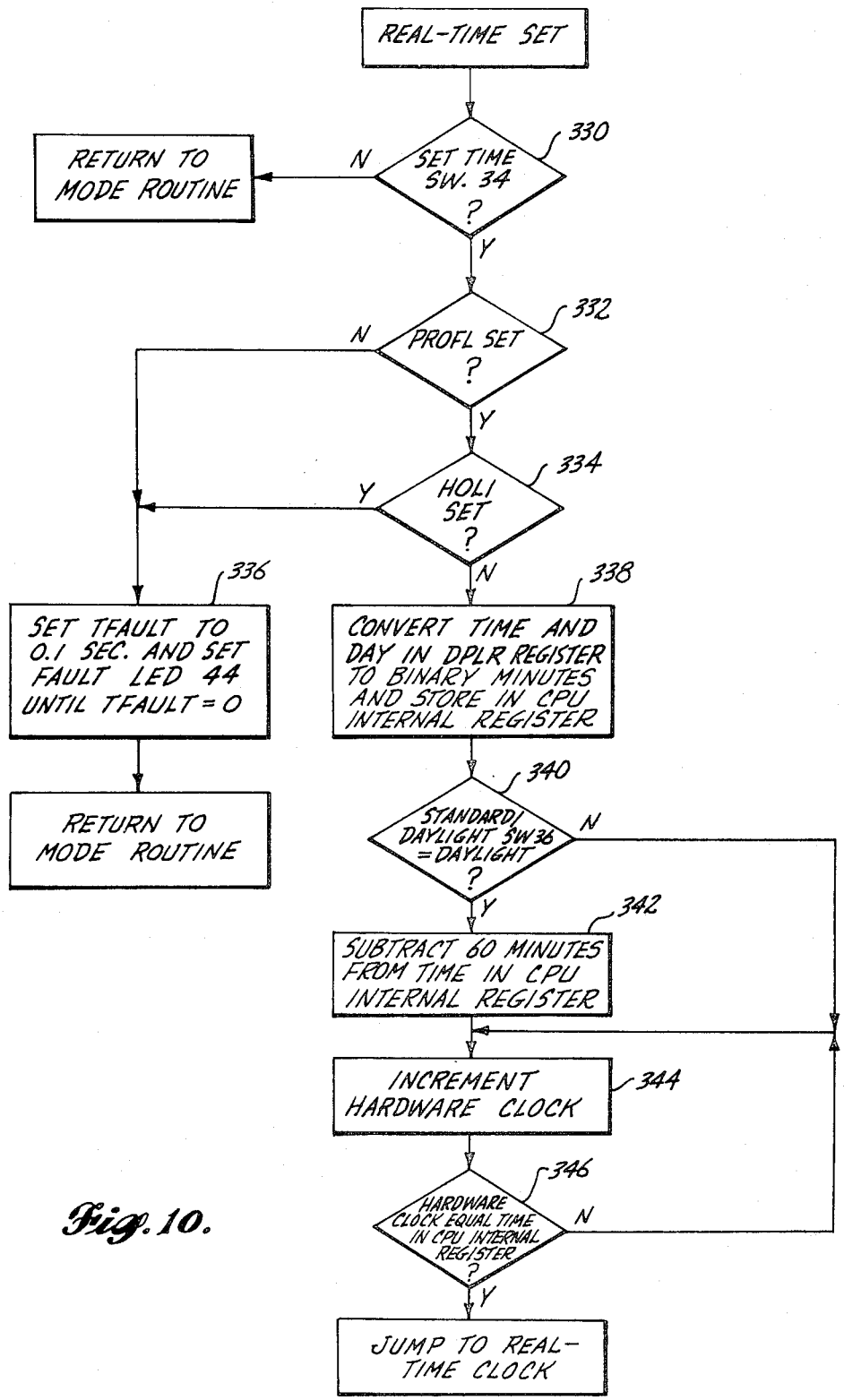
FIG. 10 is a flow chart of the program steps undertaken by the microprocessor in a REAL-TIME SET routine.

During each pass through step 244 in the PROGRAM mode 242, the CPU 100 calls the REAL-TIME CLOCK routine (FIG. 8) and the REAL-TIME SET routine (FIG. 10).

Figure 8:
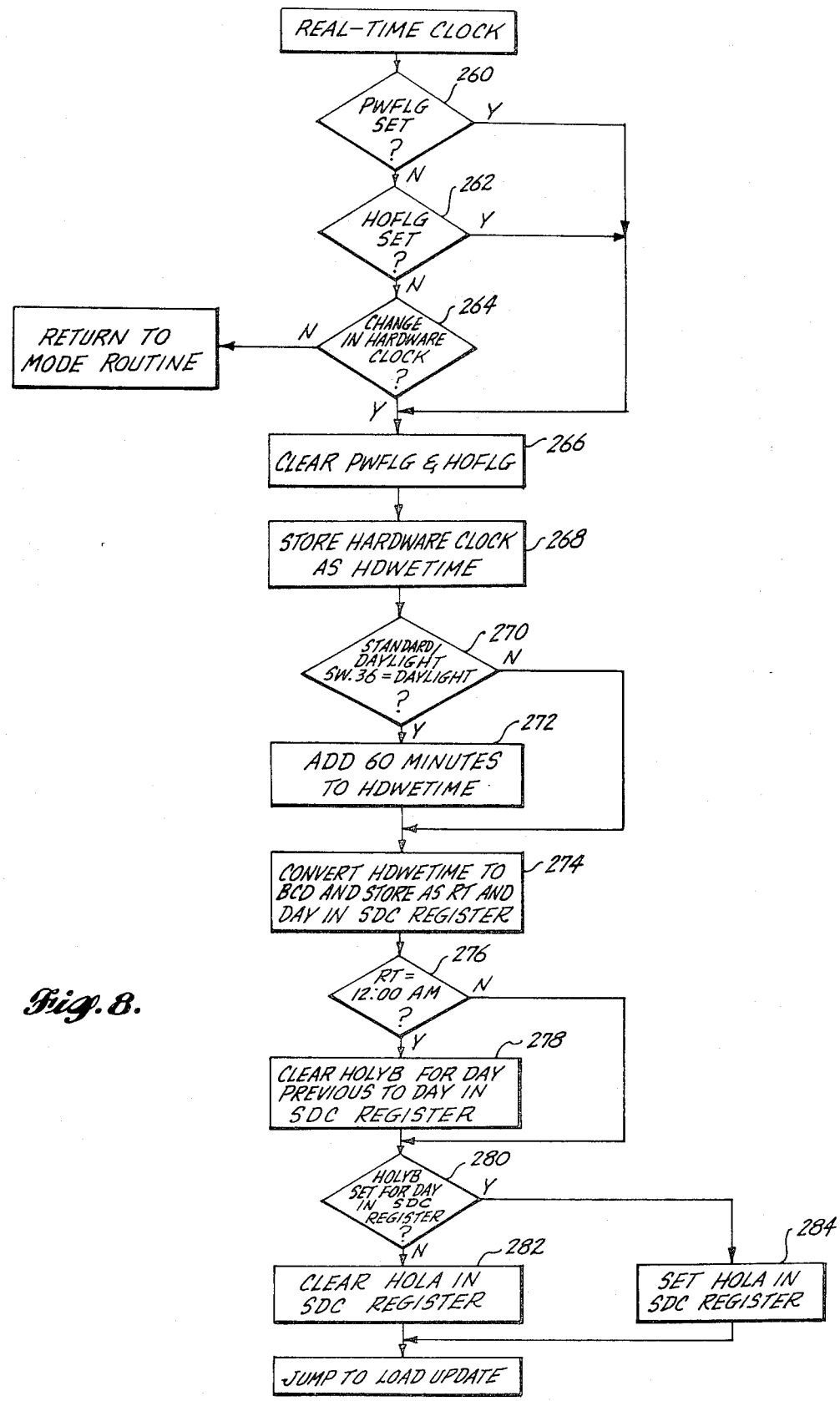
FIG. 8 is a flow chart of a program step undertaken by the microprocessor in a REAL-TIME CLOCK routine.
Figure 9:
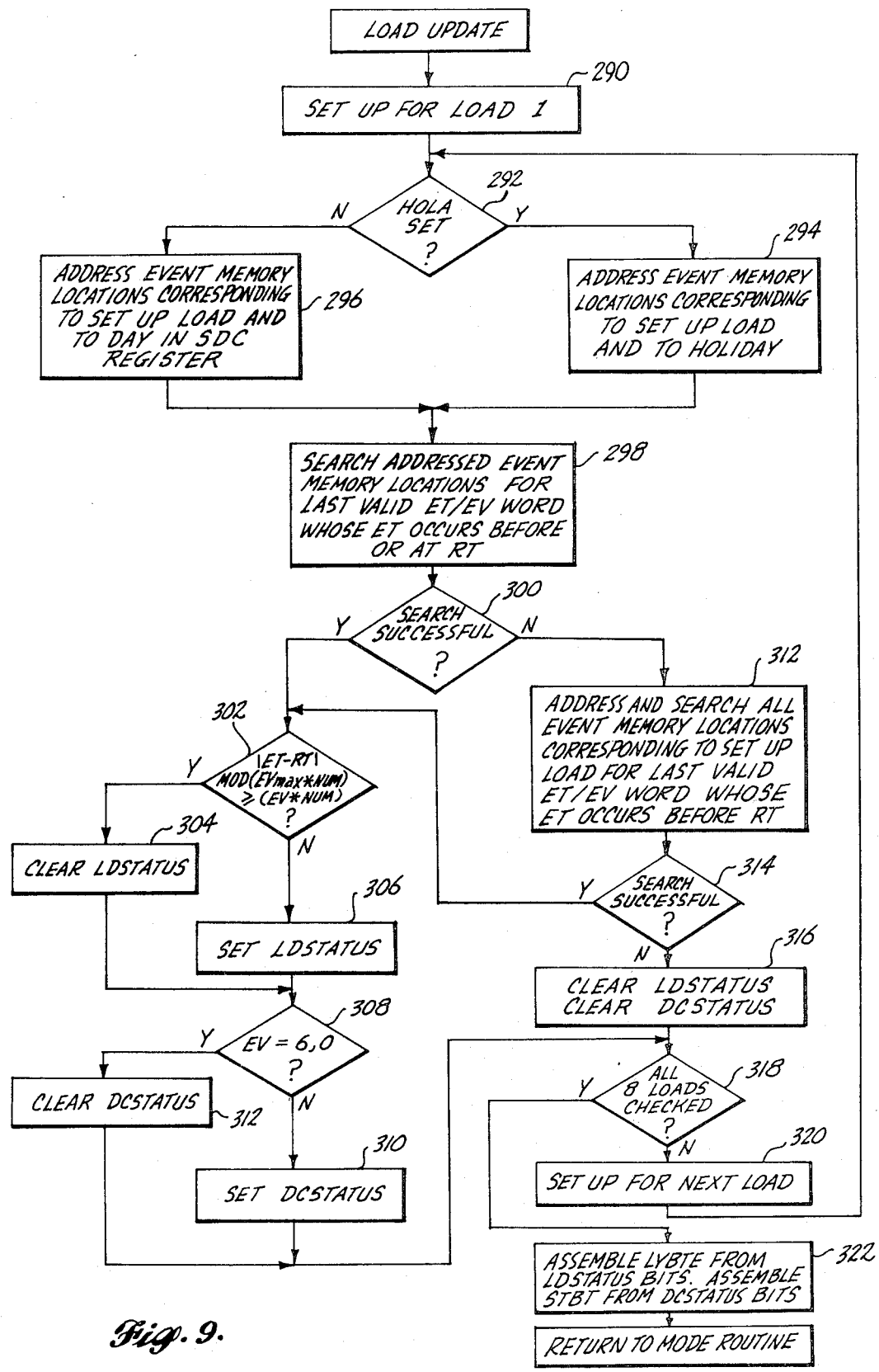
FIG. 9 is a flow chart of the program steps undertaken by the microprocessor in a LOAD UPDATE routine.

With reference now to FIG. 8, the REAL-TIME CLOCK routine permits the contents of the SDC register to be updated to correspond to the real-time information within the hardware clock. Also, the HOLA field within the SDC register is set, or cleared, depending upon whether the real-time day has been selected as a holiday. Further, by jumping to a LOAD UPDATE routine illustrated in FIG. 9, the desired status of each load is updated through comparison of the contents of the SDC register with the schedule contained in the event memory.

In the REAL-TIME CLOCK routine, CPU 100 proceeds to update the contents of the SDC register, but only upon the occurrence of any one of three conditions: a POWER UP condition or an event memory malfunction has occurred, e.g., PWFLG is set in step 202, see FIG. 7(a); the HOLIDAY key in keyboard 38 has been actuated when the microprocessor is in its run/verify mode of operation, e.g., the HOFLG operation flag has been set, as described hereinafter; or, the time within the hardware clock has changed since the previous pass of CPU 100 through the REAL-TIME CLOCK routine. CPU 100 accordingly determines if any of these conditions have been met in steps 260, 262 and 264. If none of the conditions have been met, CPU 100 returns to the mode routine. If any of the conditions have been met, CPU 100 proceeds, in step 266, to clear PWFLG and HOFLG. Thereafter, CPU 100, in step 268, stores the time within the hardware clock (which is a binary representation of the minutes that have transpired since the beginning of the week, as previously described) as the HDWETIME data byte in RAM 104. In step 270, CPU 100 determines if the STANDARD/DAYLIGHT switch 36 has been set to the DAYLIGHT position. If the determination in step 270 is affirmative, CPU 100 proceeds, in step 272, to add the binary representation of sixty minutes to HDWETIME, and then proceeds to step 274. If the determination in step 270 is negative, CPU 100 proceeds directly to step 274. At this point, it should be noted that the time within the hardware clock is always in standard time, and that the corresponding real-time information in the SDC register is advanced by sixty minutes from the time in the hardware clock only upon setting of the STANDARD/DAYLIGHT switch 36 to the DAYLIGHT position.

In step 274, HDWETIME (in binary minutes) is converted to corresponding day, am/pm, hour and minute information (in BCD form) and stored in the appropriate RT and DAY fields within the SDC register (FIG. 5).

In step 276, CPU 100 determines if the real-time information within the RT fields in the SDC register represents 12:00 am, i.e., a new day has begun. If the determination in step 276 is affirmative, CPU 100 proceeds, in step 278, to clear the HOLYB bit (in HOLY) for the day immediately previous to the day represented by the DAY field in the SDC register. HOLY includes a HOLYB bit for each day of the week, with the HOLYB bit being set as described hereinafter upon actuation of the HOLIDAY key in keyboard 38. By undertaking the actions in step 278, CPU 100 insures that the holiday schedule in the event memory will be followed only upon the first occurrence of the day selected as a holiday following actuation of the HOLIDAY key. From step 278, CPU 100 proceeds to step 280. Likewise, if the determination in step 276 is negative, CPU 100 proceeds directly to step 280.

In step 280, CPU 100 determines of the HOLYB bit (in HOLY) has beet set for the day represented by the DAY field in the SDC register. If the determination in step 280 is affirmative, the HOLA field in the SDC register is set in step 284. If the determination in step 280 is negative, the HOLA field in the SDC register is cleared in step 282. From either step 282 or step 284, CPU 100 jumps to the LOAD UPDATE routine illustrated in FIG. 9.

UPDATING OF LOAD OUTPUT STATUS UNDER REAL-TIME CONTROL

Within the LOAD UPDATE routine, the status of each load is updated through a comparison of the real-time information within the SDC register with the schedule for that load contained in the event memory. Initially, CPU 100, in step 290, is conditioned or set-up for load 1, i.e., is enabled to address those event memory locations corresponding to load 1 (FIG. 6). In step 292, CPU 100 determines if the HOLA field within the SDC register has been set (reference steps 282, 284 in the REAL-TIME CLOCK routine in FIG. 8). If the determination in step 292 is affirmative, e.g., the real-time day has been selected as a holiday, CPU 100 proceeds, in step 294, to address the event memory locations corresponding to the set-up load and to the holiday schedule therefore. If the determination in step 292 is negative, e.g., the real-time day is not a holiday, CPU 100 proceeds, in step 296, to address the event memory locations corresponding to the set-up load and to the day represented by the DAY field in the SDC register.

From either step 294 or step 296, CPU 100 proceeds, in step 298, to search the addressed event memory locations for the last valid ET/EV data word whose event time (ET) occurs before or at the real-time information in the RT fields within the SDC register. In step 300, CPU 100 determines if the search has been successful. If the determination in step 300 is affirmative, CPU 100, in step 302, proceeds to determine if a change in status of the set-up load is required. Specifically, CPU 100 applies the mathematical relationship:

$$|ET-RT|MOD(EV_{max}*NUM) \geq (EV*NUM)$$

where $|ET-RT|$ = the absolute difference, in minutes, between the event time and real-time;

NUM = the smallest number of minutes in any control interval for which a change in load status will be effected (in the embodiment being discussed, NUM=5);

$|ET-RT|MOD(EV_{max}*NUM)$ = the remainder after dividing $|ET-RT|$ by $(EV_{max}*NUM)$;

EV is an integer representing the control event (see Table III), ranging from $EV_{min}=0$ for an off control function to $EV_{max}$ for an on control function; and, $(EV_{max}*NUM)$ is the number of minutes in a control interval.

If the determination in step 302 is affirmative, the set-up load is to be off. If the determination in step 302 is negative, the set-up load is to be on.

To give an example, let it be assumed that real-time is 1:35 pm, the last event time was 8:40 am, and EV=3 (a duty-cycle control function).

Therefore:

```
|ET−RT| = 295
(EV_max *NUM) = (6 *5) = 30
(EV *NUM) = (3 *5) = 15
|ET−RT|MOD(EV_max *NUM)     = remainder after 295/30
                            = 25
```

Since 25 is greater than [(EV*NUM)=15], the determination in step 302 is affirmative.

Intuitively, it can be seen that the current control interval will have commenced at 1:10 pm. At 1:35 pm, twenty-five minutes have elapsed since the beginning of the control interval. Since the set-up load is being controlled in accordance with a duty-cycle control function in which the load is on only for the first fifteen minutes of each control interval, the load is to be off.

As another example, let it be assumed that EV=6, with the same real-time and event time as in the previous example.

Therefore:

```
|ET−RT| = 295
(EV_max *NUM) = 30
(EV *NUM) = (6 *5) = 30
|ET−RT|MOD(EV_max *NUM)     = remainder after 295/30
                            = 25
```

Since 25 is less than [(EV*NUM)=30], the determination in step 302 is negative. In fact, when EV=6, the remainder can never be greater than or equal to (EV*NUM), so that the set-up load is always on.

Likewise, when EV=0, the remainder is always greater than or equal to (EV*NUM), so that the set-up load is always off.

If the determination in step 302 is affirmative, CPU 100 proceeds, in step 304, to clear the LDSTATUS bit for the set-up load. If the determination in step 302 is negative, CPU 100 proceeds, in step 306, to set the LDSTATUS bit for the set-up load. One such LDSTATUS bit is provided for each load, and is set when the associated load is to be on and is cleared when the associated load is to be off.

From either step 304 or step 306, CPU 100 proceeds, in step 308, to determine if the control event that has been addressed represents either an on or an off control function i.e., does EV equal 6 or 0 (reference TABLE III). If the determination in step 308 is negative, e.g., the addressed event represents a duty-cycle control function, CPU 100 proceeds, in step 310, to set a DCSTATUS bit for the set-up load. If the determination in step 308 is affirmative, CPU 100 proceeds, in step 312, to clear the DCSTATUS bit for the set-up load. One such DCSTATUS bit is provided for each load, and is set when the control event represents a duty-cycle control function, and is cleared when the control event represents either an on or an off control function.

If the determination in step 300 is negative, i.e., there are no valid ET/EV data words for the set-up load for the selected day or holiday, CPU 100 proceeds, in step 312, to address and search all event memory locations corresponding to the set-up load for the last valid ET/EV data word whose event time ET occurs before the real-time represented by the RT field within the SDC register. In step 314, CPU 100 determines if the search in step 312 has been successful. If the determination in step 314 is affirmative, CPU 100 proceeds to determine the status of each load by proceeding through step 302 and the subsequent steps previously described.

Accordingly, if there are no control events in the event memory whose event times occur before or at real-time in any real-time day, the microprocessor will control the status of the set-up load in accordance with the last control event whose event time occurs in one of the days preceding the real-time day. If the determination in step 314 is negative, i.e., there are no control events entered in the event memory for the set-up load, CPU 100 proceeds, in step 316, to clear the LDSTATUS bit and the DCSTATUS bit for the set-up load.

From either steps 310, 312 or 316, CPU 100 proceeds, in step 318 to determine if all loads have been updated. If the determination in step 318 is negative, CPU 100 proceeds, in step 320, to set-up for the next load, e.g., the next load number, and then returns to step 292 to repeat the load status updating as previously described. After all loads have been updated, the determination in step 318 is affirmative, whereupon CPU 100 proceeds, in step 322, to assemble and store the LBYTE data byte from the LDSTATUS bits determined during the pass through the LOAD UPDATE routine, and to assemble and store the STBT data byte from the DCSTATUS bits determined during the pass through the LOAD UPDATE routine.

As an example, let it be assumed that loads 1, 3, 4, 7 are to be on, and that loads 2, 4, 7 and 8 are being controlled with a duty-cycle control function.

Therefore:

```
         ┌──── load number ────┐
           8  7  6  5  4  3  2  1
LBYTE =    0  1  0  0  1  1  0  1
STBT  =    1  1  0  0  1  0  1  0
```

At this point, it should be noted that the actual energization states of the load relays are not changed until the microprocessor enters either its run/verify mode or its run mode, as hereinafter described. When CPU 100 enters the PROGRAM mode 242 upon the occurrence of an event memory malfunction (i.e., MEMFLG is set), all loads are turned off (reference the clearing of the output terminals in port 110A in steps 230 or 234, FIG. 7(b)). In all other cases where CPU 100 enters the PROGRAM mode 242, the loads are maintained on or off in accordance with the then-existing energization states of the load relays. Change of the energization states of the load relays can be effected only in the OUTPUT & STAGE routine (FIG. 20) which is described hereinafter. From step 322, CPU 100 returns to the mode routine.

SETTING OF REAL-TIME IN CLOCK

While still in step 244 in the PROGRAM mode 242, CPU 100 will call the REAL-TIME SET routine illustrated in FIG. 10. The user will have been instructed to select a desired time by advancing the time displayed in display 28, LEDs 30, 32 and LEDs 40 through actuation of the DAY, HOUR, and MINUTE keys in the keyboard 38, and then to actuate the SET TIME switch 34. Initially, a determination is made, in step 330, as to whether the SET TIME switch 34 has been actuated. If the determination in step 330 is negative, CPU 100 returns to the mode routine. If the determination in step 330 is affirmative, e.g., the user wishes to change the time within the hardware clock, CPU 100 proceeds to effect such an adjustment only if CPU 100 is in the PROGRAM mode 242 and if the user has not caused the HOL LED 40 to be lit. Accordingly, a determination is made in step 332 as to whether PROFL has been set and a determination is made in step 334 as to whether the HOLI field in the DPLR register has been set. If the determination in step 332 is negative or if the determination in step 334 is affirmative, CPU 100 proceeds, in step 336, to set TFAULT to a count representing 0.1 second, and sets the FAULT LED 44 until the count in TFAULT is decremented to zero, thereby signifying to the user that the desired time adjustment cannot be made. From step 336, CPU 100 returns to the mode routine.

If the determination in step 332 is affirmative and the determination in step 334 is negative, however, CPU 100 proceeds, in step 338, to convert the information in the TIME and DAY fields in the DPLR register to binary minutes, and to store the same in an internal register within CPU 100. From step 338, CPU 100 proceeds, in step 340, to determine if the STANDARD/DAYLIGHT switch 36 has been set to the DAYLIGHT position. If the determination in step 340 is affirmative, CPU 100 proceeds, in step 342, to subtract the binary representation of sixty minutes from the time stored in its internal register (since the time in the hardware clock is always in standard time). From step 342, or, if the determination in step 340 is negative, CPU 100 proceeds, in step 344, to increment the time information within the hardware clock (by resetting counter 124 and by supplying a high frequency signal to counter 128 through gate 126, as previously described with reference to FIG. 2). Thereafter, CPU 100, in step 346, compares the time information within the hardware clock (which is in binary minutes) with the time in its internal register, and continues looping through step 344 and step 346 until the determination in step 346 is affirmative.

Since the time information in the hardware clock has been changed, CPU 100 jumps to the REAL-TIME CLOCK routine from step 346, whereupon the contents of the SDC register are updated, and then proceeds through the LOAD UPDATE routine, whereupon the status of the loads is updated, as previously described. From the LOAD UPDATE routine, CPU 100, returns to the mode routine (e.g., calls the KEYBOARD routine in step 244.)

MAIN PROGRAM LOOP—RUN/VERIFY MODE

Let it be assumed that the user has completed entry of the schedule into the microprocessor, and desires the microprocessor to assume control of the loads in accordance with the thus-entered schedule. Accordingly, the user will place the mode switch 26 to either its RUN or its RUN/VERIFY positions. Let it also be assumed that no event memory malfunction or program timing error has transpired.

As a result, CPU 100, upon exiting from the PROGRAM mode 242, FIG. 7(b), passes through steps 203, 204, 206, 210, 211A, 211C, 211D, 212 and 218 to step 220, FIG. 7(a). Since PROFL was set when the microprocessor entered its program mode, the determination in step 220 is affirmative, whereupon CPU 100 proceeds to step 222. Since the mode switch 26 has been moved from its PROGRAM position, the determination in step 222 is negative, whereupon CPU 100, in step 224, clears PROFL and extinguishes the PROGRAM LED 27. From step 224, CPU 100 proceeds, through step 228, to step 236, in which a determination is made as to whether the mode switch 26 has been set to the RUN position. Let it be assumed that the user has selected the RUN/VERIFY position of mode switch 26, in which case the determination in step 236 is negative, so that CPU 100 proceeds to the RUN/VERIFY mode 240.

At this point, it should be noted that the microprocessor will also enter its run or run/verify modes of operation upon the determination of a POWER UP condition, provided that no event memory malfunction has occurred. For example, CPU 100 will proceed through steps 200, 202, 203, 204, 206, 210, 211A, 211C, 211D, 212, 218, 220, 224 and 228 to step 236. In this case, it should be remembered that PRFLG was set in step 202 and has not yet been cleared. Likewise, if the microprocessor proceeds to either the run or run/verify modes from the program mode, it should be remembered that PRFLG was set in steps 202, 226 or 234 and has not yet been cleared.

While in the RUN/VERIFY mode 240, CPU 100 clears the LEDs 42 and successively calls: the REAL-TIME CLOCK routine (and the LOAD UPDATE routine) to permit updating of the contents of the SDC register and to permit updating of load status, as previously described; an XFER routine; the KEYBOARD routine (and its associated subroutines); and, the OUTPUT & STAGE routine.

DISPLAY OF REAL-TIME INFORMATION

Figure 11:
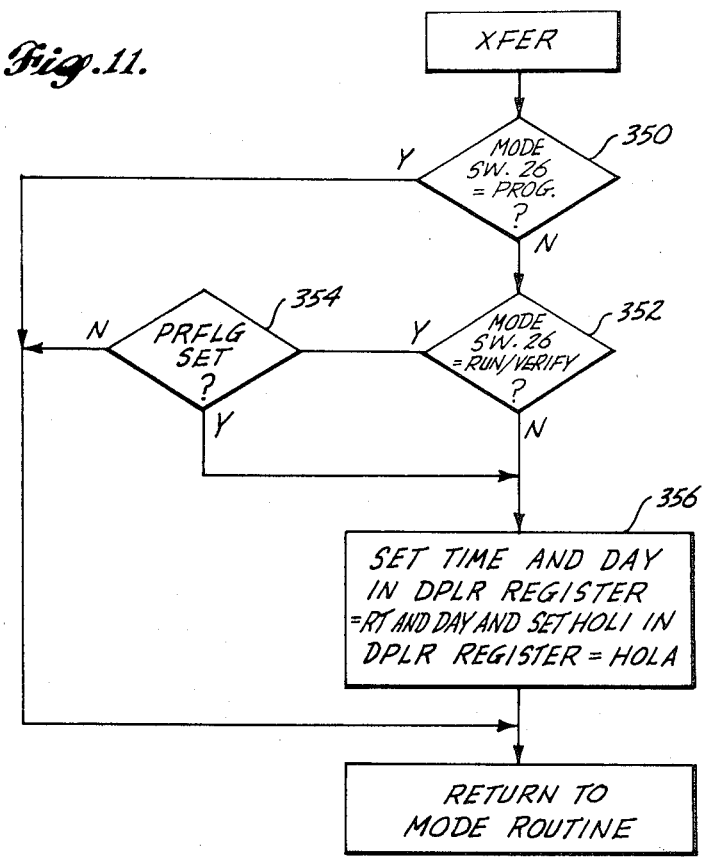
FIG. 11 is a flow chart of the program steps undertaken by the microprocessor in a XFER routine.

Referring now to the XFER routine illustrated in FIG. 11, CPU 100 initially determines, in step 350, if the mode switch 26 has been set to its PROGRAM position. If the determination in step 350 is affirmative, CPU 100 returns to the mode routine. If the determination in step 350 is negative, CPU 100 proceeds, in step 352, to determine if the mode switch 26 has been set to its RUN/VERIFY position. In the circumstance being discussed, the determination in step 352 is affirmative, whereupon CPU 100 proceeds, in step 354, to determine if PRFLG has been set. If the determination in step 354 is negative, CPU 100 returns to the mode routine. However, if the determination in step 352 is negative, or if the determination in step 354 is affirmative, CPU 100 proceeds, in step 356, to transfer the contents of the RT, LOAD and DAY fields within the SDC register to the LOAD, TIME and DAY fields in the DPLR register, and to set the HOLI field in the DPLR register equal to the HOLA field in the SDC register. Since the LOAD field in the SDC register contains invalid data, the LOAD character display in display 28 will be blanked. However, the remaining character displays in display 28, LEDs 30, 32 and LEDs 40 will display real-time information.

Now, PRFLG is cleared during the subsequent OUTPUT & STAGE routine. Therefore, CPU 100 proceeds to step 356, wherein real-time information is displayed to the user, only if the mode switch is in its RUN position, or upon the first pass of CPU 100 through the RUN/VERIFY mode 240 following a POWER UP condition or following the placing of the mode switch 26 from its PROGRAM position to its RUN/VERIFY position. From step 356, CPU 100 returns to the mode routine.

SELECTION OF HOLIDAY

While in the RUN/VERIFY mode 240, CPU 100 next calls the KEYBOARD routine. By reference to Table II, only the HOLIDAY, TIME, SCAN, MINUTE, HOUR, DAY, and LOAD keys in keyboard 38 are active during the RUN/VERIFY mode 240.

Upon actuation of either the MINUTE, HOUR, DAY or LOAD keys, the user may cause any desired time, day or load to be displayed as previously described.

Upon actuation of the HOLIDAY key, CPU 100 proceeds to the HOLIDAY key function subroutine illustrated in FIG. 18. The user will have been instructed to actuate the HOLIDAY key after advancing the day that is being displayed to the day selected as a holiday (through actuation of the DAY key). In step 460, CPU 100 sets the HOFLG operation flag, and sets the HOLYB bit (in HOLY) corresponding to the day represented by the DAY field in the DPLR register, and then returns to the mode routine.

When HOFLG has been set, CPU 100, upon its next pass through the REAL-TIME CLOCK routine (FIG. 8), updates the contents of the SDC register, irrespective of whether PWFLG has been set or whether there has been a change in the time within the hardware clock. As CPU 100 proceeds through the REAL-TIME CLOCK routine, it will be noted that the HOLYB bit for the day previous to that represented by the DAY field in the SDC register will be cleared to accordingly deflag that day as a holiday, and that the HOLA field in the SDC register will either be set or cleared, depending upon whether the HOLYB bit has been set for the day represented by the DAY field in the SDC register (reference steps 278, 280, 282 and 284). Accordingly, by causing CPU 100 to pass through the entire REAL-TIME CLOCK routine after the HOLIDAY key has been actuated, i.e., HOFLG has been set, load control may be immediately shifted to a holiday schedule (in the subsequent LOAD UPDATE routine) if the day in real-time has been selected as a holiday.

DISPLAY OF TIME SCHEDULE

The user may wish to obtain a readout of the schedule for a given load and for any day of the week or for the holiday. Accordingly, when CPU 100 is in the PROGRAM mode 242 or the RUN/VERIFY mode 240, actuation of the SCAN key causes CPU 100 to enter into the SCAN key function subroutine illustrated in FIG. 15. Initially, CPU 100, in step 410, determines if PROFL is set, i.e., if the microprocessor is in its program mode of operation. If the determination in step 410 is affirmative, CPU 100 proceeds, in step 412, to address and search the event memory locations corresponding to the day and load represented by the LOAD and DAY or HOLI fields in the DPLR register. When the microprocessor is in its run/verify mode of operation, the determination in step 410 will be negative, so that CPU 100 proceeds, in step 414, to determine if the HOLYB bit has been set for the day represented by the DAY field in the DPLR register. At this point, it should be noted that when the microprocessor is in its run/-verify mode of operation, the HOLI field will not be set if the day in real-time is not a holiday. Accordingly, if the determination in step 414 is affirmative, CPU 100, in step 416, addresses and searches the holiday event memory locations corresponding to the load represented by the LOAD field in the DPLR register. If the determination in step 414 is negative, CPU 100 proceeds in step 412 to address and search the event memory locations corresponding to the load and day represented by the LOAD and DAY fields in the DPLR register.

After addressing and searching of the desired event memory locations in steps 412 or 416, CPU 100 proceeds, in step 418, to determine if the addressed event memory locations contain any valid ET/EV data words. If the determination in step 418 is negative, CPU 100 returns to the mode routine. If the determination in step 418 is affirmative, CPU 100 proceeds, in step 420, to find the first valid ET/EV data word in the addressed event memory locations whose event time ET occurs after the time represented by the TIME fields in the DPLR register. Accordingly, the user may instruct the microprocessor to display information relating to the first valid control event that occurs after any desired time.

From step 420, CPU 100 proceeds, in step 422, to convert the event time ET to BCD form, and to store the thus-converted event time in the TIME fields in the DPLR register, whereupon the event time is displayed to the user. Thereafter, in step 424, CPU 100 lights the LED 42 corresponding to the control event (EV) of the selected ET/EV data word.

CPU 100 then proceeds, in step 426, to determine if the SCAN key is still being actuated. For example, the user may wish to obtain a display of more than one control event during the selected day. If the determination in step 426 is negative, i.e., the user has released the SCAN key, CPU 100 returns to the mode routine. If the determination in step 426 is affirmative, however, CPU 100 proceeds, in step 428, to set the TSCAN timer to a count representing two seconds, and waits until the count within TSCAN has decremented to zero. Thereafter, in step 430, CPU 100 proceeds to find and display the next control event (by undertaking steps similar to steps 420, 422 and 424). In step 432, CPU 100 determines if the control event displayed in step 430 is the last event of the day represented by the DAY field in the DPLR register, i.e., the control event having the last event time. If the determination in step 432 is negative, CPU 100 returns to step 426. If the determination in step 432 is affirmative, CPU 100, in step 434, sets TSCAN to two seconds and waits until TSCAN equals zero. CPU 100 then proceeds, in step 436, to find and display the first event of the day represented by the DAY field in the DPLR register, e.g., the control event having the earliest event time. From step 436, CPU 100 returns to step 426. As can be appreciated, CPU 100 will continue to progress through the loops defined by steps 426-436 until the user releases the SCAN key, at which time CPU 100 returns to the mode routine. To obtain a readout of the schedule for yet another load, the user will select the desired load and day, by actuation of the LOAD and DAY keys, and thereafter actuate the SCAN key.

ALTERNATE DISPLAY OF REAL-TIME INFORMATION

While CPU 100 is in either the PROGRAM mode 242 or the RUN/VERIFY mode 240, the user may wish to obtain a display of real-time information. Accordingly, actuation of the TIME key causes CPU 100 to enter into the TIME key function subroutine illustrated in FIG. 19. Specifically, CPU 100, in step 470, transfers the contents of the RT and DAY fields within the SDC register to the TIME and DAY fields in the DPLR register, whereupon real-time information is displayed to the user. From step 470, CPU 100 returns to the mode routine.

REAL-TIME CONTROL OF LOADS

Figure 20:
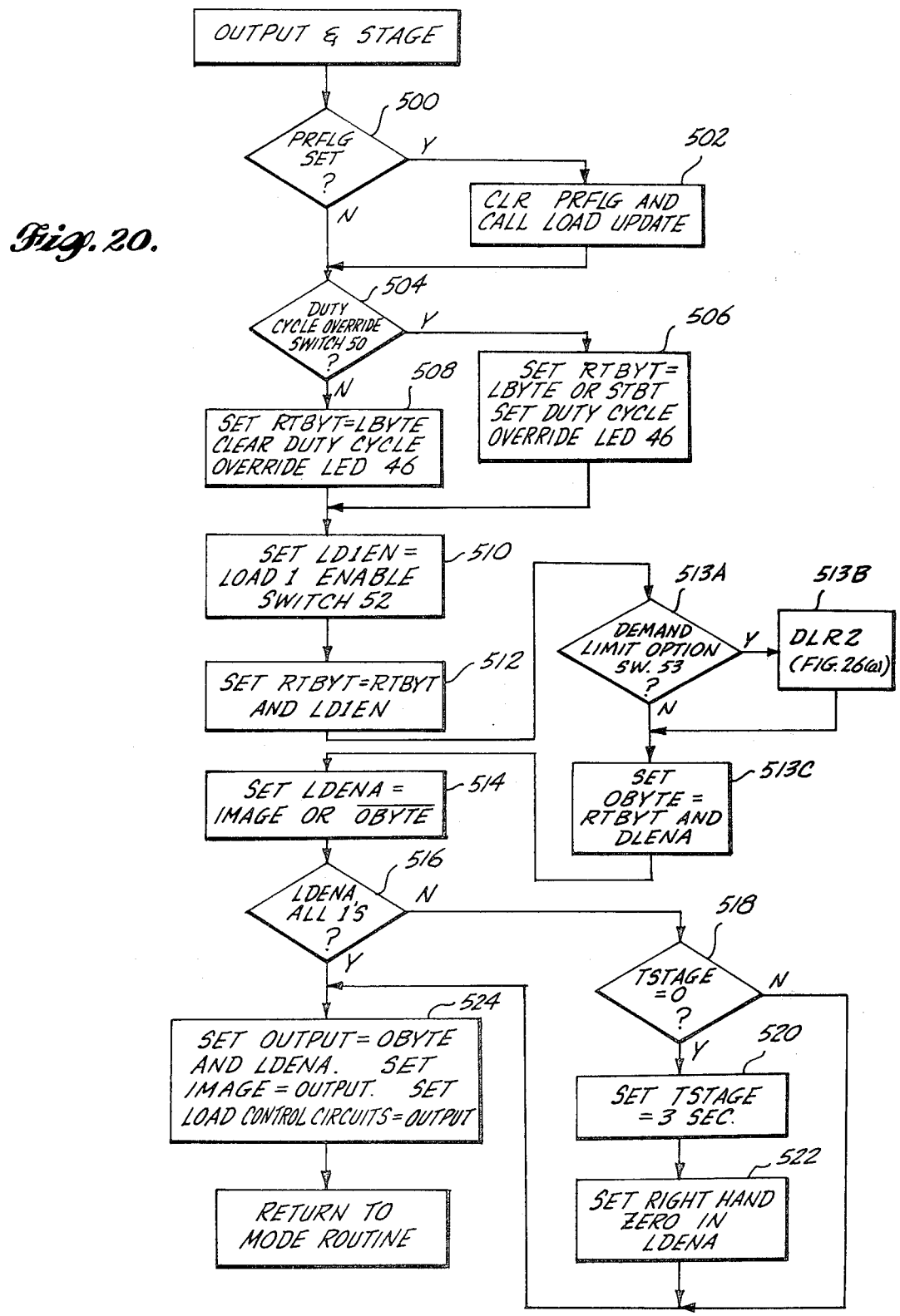
FIG. 20 is a flow chart of the program steps undertaken by the microprocessor in an OUTPUT & STAGE routine.

While still in step 252 within the RUN/VERIFY mode 240, CPU 100 next calls the OUTPUT & STAGE routine illustrated in FIG. 20. Initially, CPU 100, in step 500, determines if PRFLG has been set, i.e., a POWER UP condition has occurred, or an event memory malfunction has occurred, or the microprocessor has just exited from its program mode of operation. If the determination in step 500 is affirmative, CPU 100, in step 502, clears PRFLG and calls the LOAD UPDATE routine (FIG. 9) to accordingly update the status of all loads. From either step 500 or step 502, CPU 100 proceeds, in step 504, to determine if the duty-cycle override switch 50 has been set, i.e., the set of external contacts represented by the duty-cycle override switch 50 have been closed to accordingly signify to the microprocessor that all loads which are currently being controlled with a duty-cycle control function are to be turned on. If the determination in step 504 is affirmative, CPU 100 proceeds, in step 506, to set RTBYT=LBYTE OR STBT, and, sets the DUTY-CYCLE OVERRIDE LED 46. If the determination in step 504 is negative, CPU 100 proceeds, in step 508, to set RTBYT=LBYTE, and to clear the DUTY-CYCLE OVERRIDE LED 46.

From either step 506 or 508, CPU 100, in step 510, sets LD1EN to correspond to the position of the load 1 enable switch 52. Specifically, LD1EN=1 when the load 1 enable switch 52 is closed (e.g., the control of load 1 by the microprocessor is to be enabled), and LD1EN=0 when the load 1 enable switch 52 is opened.

In step 512, CPU 100 sets RTBYT=RTBYT AND LD1EN. From step 512, CPU 100 proceeds, in step 513A, to determine if the demand limit option switch 53 has been actuated. If the determination in step 513A is affirmative, CPU 100 proceeds, in step 513B, to the DLR2 routine described in more detail hereinafter with reference to FIG. 25. Under the assumption that demand limit control is not to be implemented, however, the determination in step 513A is negative. From either step 513A or step 513B, CPU 100 proceeds, in step 513C, to set OBYTE=RTBYT AND DLENA. As previously discussed, the DLENA data byte comprises the demand limit control output and all bits therein are set when demand limit control is not to be implemented (in step 211C, FIG. 7(a)). In this situation, OBYTE=RTBYT, or, the output representing real-time control. From step 513C, CPU 100 proceeds, in step 514, to set LDENA=IMAGE OR OBYTE, where the successive data bits of IMAGE represent the existing energization states of the load relays. CPU 100 then proceeds, in step 516, to determine if the successive data bits of LDENA are all ones, i.e., set. As will be apparent from the ensuing discussion, the determination in step 516 is negative if any load which has been previously off is to be turned on. If the determination in step 516 is negative, CPU 100 proceeds to stage or sequence the turning on of one or more loads previously off by proceeding, in step 518, to determine if the TSTAGE timer contains a count of zero. Upon the first pass through the OUTPUT & STAGE routine, the determination in step 518 will be affirmative, so that CPU 100 proceeds, in step 520, to set TSTAGE to a count representing three seconds. From step 520, CPU 100 proceeds, in step 522, to set the right hand "0" bit in LDENA to "1". As will be apparent from the ensuing discussion, the action undertaken in step 522 allows a single load that has been previously off to be turned on.

If the determination in step 516 is affirmative, or if the determination in step 518 is negative, or from step 522, CPU 100 proceeds, in step 524, to set OUTPUT=OBYTE AND LDENA, to set IMAGE=OUTPUT and to control the energization states of the load control circuits 145 in accordance with OUTPUT. From step 524, CPU 100 returns to the mode routine.

The operation of the OUTPUT & STAGE routine can best be understood by considering the logical operations that take place when (a) a plurality of loads are turned on after all loads have been previously turned off; (b) the duty-cycle override switch 50 is closed during the time that some of the loads are currently being controlled in accordance with a duty-cycle control function; and (c) the load 1 enable switch 52 is opened during the time that load 1 is turned on, as set forth hereinafter in Tables IV, V and VI, respectively.

TABLE IV

Example (a):
(1) all loads previously turned off
(2) loads 1, 3, 4, 7 to be turned on
(3) duty-cycle override switch 50 opened
(4) load 1 enable switch 52 closed
(5) demand limit option switch 53 opened
  IMAGE  = 00000000
  LBYTE  = 01001101
  RTBYT  = LBYTE
         = 01001101
  LDIEN  = 1
  RTBYT  = RTBYT AND LDIEN TABLE IV-continued

= 01001101
  DLENA  = 11111111
  OBYTE  = RTBYT AND DLENA
         = 01001101

$\overline{\text{OBYTE}}$ = 10110010

LDENA  = IMAGE OR $\overline{\text{OBYTE}}$
         = 10110010
Since LDENA not all 1's,
set TSTAGE = 3 seconds
set LDENA = 10110011
  OUTPUT  = OBYTE AND LDENA
          = 00000001
Since LDENA not all 1's, and when TSTAGE = 0,
set TSTAGE = 3 seconds,
set LDENA = 10110111
  OUTPUT  = OBYTE AND LDENA
          = 00000101
Since LDENA not all 1's, and when TSTAGE = 0,
set TSTAGE = 3 seconds,
set LDENA = 10111111
  OUTPUT  = OBYTE AND LDENA
          = 00001101
Since LDENA not all 1's, and when TSTAGE = 0,
set TSTAGE = 3 seconds,
set LDENA = 11111111
  OUTPUT  = OBYTE AND LDENA
          = 01001101

TABLE V

Example (b):
(1) loads 1, 3, 4, 7 previously turned on
(2) no change in real-time control output
(3) loads 2, 4, 7, 8 are being controlled with a duty-cycle control function
(4) duty-cycle override switch 50 closed
(5) load 1 enable switch 52 closed
(6) demand limit option switch 53 opened
  IMAGE  = 01001101
  LBYTE  = 01001101
  STBT   = 11001010
  RTBYT  = LBYTE OR STBT
         = 11001111
  LDIEN  = 1
  RTBYT  = RTBYT AND LDIEN
         = 11001111
  DLENA  = 11111111
  OBYTE  = RTBYT AND DLENA
         = 11001111

$\overline{\text{OBYTE}}$ = 00110000

LDENA  = IMAGE OR $\overline{\text{OBYTE}}$
         = 01111101
Since LDENA not all 1's,
set TSTAGE = 3 seconds,
set LDENA = 01111111
  OUTPUT  = OBYTE AND LDENA
          = 01001111
Since LDENA not all 1's, and when TSTAGE = 0,
set TSTAGE = 3 seconds,
set LDENA = 11111111
  OUTPUT  = OBYTE AND LDENA
          = 11001111

TABLE VI

Example (c):
(1) loads 1, 3, 4 7 previously turned on
(2) no change in real-time control output
(3) duty-cycle override switch 50 opened
(4) load 1 enable switch 52 opened
(5) demand limit option switch 53 opened
  IMAGE  = 01001101
  LBYTE  = 01001101
  RTBYT  = 01001101

TABLE VI-continued

```
            LDIEN = 0
            RTBYT = RTBYT AND LDIEN
                  = 01001100
            DLENA = 11111111
            OBYTE = RTBYT AND DLENA
                  = 01001100

OBYTE = 10110011
            LDENA = IMAGE OR OBYTE
                  = 11111111
Since LDENA all 1's,
           OUTPUT = OBYTE AND LDENA
                  = 01001100
```

Therefore, when all loads have previously been turned off, as in Example (a), the OUTPUT & STAGE routine energizes the load control circuits 145 for loads 1, 3, 4 and 7 at three-second intervals, to prevent a potential large inrush of power at the facility that would occur if all loads were to be turned on at the same time. When the duty-cycle override switch 50 is closed, all loads that are currently being controlled with a duty-cycle control function and that are currently off, e.g., loads 2 and 8 in Example (b), are turned on at three-second intervals. As illustrated in Example (c), opening of the load 1 enable switch 52 results in de-energization of the load control circuit 145 for load 1, irrespective of the desired status for load 1 determined in accordance with the schedule for real-time control.

MAIN PROGRAM LOOP-RUN MODE

From step 524, CPU 100 returns to the mode routine. From the RUN/VERIFY mode 240, CPU 100, returns to step 203. For as long as the mode switch 26 is set to the RUN/VERIFY position CPU 100 will continue to loop back to and through the RUN/VERIFY mode 240. If the user should place the mode switch 26 to its RUN position, the determination in step 236 will be affirmative, so that CPU 100 proceeds to the RUN mode 238, wherein the LEDs 42 are cleared. Thereafter, CPU 100 calls the REAL-TIME CLOCK, XFER and OUTPUT & STAGE routines, and proceeds through those routines identically as previously described. No provision is made, however, in the RUN mode 238 for CPU 100 to call the KEYBOARD routine, so that the keyboard 38 is disabled.

MICROPROCESSOR—TIMING

Figure 21:
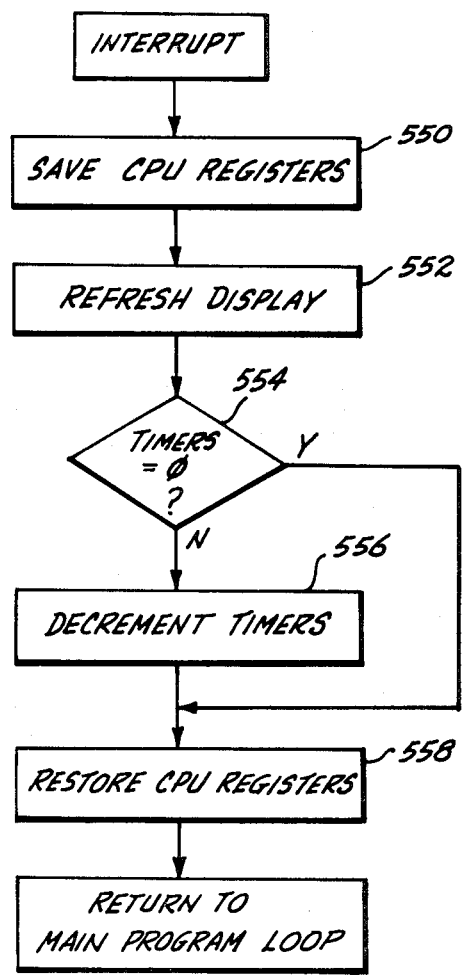
FIG. 21 is a flow chart of the program steps undertaken by the microprocessor in an INTERRUPT subroutine.

With reference now to FIG. 21, the third clock signal from the hardware clock, appearing on the RST 7.5 input of CPU 100, causes CPU 100 to enter the INTERRUPT routine once every cycle of the third clock signal (e.g., at a rate of 256 Hz). In step 550, the contents of various internal registers within CPU 100 are maintained, by transferring the contents thereof to the stack register previously described. Thereafter, CPU 100, in step 552, refreshes the displays 28 and 142 by transferring the contents of a selected register (such as the DPLR register) to ports 108 and 110B. In step 554, CPU 100 determines if any of the timers in RAM 104 contain a count of zero. If the determination in step 554 is negative for any timer, CPU 100 proceeds, in step 556, to decrement that timer by an amount related to the period of the signal from the hardware clock, and then proceeds to step 558. If the determination in step 554 is affirmative for any of the timers within RAM 104, i.e., the timer has a count of zero, CPU 100 proceeds directly to step 558. In step 558, CPU 100 restores its internal registers (by transferring the contents of the stack register thereto) and then returns to the main program loop to continue processing therein.

MICROPROCESSOR—ADDITIONAL COMPONENTS FOR DEMAND LIMIT CONTROL

The additional components of the apparatus required for demand limit control are illustrated in FIG. 22. As previously described, these additional components, and their interconnections, may be located on a printed circuit card that is adapted to be inserted into housing 20 and to be interconnected with the microprocessor therein through an appropriate connector.

The apparatus in FIG. 22 include a latch 160, a PROM 162, and a port 164. The low address/data bus, comprising leads AD0-AD7, is connected to corresponding terminals of latch 160, PROM 162 and port 164. The lead ALE is connected to a corresponding terminal of latch 160, and a plurality of leads A0'-A7' interconnect corresponding output terminals of latch 160 with corresponding terminals of PROM 162. Leads A0-A1, from latch 112 (FIG. 2), are connected to corresponding terminals of port 164, and leads A8-A10, from CPU 100, are connected to corresponding terminals of PROM 162. Leads RES, RD1, WR1, from CPU 100, are also connected to corresponding terminals of port 164, and lead RD1 is connected to a corresponding terminal of PROM 162. Leads OPROM and PT4, from decoder 118 (FIG. 2), are connected, respectively, to corresponding terminals of PROM 162 and port 164.

PROM 162 comprises an additional program memory containing a set of program instructions for various routines and subroutines particularly used for demand limit control which are described hereinafter with reference to FIGS. 24(a), 24(b), and 26(a)-31. The scratch pad memory in RAM 104 (FIG. 2) is also used for demand limit control, and is additionally organized as described hereinafter with reference to FIG. 23. Finally, port 164 functions as an input/output port.

Within each routine or subroutine for demand limit control, the set of program instructions in PROM 162 are addressed and executed by CPU 100 in a predetermined sequence, established by a program counter within CPU 100. For each program instruction so addressed, CPU 100 undertakes an instruction cycle, with each instruction cycle including a plurality of machine cycles. The machine cycles permit CPU 100 to retrieve an instruction from PROM 162 and to execute the instruction by the addressing and transmission of data to and from CPU 100, RAM 104, port 164, and ports 106, 108 and 110A, 110B (FIG. 2). Within each instruction cycle, addresses or data are transmitted on leads AD0-AD7. When an address is being transmitted by CPU 100 on leads AD0-AD7, a signal is provided on lead ALE therefrom which causes latch 160 to store therein the address, and to present the address thus stored on leads A0'-A7'. At all other times, leads AD0-AD7 are used for the transmission of data. The address on leads A0'-A7', together with further address information on leads A8-A10, is used to signify a memory location within PROM 162. As previously discussed, the address on leads A0-A7 (FIG. 2) is used to signify a memory location within the chips in RAM 104. The address on leads A0-A1, plus address information on leads AD0-AD7, is used to signify that port 164, as well as ports 106 and 108 (FIG. 2) should connect one of its input or output terminals, to be described hereinafter, with leads AD0–AD7 for the transmission or reception of data. As previously described, address information on leads AD0–AD7 is used to signify that ports 110A, 110B (FIG. 2) should connect one or more of their output terminals to the leads AD0–AD7 for the reception of data.

In order to signify whether PROM 162 or port 164 is to be interconnected with leads AD0–AD7 for the transmission or reception of data, chip select signals are provided by decoder 118 on leads OPROM or PT4 to respectively enable PROM 162 or port 164. Upon provision of a signal on lead RD1, the data in an addressed memory location within PROM 162, or that represented by signals on any addressed input terminal in port 164, is placed on leads AD0–AD7. Upon the provision of a signal on lead WR1, any data on leads AD0–AD7 is supplied to an addressed and enabled output terminal in port 164. Various buffers within port 164 that are used for temporary storage of data being received from or transmitted to one of the input or output terminals thereof are reset or cleared upon the provision of a signal on lead RES from CPU 100.

In order to implement demand limit control, CPU 100 must be provided with information relating to: the actual rate of power consumption at the facility; the desired rate of power consumption, or set point; which loads of the facility have been selected for demand limit control; and, the size of a deadband around the set point within which no change in output status of the loads selected for demand limit control will be made. In addition, it is desired: that information be provided that permits demand limit control to be inhibited in response to a command from an external device or at predetermined times established by the predetermined time schedule within the event memory; to display, using display 28, information relating to the actual rate of power consumption and the set point; and, to permit analog/digital conversion of signals related to actual rate of power consumption and set point for use by the microprocessor. All of this information exchange is carried out through port 164, as follows.

A plurality of demand limit select switches 166, one for each load, are connected to corresponding input terminals of port 164. When each of the demand limit select switches 166 is closed or opened, its corresponding load is respectively selected or de-selected for demand limit control. Preferably, demand limit select switches 166 are of the miniture "dip" type and are accessible to the user. Another input terminal of port 164 is connected through a jumper JP1 to ground potential. In order that the demand limit control may be used over a wide range of rates of power consumption, all computations are carried out in proportional form and specifically in percentages, where 100% is substantially equal to the maximum rate of power consumption at the facility with all controlled loads turned on. The deadband utilized in demand limit control is accordingly stated as a percentage of the set point. When jumper JP1 is installed, the microprocessor is informed that the deadband percentage is 20%. When jumper JP1 is not installed, the microprocessor is informed that the deadband percentage is 10%. An inhibit switch 168 is connected to yet another input terminal of port 164. Inhibit switch 168 may comprise a pair of relay contacts from an external device, or may comprise the contacts of the load relay in one of the load control circuits 145 (FIG. 2). When inhibit switch 168 is closed or opened, demand limit control is respectively inhibited or enabled.

Other input terminals of port 164 are connected to the outputs of an input comparator 170 and a set point comparator 172. Supplied to the noninverting input of input comparator 170 is an input signal whose voltage has a predetermined relationship to the actual rate of power consumption. As described hereinafter, the voltage of the input signal is scaled to have a maximum value, e.g., 5.1 volts, when the actual rate of power consumption is at a maximum, e.g., 100%. Supplied to the noninverting input of set point comparator 172 is a set point signal whose voltage has a predetermined relationship to the desired set point. The set point signal is obtained from a set point voltage source 174, and is manually adjustable by the user over a range of 40–100%, with the voltage of the set point signal having a maximum value, e.g., 5.1 volts, when the desired set point is at a maximum, e.g., 100%.

As explained hereinafter, first and second data bytes, respectively termed INBYT and SPBYT, are stored in RAM 104 and represent, respectively digital counts related to the magnitude of the input signal and the set point signal. INBYT and SPBYT each comprise an 8-bit data byte. As can be seen from the graph on the right hand portion of FIG. 22, a minimum count represented by INBYT or SPBYT, or, 0, represents a signal level of 20%, and a maximum count, or 255, represents a signal level of 105%. In order to convert the digital count represented by either INBYT or SPBYT into a corresponding analog signal, a group of output terminals of port 164 (eight in number) are connected through a plurality of inverters 176 to corresponding input terminals of a resistive ladder network 178. One side of the resistive ladder network 178 is connected to ground potential, and the other side is connected to the inverting inputs of input comparator 170 and set point comparator 172. A first biasing resistor R10 connects a source of supply potential $V_S$ to the inverting inputs of comparators 170, 172, and a second biasing resistor R11 connects those inverting inputs to ground potential. The values of the resistors within ladder network 178, the values of resistors R10 and R11, and the magnitude of supply potential $V_S$ are chosen so that the analog signal supplied to the inverting inputs of comparators 170, 172 has a voltage that is related to the count represented by either INBYT and SPBYT, as that count appears on the corresponding output terminals of port 164. As indicated by the graph in the right hand portion of FIG. 22, the voltage of the analog signal presented to the inverting inputs of comparators 170, 172 has a minimum value, e.g., 1.02 volts, when either INBYT or SPBYT represent a count of 0, or, a signal level of 20%, and have a maximum value, e.g., 5.35 volts, when either INBYT or SPBYT represent a count of 255, or, a signal level of 105%. The output from comparator 170 or comparator 172 is accordingly either at a positive logic level or a negative logic level, depending on whether the voltage of the input signal or the set point signal are above or below the voltage of the analog signal representing either INBYT or SPBYT. As described hereinafter, the logic level of the output of comparator 170 and of comparator 172 is used by a subroutine within PROM 162 to set the count within INBYT or SPBYT to that which will produce an analog signal whose voltage level is substantially equal to that of the input signal or the set point signal. Accordingly, analog/digital conversion of the input and set point signals can be accomplished.

In order to develop the input signal, a power sensor 180 provides an output to an interface circuit 182. The power sensor 180 may be a watt transducer adapted to provide an output voltage whose level is related to the actual rate of power consumption, such as that marketed by the assignee of the present invention as model 341 XXX; a current transducer adapted to provide an output current whose level is proportional to single-phase current, such as that marketed by the assignee of the present invention as model 342; or, a current transformer adapted to provide an output current whose level is proportional to single-phase current, such as that marketed by the assignee of the present invention as model 331. In all cases, the power sensor 180 is connected to the power lines going to the facility, so that the output signal therefrom is related to the total rate of power consumption by all loads at the facility which are to be controlled. Interface circuit 182 functions to convert the various types of outputs provided by the various types of power sensors 180 into an analog voltage which is proportional to the actual rate of power consumption. By appropriate choice of the power sensor 180 and its interconnections with the power lines, and by appropriate design of interface circuit 182, the analog voltage from interface circuit 182 has a predetermined maximum level when all loads at the facility are turned on, e.g., an actual rate of power consumption of 100%, and is otherwise proportional to the actual rate of power consumption.

The analog voltage from interface circuit 182 is coupled through a first stationary contact and a movable contact of a switch 184 to the input of an amplifier 186 on whose output appears the input signal coupled to the noninverting input of input comparator 170. Normally, amplifier 186 has a fixed gain that may be doubled by the user if desired. In normal operation, the voltage of the input signal appearing on the output of amplifier 186 has a maximum level of 5.1 volts when the analog voltage from interface circuit 182 has a predetermined maximum level. In certain situations, the maximum level of the analog voltage from interface circuit 182 may be significally below this predetermined maximum level, due to the particular type and rating of the power sensor 180 being used. In such a situation, the user may increase the gain of amplifier 186 so as to provide more acceptable control. For test and set up purposes, a test voltage source 188 provides an output voltage having a predetermined level to the other stationary contact of switch 184. By moving the movable contact of switch 184 so as to connect the output voltage from the test voltage source 188 to the input of amplifier 186, a predetermined input signal may be provided to input comparator 170 for testing and set up purposes.

Finally, a display switch 190 has its movable contact connected to ground potential, a first stationary contact, labeled IN, connected to an input terminal of port 164, and a second stationary contact, labeled SP, connected to another input terminal of port 164. Display switch 190 is of the momentary type. When display switch 190 is actuated to its SP position, the set point, in percentage, is displayed by display 28. When display switch of 190 is actuated to its IN position, the input signal level, in percentage, is displayed by display 28.

PROM 162, port 164 and ladder network 178 (as well as the remaining components in FIG. 22) may comprise commercially-available integrated circuit chips, of which the following are representative:

TABLE VII

| Component | Designation |
|---|---|
| PROM 162 | Intel 2716 16K (2Kx8) UV Erasable PROM |
| Port 164 | Intel 8255 Programmable Peripheral Interface |
| Ladder Network 178 | Allen-Bradley 316L08 R2R Resistive. Network |

MICROPROCESSOR—ADDITIONAL SCRATCH PAD MEMORY FOR DEMAND LIMIT CONTROL

Figure 23:
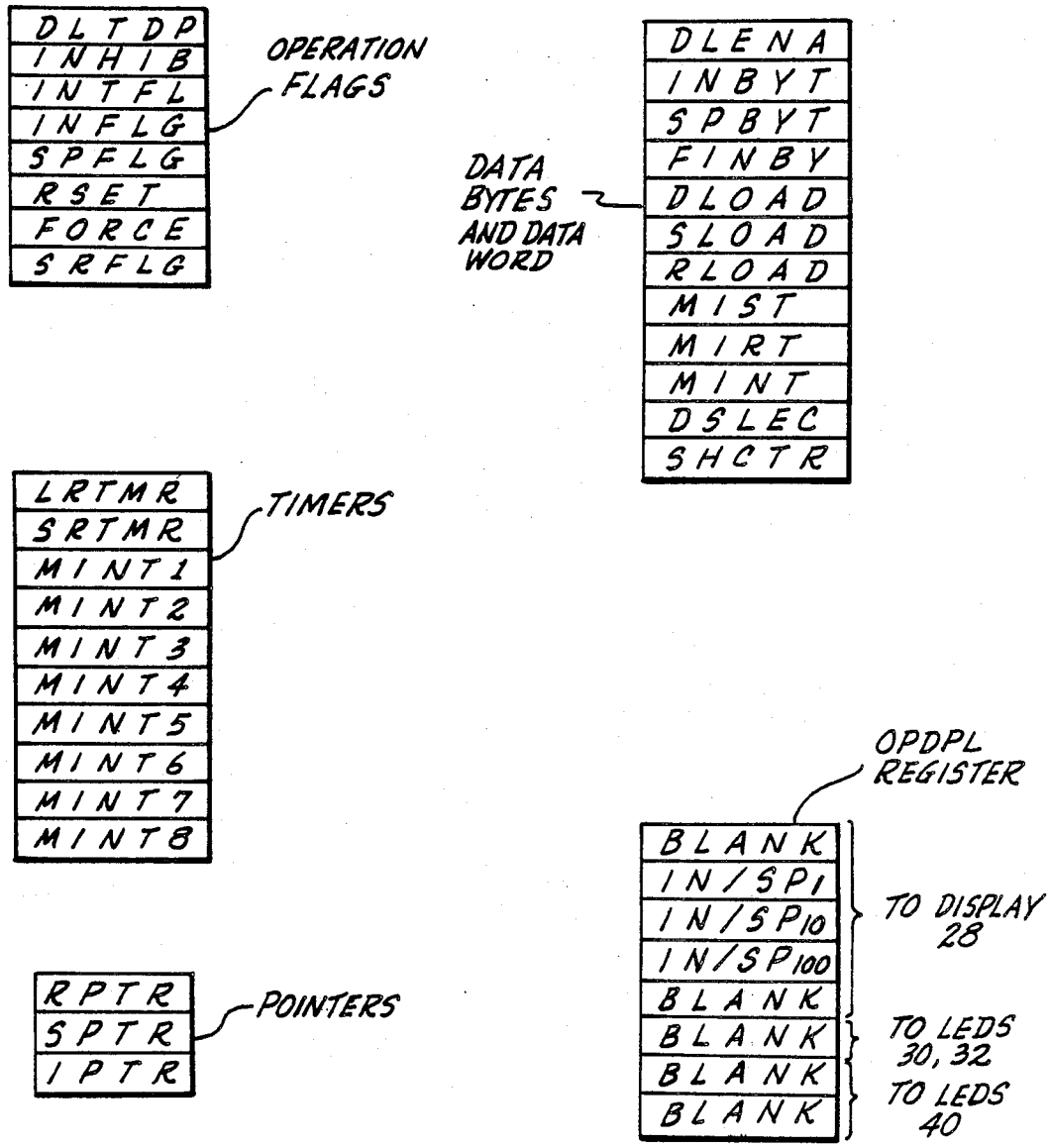
FIG. 23 is a schematic representation of additional operation flags, timers, pointers, data bytes and data word, and a register contained within the scratch pad memory within the microprocessor and required for the implementation of demand limit control.

With reference now to FIG. 23, the program instructions within PROM 162 are adapted to further organize the scratch pad memory within RAM 104 (FIG. 2) into a plurality of operation flags, a plurality of timers, a plurality of pointers, a plurality of data bytes and a data word, and an OPDPL (option display) register, with each operation flag, timer, pointer, data byte and data word, and each field within the OPDPL register having a unique memory location within RAM 104. In FIG. 23, each of the operation flags (excepting the SRFLG operation flag) comprises a single data bit which is set or cleared by CPU 100 upon execution of certain program instructions in the routines and subroutines to be described hereinafter. The SRFLG operation flag comprises a tri-state flag having a cleared state, a SHD state, and a RSTOR state. Each of the timers comprises a data byte which is set to a predetermined count as described hereinafter, and decremented in response to signals from the hardware clock during the INTERRUPT subroutine, in order to provide timing for various operations utilized in the routines and subroutines. Specifically, the LRTMR timer comprises a load rotate timer; the SRTMR comprises a shed/restore timer; and the MINT1-MINT8 timers comprise minimum interval timers, one for each load to be controlled.

Each pointer comprises an 8-bit data byte, with each bit therein associated with one of the controlled loads. Only one bit in each of the pointers is set at any given point in time, with the remaining bits being cleared, whereby the set bit points to one of the controlled loads. The DLENA, DLOAD, SLOAD, RLOAD, MIST, MIRT, MINT and DSLEC data bytes each comprise an 8-bit data byte, with each bit therein being associated with one of the controlled loads.

As an example, the relationship between the load number x of each controlled load and its associated bit Bx in each pointer and data byte is as follows:

```
┌─────────────── Load number x ───────────────┐
  8    7    6    5    4    3    2    1
  B8   B7   B6   B5   B4   B3   B2   B1
└─────────────── corresponding bit Bx ────────┘
```

The remaining data bytes in FIG. 23 comprise 8-bit data bytes and a 16-bit data word (FINBY) whose format and use will be described hereinafter.

The OPDPL register is organized in a manner similar to the DPLR register and accordingly has a plurality of fields. The first, and fifth through eighth fields of the OPDPL register, which correspond to the LOAD, and $H_{10}$, AM/PM, DAY, and HOLI fields in the DPLR register, always contain blank data. The second, third and fourth fields of the OPDPL register, respectively denominated IN/SP$_1$, IN/SP$_{10}$, and IN/SP$_{100}$ represent the units, tens and hundreds digits of either the input signal percentage or the set point signal percentage. As described hereinafter in conjunction with FIG. 25, the REFRESH DISPLAY subroutine causes CPU 100 to transfer the contents of either ther DPLR register or the OPDPL register to the display 28, to LEDs 30, 32 and to LEDs 40 during the INTERRUPT subroutine.

MAIN PROGRAM LOOP UNDER DEMAND LIMIT CONTROL

With reference now back to the main program loop in FIG. 7(a), let it be assumed that either a power up condition has occurred or that an event memory malfunction has occurred, and that CPU 100, in step 208, has proceeded to set the INTFL operation flag. Let it also be assumed that demand limit control is to be implemented, and that the demand limit option switch 53 accordingly has been actuated. As a result, CPU 100 proceeds from step 208 through step 211A to step 211B, and then to the DLR1 routine illustrated in FIGS. 24(a) and 24(b).

DEMAND LIMIT CONTROL INHIBITING, INITIALIZATION, A/D CONVERSION AND DISPLAY

Within the DLR1 routine, CPU 100: determines if demand limit control is to be inhibited; initializes certain of the operation flags, timers, pointers and data bytes in FIG. 23, if needed; provides analog/digital conversion of the input signal and of the set point signal; and, enables a user-selected display of the input signal or set point signal percentage.

Specifically, CPU 100, in step 600 determines if the INHIB switch 168 has been actuated. If the determination in step 600 is affirmative, CPU 100 proceeds, in step 602, to set the INHIB operation flag. If the determination in step 600 is negative, CPU 100 proceeds, in step 604, to clear the INHIB operation flag. As described hereinafter in conjunction with the DLR2 routine in which demand limit control is actually implemented, the state of the INHIB operation flag is used to either enable or disable demand limit control. From either step 602 or step 604, CPU 100 proceeds, in step 606, to determine if the INTFL operation flag has been set. As previously described, the INTFL operation flag will be set upon a POWER UP condition or in the case of an event memory malfunction. As is described hereinafter, the INTFL operation flag will also be set upon detection of an error in one of the pointers. If the determination in step 606 is affirmative, CPU 100 proceeds, in step 608, to initialize the demand limiter. Specifically, the LRTMR timer is set to a count representing twenty-five minutes; the INTFL, SRFLG, INFLG, SPFLG, and FORCE operation flags are cleared; all bits in the RLOAD, MIST, MINT, MIRT, and DSLEC data bytes are cleared; the RSET operation flag is set; all bits in the DLENA and SLOAD data bytes are set; and, the bits (B8) in SPTR, RPTR, and IPTR corresponding to load number 8 are set, and all the remaining bits therein are cleared.

From either step 608 or from step 606 (if the determination therein is negative), CPU 100 proceeds, in step 610, to effect analog/digital conversion of the input signal. Within step 610, CPU 100 causes the count within INBYT to be converted to analog form through port 164, inverters 176, and ladder network 178. Thereafter, CPU 100 utilizes a successive-bit approximation subroutine (not illustrated) to vary the count within INBYT and monitors logic level changes of the output of comparator 170 through port 164. Upon completion of the successive-bit approximation subroutine, the count within INBYT is representative of the level of the input signal.

From step 610, CPU 100 proceeds, in step 612, to compute the FINBY data word. In step 612, CPU 100 effectively filters out short-term variations in INBYT by averaging INBYT over a predetermined time interval (e.g., sixteen seconds). As discussed hereinafter, the FINBY data word is used only for display of the input signal level, and filtering is effected so as to keep the display of the input signal level from rapidly changing due to short term variations in the actual rate of power consumption. However, demand limit control is effected using the INBYT data byte which does reflect such short-term variations.

From step 612, CPU 100 proceeds, in step 614, to accomplish analog/digital conversion of the set point signal in a manner similar to that accomplished for the input signal in step 610 (note that CPU 100 places the contents of the SPBYT data byte on the output terminals of port 164, and monitors the logic level of the output from comparator 172).

At this point, it should be noted that CPU 100 will undertake the actions noted irrespective of whether the microprocessor is in its program run/verify, or run mode of operation. It is desirable, however, that the user be able to obtain a display of the input signal level or the set point signal level only if the microprocessor is in its program mode of operation. Therefore, CPU 100 proceeds from step 614 to step 616 and determines if the PROFL operation flag has been set. As previously described in conjunction with FIG. 7(a), the PROFL operation flag is set when the user has actuated the program enable switch 48 and, within a period of five seconds thereafter, has set the mode switch 26 to its PROGRAM position. If the determination in step 616 is affirmative, CPU 100 proceeds, in step 618, to determine if the mode switch 26 is still at its PROGRAM position. As can be appreciated, the passage of CPU 100 through the main program loop illustrated in FIGS. 7(a) and 7(b) may result in CPU 100 reaching step 618 before the PROFL operation flag has been cleared (in step 224). Accordingly, if the determination in either step 616 or 618 is negative, CPU 100 proceeds, in step 620, to clear the INFLG, SPFLG and DLTDP operation flags, and then returns to step 211D in FIG. 7(a). INFLG is set when input signal information is to be displayed, and is cleared at all other times; SPFLG is set when set point signal information is to be displayed, and is cleared at all other times; and DLTDP is set when either input signal information or set point signal information is to be displayed, and is cleared at all other times. As described hereinafter in conjunction with FIG. 25, the contents of the DPLR register are transferred to display 28 (and to the other displays) at all times except when DLTDP has been set, in which case the contents of the OPDPL register are transferred to display 28 (and the other displays). Accordingly, if CPU 100 exits from the DLR1 routine through step 620, the subsequent determination in step 211D is negative, whereupon CPU 100 proceeds to step 212 and thereafter as previously described, with the display 28 being dedicated to display of information relating to real-time control.

If the determinations in steps 616 and 618 are affirmative, however, CPU 100 proceeds, in step 622, to determine if the display switch 190 has been actuated to its IN position. If the determination in step 622 is affirmative, CPU 100 proceeds, in step 624, to clear the SPFLG operation flag and to set the INFLG operation flag. From step 624, CPU 100 proceeds, in step 626, to convert the contents of the FINBY data word into a corresponding percentage, and to store the corresponding percentage in the second, third and fourth fields of the OPDPL register (e.g., the IN/SP$_1$, IN/SP$_{10}$, and IN/SP$_{100}$ fields representing units, tens and hundreds).

If the determination in step 622 is negative, however, CPU 100 proceeds, in step 628, to determine if the display switch 190 has been set to its SP position. If the determination in step 628 is affirmative, CPU 100 proceeds, in steps 630 and 632, to clear the INFLG operation flag, to set the SPFLG operation flag, and to format the SPBYT data byte, in a manner similar to that accomplished for the FINBY data word in steps 624 and 626. As a result of the actions of CPU 100 in step 632, the OPDPL register contains a percentage corresponding to SPBYT.

If the determination in step 628 is negative, CPU 100 proceeds, in step 634, to determine if the INFLG operation flag has been set. If the determination in step 634 is negative, CPU 100 proceeds, in step 636, to determine if the SPFLG operation flag has been set. If the determination in step 634 or in step 636 is affirmative, CPU 100 proceeds, respectively, to steps 624 and 630 to accordingly enable the display of input signal information or set point signal information, as previously described. It will be appreciated that the actions undertaken by CPU 100 in steps 634 and 636 permit a momentary actuation of display switch 190 to either the IN or SP positions to be latched, whereupon the desired display of either input signal information or set point signal information is enabled after the user has released the display switch 190 and until the user has again actuated the display switch 190.

From either step 626 or step 632, CPU 100 proceeds, in step 638, to set the DLTDP operation flag and then returns to step 211D in FIG. 7(a). If the determinations in steps 634 and 636 are negative, CPU 100 proceeds to step 620, wherein the INFLG, SPFLG and DLTDP operation flags are cleared, and then returns to step 211D.

If either input signal information or set point signal information is to be displayed, the DLTDP operation flag has been set, whereupon the determination in step 211D is positive. CPU 100 thereafter jumps to step 203 and continues to loop through steps 203, 204, 206, 208 or 210, 211A, 211B and 211D until the DLTDP operation flag has been cleared. While in this loop operation, the DLTDP operation flag can be cleared only if the user returns the microprocessor to either its run/verify or run mode of operation, e.g., the user moves the mode switch 26 to its RUN/VERIFY or RUN position and the determination in step 618 (FIG. 24(b)) is negative. Therefore, if the user has elected to display either input signal information or set point signal information while the microprocessor is in its program mode, the user cannot, without first causing the microprocessor to leave the program mode, obtain a display of any other information and also cannot alter the predetermined time schedule in the event memory since CPU 100 cannot proceed to its PROGRAM mode 242 (FIG. 7(b)) and to the KEYBOARD routine therein.

It will be remembered that CPU 100, during its passage through the INTERRUPT routine, refreshes the displays 28 and 142 in step 552. With reference now to FIG. 25, the REFRESH DISPLAY subroutine (step 552) includes an initial step 640 in which CPU 100 selects the DPLR register for display. From step 640, CPU 100 proceeds, in step 642, to determine if the DLTDP operation flag has been set. If the determination in step 642 is affirmative, CPU 100 proceeds, in step 644, to select the OPDPL register for display. From step 644, or from step 642 if the determination therein is negative, CPU 100 proceeds, in step 646, to transfer data from the selected register to the displays 28 and 142. Assuming that the DLTDP operation flag has not been set, CPU 100 accordingly transfers the contents of the TIME, DAY and HOLI fields in the DPLR register to ports 108 and 110B. However, if the DLTDP operation flag has been set, CPU 100 instead transfers the contents of the fields within the OPDPL register to ports 108 and 110B, whereupon either input signal information or set point signal information is displayed by display 28 and the remainder of the displays are blanked. From step 646, CPU 100 proceeds to step 554 (FIG. 21) and thereafter as previously described.

COORDINATION OF DEMAND LIMIT CONTROL WITH REAL-TIME CONTROL

With reference now to FIG. 20, let it be assumed that the demand limit option switch 53 has been actuated and that the determination in step 513A is accordingly affirmative. As a result, CPU 100 proceeds, in step 513B, to the DLR2 routine illustrated in FIGS. 26(a) and 26(b). Initially, CPU 100, in step 650, calls the UPDATE DEMAND LIMIT STATUS subroutine illustrated in FIG. 27.

Figure 26B:
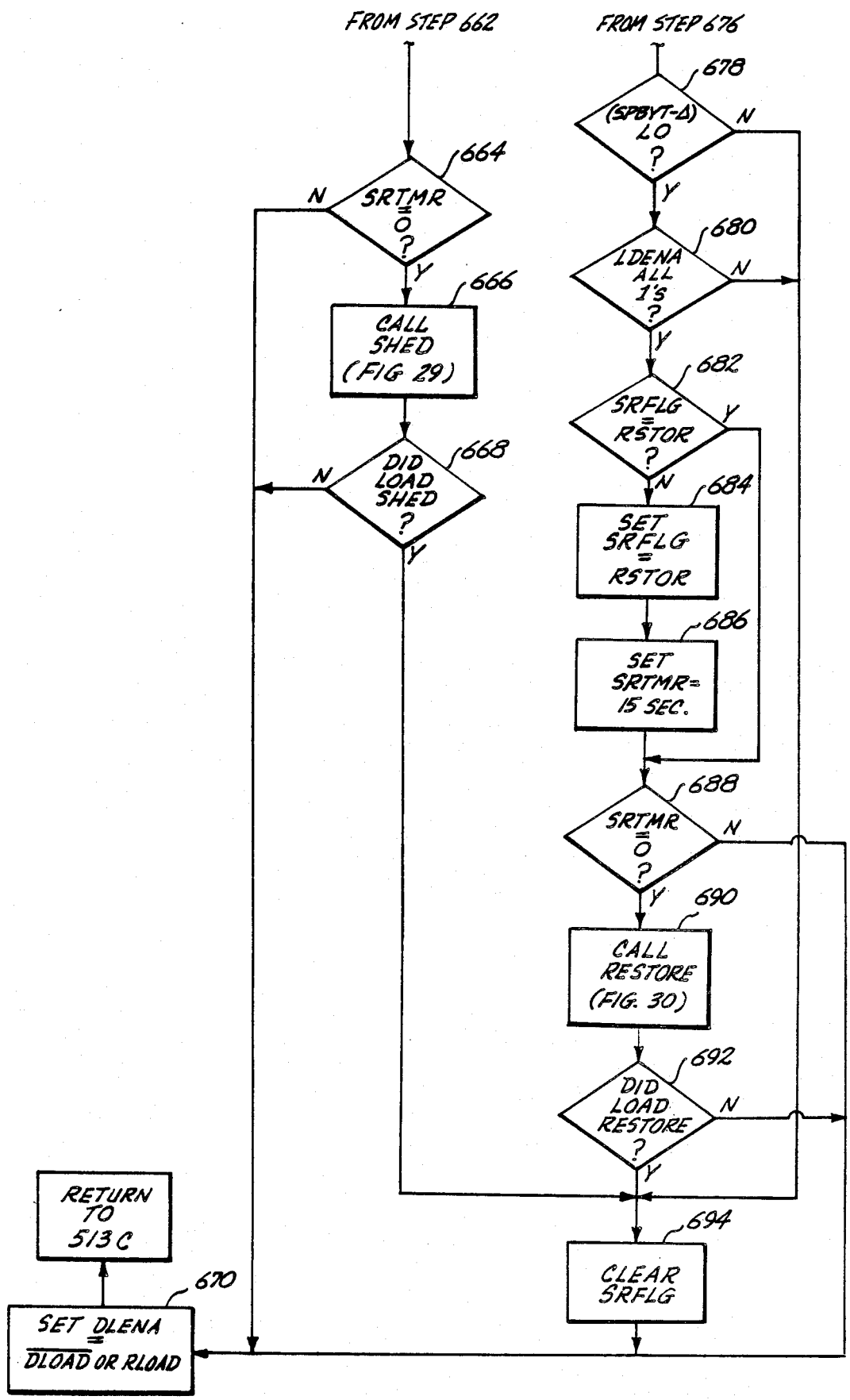
Figure 27:
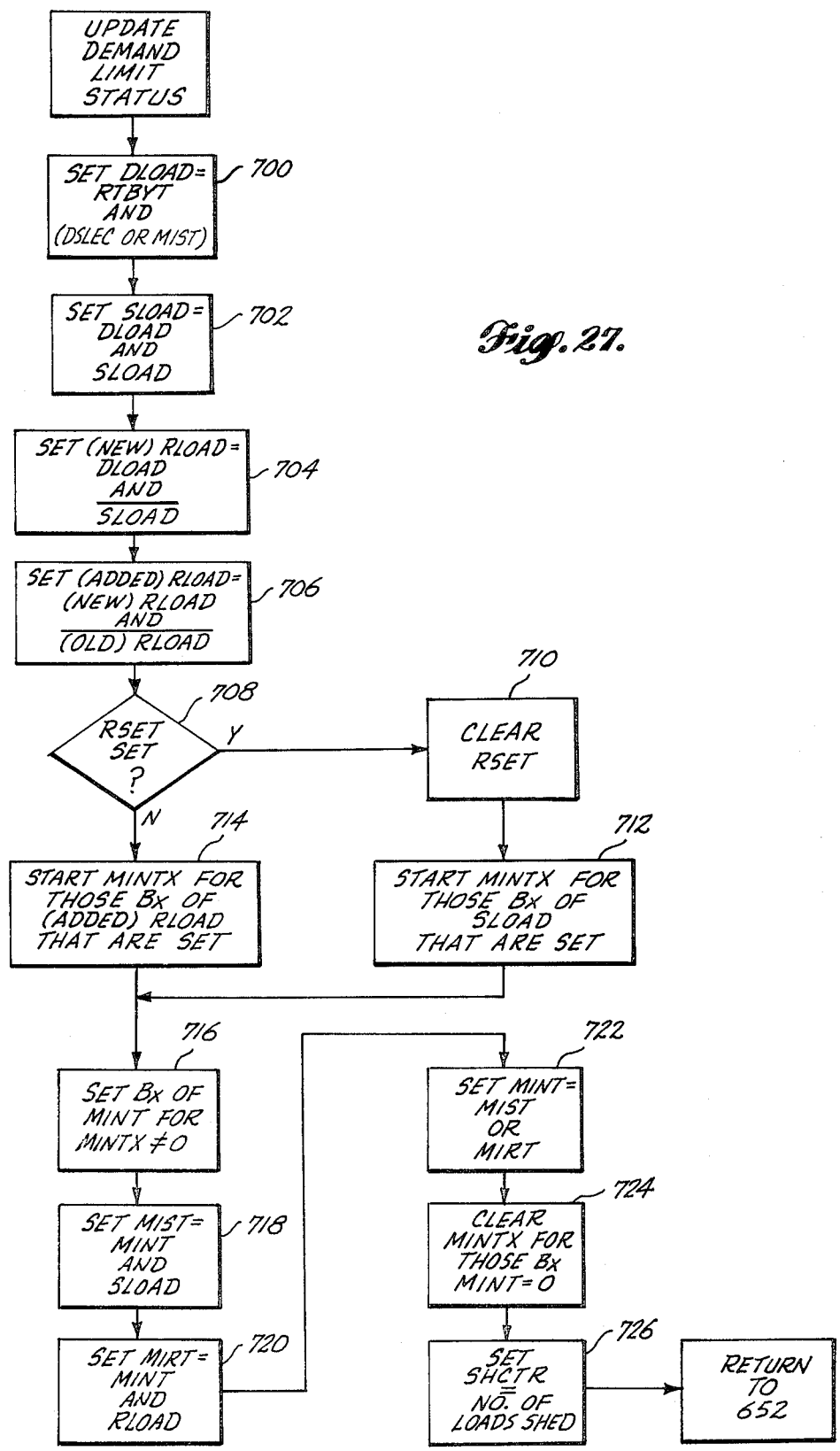
FIG. 27 is a flow chart of the program steps undertaken by the microprocessor in an UPDATE DEMAND LIMIT STATUS subroutine.

The actions undertaken by CPU 100 in the UPDATE DEMAND LIMIT STATUS routine, and also in step 670 (FIG. 26(b)) and in step 513C (FIG. 20), determine the desired energization state or output status of each load in accordance with: an output status commanded by real-time control; an output status commanded by demand limit control; and, a predetermined set of logic conditions relating thereto. To understand this set of logic conditions, reference should be made to the output status logic map of FIG. 32. When a given load is to be energized or de-energized in real-time in accordance with the predetermined time schedule, the load is stated to be either ON or OFF. When a given load is to be energized or de-energized in accordance with demand limit control, the load is stated to be either RESTORED or SHED. The user may also SELECT or DE-SELECT a given load for demand limit control by appropriate actuation or deactuation of the corresponding demand select switch 166 (FIG. 22). As illustrated in FIG. 32, a load that is OFF will have an OFF output status, irrespective of the position of its associated demand select switch or the output status desired under demand limit control. In other words, the demand limit control is unable to change the output status of those loads which are de-energized in real-time. When a load is ON, and its associated demand select switch is in its DE-SELECT position, the load has an ON output status, irrespective of the output status desired under demand limit control. When the load is ON, and its associated demand select switch is in its SELECT position, the load is in either a RESTORED or a SHED output status corresponding to that desired under demand limit control.

The set of logic conditions relating to load control also imposes certain restrictions upon changes or transitions in the output status of each load. In particular, it is desirable to avoid short-cycling of each load while under demand limit control or upon certain transitions between demand limit control and real-time control. Accordingly, minimum timers (denominated the RESTORE timer and the SHED timer) are established so as to insure that any such transition can occur only after a given load has been energized or de-energized for a minimum period of time (e.g., three minutes).

The various output status in FIG. 32 permit twelve output status transitions, as illustrated in FIG. 33. The first transition, ON-RESTORED, is permitted at any time and typically occurs when real-time control is calling for the load to be ON and the demand select switch for the load is moved to its SELECT position from its DE-SELECT position. The eleventh transition, OFF-RESTORED, is also permitted at any time and typically occurs when the demand select switch for the load is in its SELECT position and real-time control changes from OFF to ON. At each such transition, the RESTORE timer is started. As can be seen from the fifth transition, RESTORED/SHED, demand limit control is disabled from placing that load in a SHED state until the RESTORE timer has timed out.

The second and twelfth transitions, respectively ON-SHED and OFF-SHED, are not allowed at any time. These transitions typically might be called for when real-time control calls for the load to be ON or OFF and the demand select switch for the load is moved from its DE-SELECT position to its SELECT position. The reason for this restriction is that it is desired that each load, when selected for demand limit control, be initially placed in a RESTORED state.

The third, fourth, sixth, ninth, and tenth transitions, respectively ON-OFF, RESTORED-ON, RESTORED-OFF, SHED-OFF and OFF-ON, are permitted at any time without any further restrictions. It should be noted that the third, sixth and ninth transitions typically occur when real-time control for the load changes to OFF. The fourth transition typically occurs when the load is ON by real-time control, has been RESTORED by demand limit control, and the associated demand select switch is moved to its DE-SELECT position. The tenth transition typically occurs when real-time control for the load changes from on to OFF and that load has not been selected for demand limit control.

The fifth transition, RESTORED-SHED, is not permitted until the RESTORE timer for the load has timed out. At the time of the fifth transition, the SHED timer for that load is started. The fifth transition typically occurs when the load has been selected for demand limit control, the load is ON by real-time control, and demand limit control changes from RESTORED to SHED.

The seventh and eighth transitions, respectively SHED-ON and SHED-RESTORED, are not permitted until the SHED timer for the load has timed out. The seventh transition typically occurs when the load is ON by real-time control, has been SHED by demand limit control, and the associated demand select switch is moved to its DE-SELECT position. The eighth transition (as well as the fifth transition) reflects the normal operation of the demand limiter, and additionally causes the RESTORE timer to be started so that the load cannot thereafter be SHED until the RESTORE timer has timed out (reference the fifth transition).

One exception is provided to the output status transitions listed in FIG. 33. That is, upon a POWER UP condition, all loads subject to demand limit control are initially SHED.

In order to implement this set of logic conditions, the data bytes set forth in Table VIII are utilized:

TABLE VIII

| Data Byte | Explanation |
| --- | --- |
| DSLEC | Bx set or cleared when demand select switch for load x is SELECT or DE-SELECT |
| DLOAD | Bx set when load x is under demand limit control; otherwise cleared |
| SLOAD | Bx set when load x is SHED; otherwise cleared |
| RLOAD | Bx set when load x is RESTORED; otherwise cleared |
| MIST | Bx set when load x is SHED and SHED timer is running; otherwise cleared |
| MIRT | Bx is set when load x is RESTORED and RESTORE timer is running; otherwise cleared |
| MINT | Bx set when load x has a minimum timer running |
| MINTx (1-8) | Minimum timer (SHED or RESTORE) for load x |
| DLENA | Bx set when load x is RESTORED or when load x is not subject to demand limit control; otherwise cleared |

From the explanations in Table VIII, in will be appreciated that each data byte is organized in a manner similar to that of the RTBYT data byte (and other data bytes) previously discussed, that is, each bit Bx therein is associated with a given load number, or load x. It should also be noted that a minimum timer MINTx (e.g., MINT1, etc.) is associated with each load and is used to provide the functions of both the SHED timer and the RESTORE timer previously discussed.

Implementation of the set of logic conditions can be understood by reference to FIGS. 27, 26(a), 26(b) and 20, taken together with the chart in FIGS. 34(a) and 34(b) which illustrates seven passes, in real-time, of CPU 100 through various steps including the UPDATE DEMAND LIMIT STATUS subroutine. For simplicity of explanation, it is assumed that the portions of the DLR2 routine subsequent to the UPDATE DEMAND LIMIT STATUS subroutine in step 650 have no effect on the status of any load subject to demand limit control, and that CPU 100 can be considered as progressing directly from step 650 (FIG. 26(a)) to step 670 (FIG. 26(b)). The various passes illustrated in FIGS. 34(a) and 34(b) occur in real-time and as CPU 100 recirculates through the main program loop including the OUTPUT & STAGE routine. Pass #1 occurs upon a POWER UP condition, arbitrarily defined as time 00:00, and pass #2-pass #7 occur at successive times in real-time.

Upon entering pass #1, all bits in MIST and MINT have been cleared, and all bits in SLOAD have been set, as previously described. Let it be assumed that loads 1, 2, 5 and 6 are ON under real-time control, and that loads 1, 2, 3 and 4 have been selected for demand limit control.

In step 700, CPU 100 sets DLOAD=RTBYT AND (DSLEC OR MIST). As indicated in FIG. 34(a), bits B1 and B2 of DLOAD are accordingly set to indicate that loads 1 and 2 are under demand limit control. CPU 100 then proceeds, in step 702, to set SLOAD=-DLOAD AND SLOAD. As a result, bits B1 and B2 of SLOAD are set to indicate that loads 1 and 2 are to be initialized in a SHED state.

From step 702, CPU 100 proceeds, in step 704, to compute (and store in an internal register) a quantity known as (NEW) RLOAD, wherein each bit Bx therein is set when its associated load x has been placed in a RESTORED state during the present pass. Specifically, CPU 100 sets (NEW) RLOAD=DLOAD AND SLOAD. As indicated in FIG. 34(a), all bits of (NEW) RLOAD are cleared to indicate that no loads have been placed in a RESTORED state during the present pass.

Thereafter, CPU 100, in step 706, computes (and stores in an internal register) a quantity known as (ADDED) RLOAD, with each bit Bx of (ADDED) RLOAD being set when its associated load x has been placed in a RESTORED state during the present pass and has not been previously in a RESTORED state. Specifically, CPU 100 sets (ADDED) RLOAD=(NEW) RLOAD AND (OLD) RLOAD. The quantity used as (OLD) RLOAD is the RLOAD data byte in RAM 104. It will be remembered that the RLOAD data byte is cleared upon a POWER UP condition. Irrespective of this fact, however, all of the bits of (NEW) RLOAD are cleared, so that all the bits of (ADDED) RLOAD are also cleared to signify that no additional loads have been placed in a RESTORED state during the pass.

From step 706, CPU 100 proceeds, in step 708, to determine if the RSET operation flag has been set. Under a POWER UP condition, the determination in step 708 is affirmative, whereby CPU 100 proceeds to clear RSET in step 710 and then proceeds, in step 712, to start the minimum timers for those bits Bx of SLOAD that are set. As indicated in FIG. 34(a), B1 and B2 of SLOAD have been set, so that MINT1 and MINT2 are started, e.g., have loaded therein a count representing a time of three minutes. MINT3–MINT8, however, remained cleared.

From step 712, CPU 100 proceeds, in step 716, to set those bits Bx of MINT corresponding to the minimum timers MINTx that are running. Accordingly, bits B1 and B2 of MINT are set.

Thereafter, CPU 100, proceeds in step 718, to flag each SHED timer that is running for each load in a SHED state by setting MIST=MINT AND SLOAD. As indicated in FIG. 34(b), bits B1 and B2 of MIST are accordingly set. Thereafter, CPU 100, in step 720, flags the RESTORE timers for those loads in a RESTORED state by setting MIRT=MINT AND RLOAD. At this point, it should be noted that CPU 100, after the computations in step 706, stores the quantity (NEW) RLOAD as the RLOAD data byte in RAM 104. Since no loads are in a RESTORED state during this pass, all bits of MIRT are accordingly cleared.

From step 720, CPU 100 proceeds, in step 722, to set MINT=MIST OR MIRT, and thereafter proceeds, in step 724, to clear the minimum timers MINTx for those bits Bx of MINT that are cleared in step 722. The actions that are taken in steps 722 and 724 permit CPU 100 to stop any minimum timers that are running for any load that is going from a RESTORED state to an ON or OFF state or from a SHED state to an OFF state, as explained hereinafter. During pass #1, however, these transitions are not occurring so that MINT and the various minimum timers remain unchanged.

Proceeding now to step 670 (FIG. 26(b)), the desired output status under demand limit control is established by setting DLENA=DLOAD OR RLOAD. As indicated in FIG. 34(b), bits B1 and B2 of DLENA are cleared, and the remaining bits thereof are set. Determination of the actual output status of each load is thereafter accomplished in step 513C (FIG. 20) from the desired output status under real-time control and from the desired output status under demand limit control. Specifically, CPU 100 sets OBYTE=RTBYT AND DLENA. As indicated in FIG. 34(b), bits B5 and B6 of OBYTE are set, to reflect the fact that loads 5 and 6 are ON under real-time control. However, bits B1 and B2 of OBYTE are cleared, even though bits B1 and B2 of RTBYT are set, to reflect the condition that loads 1 and 2 selected for demand limit control are initially SHED upon a power up condition. It should also be noted that although loads 3 and 4 have been selected for demand limit control, corresponding bits B3 and B4 of DLOAD are cleared during pass #1, and bits B3 and B4 of DLENA are set, since loads 3 and 4 are OFF under real-time control.

Pass #2 occurs thirty seconds (time 00:30) after pass #1, and when the user selects loads 6 and 7 for demand limit control. Let it be assumed that there has been no change in the desired output status under either real-time control or demand limit control. Accordingly, bits B1, B2, B5 and B6 of RTBYT are set, and bits B1–B4 and B6–B7 of DSLEC are set. As CPU 100 passes through step 700, only bits B1, B2 and B6 of DLOAD are set. If should be noted that bits B3, B4 and B7 of DLOAD remain cleared, even through loads 3, 4 and 7 have been selected for demand limit control, since those loads are currently OFF under real-time control. As CPU 100 passes through step 702, there is no change in SLOAD from pass #1. However, CPU 100 passes through step 704, bit B6 of (NEW) RLOAD is set to reflect the fact that load 6 is now to be RESTORED. In step 706, CPU 100 also sets bit B6 of (ADDED) RLOAD to indicate that load 6 has been added to the group of loads in a RESTORED state during the present pass.

Since the RSET operation flag was cleared in pass #1, the determination in step 708 is negative, so that CPU 100 proceeds, in step 714, to start the minimum timers for those bits Bx of (ADDED) RLOAD that are set. Accordingly, MINT6 is set to a count representing three minutes. Also note that MINT1 and MINT2 have been decremented (during the INTERRUPT subroutine previously described) to a count representing 2.5 minutes.

Thereafter, CPU 100, in step 716, sets bits B1, B2 and B6 of MINT to reflect the fact that the corresponding minimum timers MINT1, MINT2 and MINT6 are running. In step 718, bits B1 and B2 of MIST are set to reflect the fact that minimum timers are running for loads 1 and 2 that are also SHED. Likewise, in step 720, bit B6 of MIRT is set to indicated that a minimum timer is running for load 6 which is RESTORED. Under the circumstances involved with pass #2, the actions undertaken in step 722 and 724 effect no change in either MINT or in the minimum timers that are running. In step 670, it should be noted that bits B1 and B2 of DLENA remain cleared to reflect the fact that the minimum timers for those loads have not yet timed out and that those loads are accordingly to remain SHED. Since load 6 was previously ON under real-time control, and is now in RESTORED under demand limit control, bit B6 of DLENA remains set. Accordingly, the actions undertaken in step 513C indicate that there is no change in the output status of the loads from pass #1, e.g., bits B5 and B6 of OBYTE remain set and all other bits remain cleared.

Pass #3 occurs thirty seconds after pass #2 (time 01:00), when loads 4 and 8 are placed in an ON state by real-time control. Accordingly, bits B1, B2, B4, B5, B6 and B8 of RTBYT are set. let it be assumed that there is no change in the loads selected for demand limit control, and in the desired output status of such loads under demand limit control.

In step 700, bit B4 of DLOAD is set, to reflect the fact that load 4 is ON and has been selected for demand limit control. Bits B1, B2 and B6 of DLOAD remain set as in pass #2. In step 702, there is no change in SLOAD from pass #2. However, in step 704, bits B4 and B6 of (NEW) RLOAD are set to reflect that loads 4 and 6 are now RESTORED. In step 706, only bit B4 of (ADDED) RLOAD is set to reflect that only load 4 has been placed in a RESTORED state during the present pass.

Again, the determination in step 708 is negative, whereby MINT4 is started, since bit B4 of (ADDED) RLOAD has been set. It should be noted that the counts within MINT1, MINT2 and MINT6 have been decremented to reflect the elapsed time between pass #3 and pass #2.

In step 716, bits B1, B2, B4 and B6 of MINT are set to reflect that the corresponding minimum times are running. In step 718, bits B1 and B2 of MIST are set to reflect that the minimum timers for loads 1 and 2 are running and that those loads are SHED. Likewise, in step 720, bits B4 and B6 of MIRT are set to reflect that the minimum timers for loads 4 and 6 are running and that those loads are RESTORED. As in the previous passes, there is no change to MINT or to any of the minimum timers in steps 722 and 724. Since the load just added to demand limit control, e.g., load 4, is RESTORED, the actions undertaken in step 670 effect no change in DLENA from pass #2. However, bits B4 and B8 of OBYTE are set in step 513C, in addition to bits B5 and B6 which have been set during previous passes.

Pass #4 occurs one minute after pass #3 (time 02:00), when loads 2, 4 and 5 are placed in an OFF state by real-time control. Accordingly, bits B1, B6 and B8 of RTBYT are set, and the remaining bits thereof are cleared. Again let it be assumed that there has been no change in the loads selected for demand limit control, and that there likewise has been no change in the desired output status of each load under demand limit control.

In step 700, only bits B1 and B6 of DLOAD are set, and bits B2 and B4 of DLOAD, set in previous passes, are cleared, to reflect the fact that any load in an OFF state under real-time control is removed from demand limit control. In step 702, only bit B1 of SLOAD is set, inasmuch as load 1 is the only load that remains under demand limit control and is SHED. In step 704, only bit B6 of (NEW) RLOAD is set to reflect the fact that only load 6 remains under demand limit control and is RESTORED. In step 706, all bits of (ADDED) RLOAD are cleared to reflect the fact that no loads have been placed in a RESTORED state during the present pass.

The determination in step 708 is again negative. Since no bits of (ADDED) RLOAD are set, no minimum timers are started in step 714. However, it should be noted that the counts within MINT1, MINT2, MINT4 and MINT6 have been decremented to represent the elapsed time between pass #4 and pass #3. The actions undertaken in step 716 effect no change in MINT from pass #3, since the minimum timers running during pass #3 are also running during pass #4 and since no additional minimum timers have been started.

In step 718, bit B1 of MIST is set, to reflect the fact that the minimum timer for load 1 is running and that load 1 is SHED. Likewise, in step 720, bit B6 of MIRT is set to reflect the fact that only the minimum timer for load 6 is running and that load 6 is RESTORED. In step 722, MINT is updated so that only bits B1 and B6 thereof are set. Accordingly, MINT2 and MINT4 are cleared in step 724. Accordingly, the minimum timers for those loads that are removed from demand limit control during pass #4 are stopped.

In step 670, it should be noted that bit B2 of DLENA is set, in addition to those bits set in pass #3, to reflect that load 2, previously subject to demand limit control and SHED, is not removed from demand limit control. Bit B1 of DLENA, however, remains cleared to reflect that load 1 remains under demand limit control and is SHED. Accordingly, only bits B6 and B8 of OBYTE are set in step 513C, and bits B4 and B5 of OBYTE, previously set in pass #3, are cleared to reflect the OFF state of loads 4 and 5. Bit B2 of OBYTE remains cleared, however, since a transition from a SHED state to an OFF state effects no change in the output status of that load.

Pass #5 occurs thirty seconds after pass #4 (time 02:30), when the user de-selects loads 1 and 6 for demand limit control. Let it be assumed that there is no change in the input status under real-time control. Accordingly, RTBYT remains unchanged from pass #4. However, only bits B2, B3, B4 and B7 of DSLEC are now set, and the remaining bits thereof are cleared.

In step 700, bit B6 of DLOAD, previously set in pass #4, is now cleared. However, bit B1 of DLOAD remains set, even though load 1 has been de-selected for demand limit control, because the minimum timer for that load (reflected in the setting of bit B1 in MIST) is still running. The actions undertaken in step 702 effect no change in SLOAD from pass #4, since load 1 is the only load that remains under demand limit control and is SHED. In step 704, all bits of (NEW) RLOAD are cleared to reflect that no loads are currently RESTORED. It should be noted that bit B6 of (NEW) RLOAD, previously set in pass #4, is now cleared to reflect that load 6 has been de-selected for demand limit control and is no longer RESTORED. Likewise, all bits of (ADDED) RLOAD are cleared in step 706, to reflect that no loads have been placed in a RESTORED state during the present pass.

The determination in step 708 is again negative. Since all bits of (ADDED) RLOAD are cleared, no minimum timers are started in step 714. However, the counts within MINT1 and MINT6, started in previous passes, have been decremented by the elapsed time between pass #5 and pass #4. In step 716, bits B1 and B6 of MINT are set to reflect that MINT1 and MINT6 are still running. In step 718, bit B1 of MIST is set, to reflect that load 1 has a minimum timer running and is SHED. In step 720, all bits of MIRT are cleared, to reflect that no loads are currently RESTORED and have a minimum timer running. MINT is updated in step 722, so that only bit B1 thereof is set. Accordingly, MINT 6 is cleared in step 724 to stop the minimum timer for load 6. In step 670, it should be noted that bit B6 of DLENA remains set, as in pass #4, even though load 6 has been de-selected for demand limit control, inasmuch as load 6 is currently in an ON state under real-time control and was previously RESTORED. Accordingly, there is no change effected in OBYTE during step 513C from pass #4.

Pass #6 occurs thirty seconds after pass #5 (time 03:00) and no change has occurred from the circumstances encountered during pass #5. Accordingly, there is no change effected during steps 700, 702, 704, and 706. Likewise, the determination in step 708 is negative, and there are no additional minimum timers started in step 714. However, it should be noted that MINT1 has now timed out. Accordingly, all bits of MINT ae cleared in step 716, and all bits of MIST are cleared in step 718. It should be noted that bit B1 of MIST, previously set in pass #5, is now cleared to reflect the fact that the timer for load 1 has now timed out. Again, all bits of MIRT are cleared in step 720, inasmuch as no loads are RESTORED, and all bits of MINT remain cleared in step 722. Since all bits of MINT are cleared, none of the minimum timers have to be cleared in step 724.

Even though the minimum timer for load 1 has now timed out, load 1 remains under demand limit control during pass #6 (e.g., bit B1 of DLOAD remains set, see step 704). Accordingly, the actions taken in steps 670 and 513C effect no change in DLENA and OBYTE from pass #5.

Pass #7 is the next pass of CPU 100 from pass #6, and therefore occurs almost concurrently therewith in realtime. Since all bits of MIST have been cleared in pass #6, all bits of DLOAD are cleared in step 700. Since all bits of DLOAD are cleared, all bits of SLOAD are cleared in step 702. Likewise, all bits of (NEW) RLOAD, (ADDED) RLOAD, MINT, MIST and MIRT are cleared in the succeeding steps, and all minimum timers have timed out. Accordingly, all bits of DLENA are set in step 670. As a result, bit B1 of OBYTE is set in step 513C, in addition to bits B6 and B8 of OBYTE previously set in pass #6. Therefore, load 1 is now placed in an ON state, to reflect the fact that the minimum timer for load 1 has timed out.

During each pass of CPU 100 through the UPDATE DEMAND LIMIT STATUS subroutine, CPU 100 proceeds from step 724 to step 726 and sets the SHCTR data byte to a count representing the number of loads that are in a SHED state, or, the number of bits that have been set in SLOAD. As will be described hereinafter in conjunction with the ROTATE DEMAND LIMIT LOADS subroutine FIG. 28), the count within SHCTR is used to vary the time during which any load subject to demand limit control is SHED. Taking the previously-discussed passes as examples, it will be noted that SHCTR is set to a count of two in pass #1, pass #2 and pass #3, to a count of one in pass #4, pass #5 and pass #6, and to a count of zero in pass #7.

Upon exiting from the UPDATE DEMAND LIMIT STATUS subroutine in step 650 (FIG. 26(a)), CPU 100 proceeds, in step 652, to determine if the INHIB operation flag has been set. As previously discussed in conjunction with the DLR1 routine (FIG. 24(a)), the INHIB operation flag is set if the inhibit switch 168 has been closed, reflecting the fact that demand limit control it to be inhibited for the duration of such closure. If the determination in step 652 is affirmative, CPU 100 proceeds, in step 696, to set SLOAD=MIST and to set DLENA=$\overline{\text{MIST}}$. From the preceding discussion of the UPDATE DEMAND LIMIT STATUS subroutine, it will be appreciated that the actions undertaken in step 696 effectively remove all loads previously subject to demand limit control from demand limit control, excepting such loads in a SHED state for which a minimum timer is still running and until such a time as the minimum timers for those loads have timed out.

ROTATION OF LOADS SUBJECT TO DEMAND LIMIT CONTROL

Figure 28:
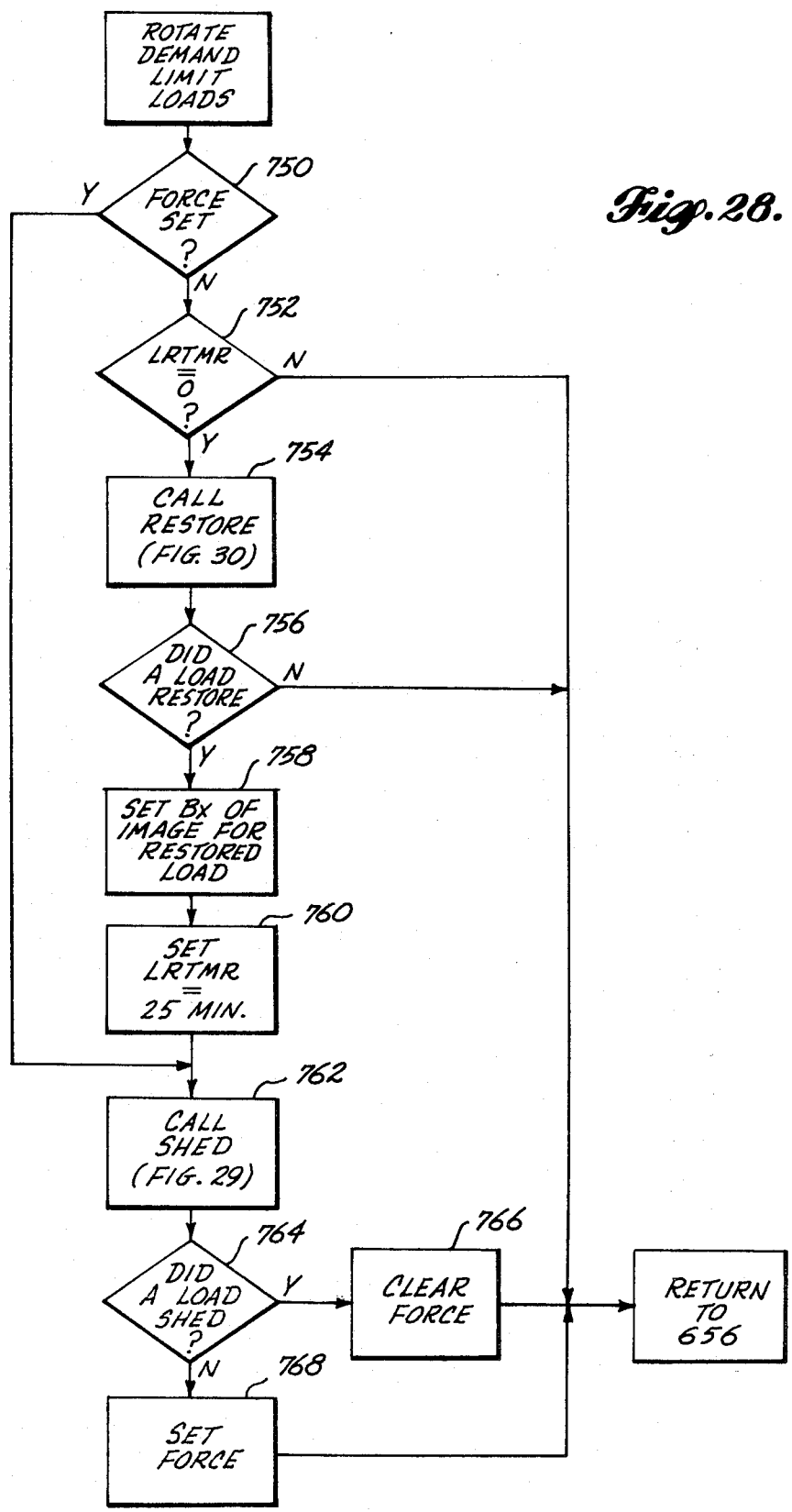
FIG. 28 is a flow chart of the program steps undertaken by the microprocessor in a ROTATE DEMAND LIMIT LOADS subroutine.
Figure 29:
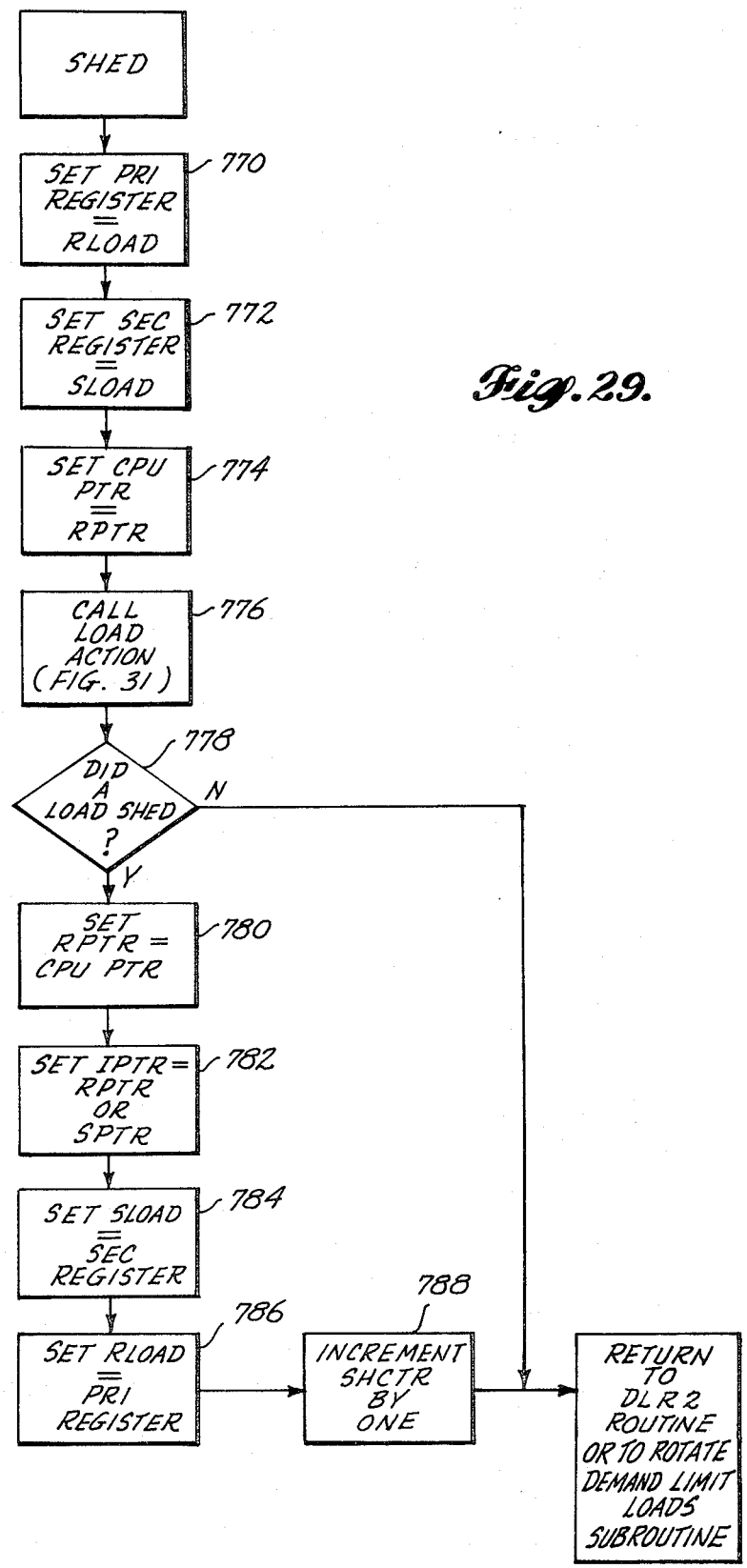
FIG. 29 is a flow chart of the program steps undertaken by the microprocessor in a SHED subroutine.

Assuming, however, that the determination in step 652 is negative, CPU 100 proceeds, in step 654, to the ROTATE DEMAND LIMIT LOADS subroutine illustrated in FIG. 28. The functions of this subroutine are twofold: first, to ensure that no load subject to demand limit control is in a SHED state for more than a predetermined maximum interval; and, second, to establish a predetermined order in which those loads subject to demand limit control are placed in SHED or RESTORED states. For reasons that will be apparent from the ensuing discussion, the predetermined maximum interval that any load is permitted to be SHED is preferably chosen to be slightly greater than the product of the number of loads possibly subject to demand limit control (e.g., eight) and the minimum interval that any such load must remain in either a SHED or a RESTORED state (e.g., the three-minute interval established by the SHED or the RESTORE timers). In the example under discussion, the predetermined maximum interval is twenty-five minutes, which comprises the count initially set into the LRTMR timer upon initialization in step 608 (FIG. 24(a)). In order to ensure that no load is SHED for more than twenty-five minutes, the count within the LRTMR timer is decremented at a rate proportional to the number of loads that are subject to demand limit control and that are SHED, e.g., the number represented by the count within the SHCTR data byte. Therefore, if all eight loads are subject to demand limit control and only one of those loads is SHED, it will take $(25 \div 1)$, or, 25, minutes for LRTMR to decrement to zero. If all eight loads are subject to demand limit control and all eight loads are SHED (a situation that would typically occur upon initialization), then it will take $(25 \div 8)$, or, 3.125, minutes for LRTMR to decrement to zero. When LRTMR decrements to zero, a load that was previously SHED is placed in a RESTORED state, and a load that was previously RESTORED is placed in a SHED state, with the changing of states being accomplished in a predetermined order as previously discussed.

The predetermined order in which the states of the loads subject to demand limit control are changed is established by grouping those loads subject to demand limit control according to their respective states, i.e., SHED (represented by the bits in SLOAD) and RESTORED (represented by the bits in RLOAD), and by shedding or restoring the load whose number corresponds to the next-ascending bit position in SLOAD or RLOAD from that of the last load placed in a SHED or in a RESTORED state, and for which the corresponding minimum timer (SHED timer, RESTORE timer) has timed out. As an example, let it be assumed: that loads 1-3 and 5-7 are subject to demand limit control; that loads 1, 3, 5 and 7 are SHED and that load 7 was the last load to be placed in a SHED state; and, that loads 2 and 6 are RESTORED and that load 2 was the last load to be placed in a RESTORED state. If it is desired to shed a load, it will be seen that load 6 will be the first to be placed in a SHED state, provided that its RESTORE timer has timed out. If not, it will be seen that load 2 will be placed in a SHED state, provided that its RESTORE timer has timed out. If neither of the RESTORE timers for loads 2 and 6 have timed out at the time that a load is to be shed, no shedding will occur. Likewise, if a load is to be restored, it will be seen that load 1 will be the first to be placed in a RESTORED state, provided that its SHED timer has timed out. If not, load 2 will be placed in a RESTORED state, provided that its RESTORE timer has timed out, and so forth.

With reference now to FIG. 28, CPU 100 initially determines, in step 750, whether the FORCE operation flag has been set. Let it be assumed that the determination in step 750 is negative (e.g., the FORCE operation flag has been cleared upon initialization). As a result, CPU 100, in step 752, determines if the LRTMR timer has decremented to zero. If the determination in step 752 is negative, CPU 100 exits from the ROTATE DEMAND LIMIT LOADS subroutine by returning to step 656 (FIG. 26(a)) and proceeds through the remainder of the DLR2 routine and thereafter through its main program loop.

To explain the operation of the ROTATE DEMAND LIMIT LOADS subroutine, let it be assumed: the loads 1-3 and 5-7 have been selected for demand limit control and are ON under real-time control; that loads 4 and 8 are being maintained OFF under real-time control; that loads 1, 3, 5 and 7 are SHED, and that load 7 was the last load to be placed in a SHED state; that loads 2 and 6 are RESTORED, and that load 6 was the last load to be placed in a RESTORED state; and, that all minimum timers for the loads subject to demand limit control have timed out. Under the foregoing assumptions, SLOAD=01010101; RLOAD=00100010; SPTR=01000000; RPTR=00100000; SHCTR=4; RTBYT=01110111; IMAGE=00100010; and, MINT1-MINT8 are cleared.

Figure 30:
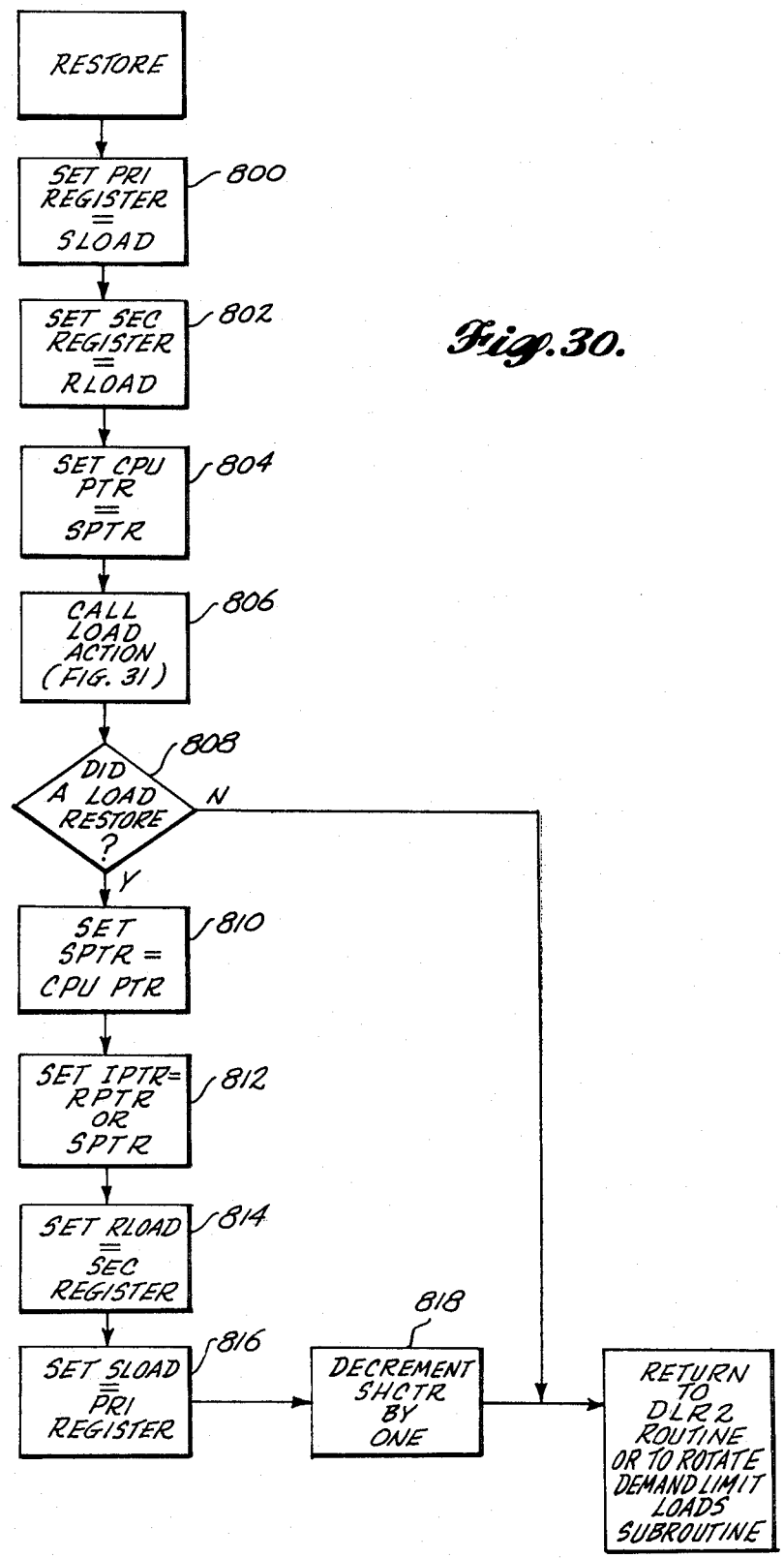
FIG. 30 is a flow chart of the program steps undertaken by the microprocessor in a RESTORE subroutine.

When the LRTMR timer has decremented to zero, a time which is no greater than $25 \div (SHCTR=4)$ after load 7 has been placed in a SHED state, the determination in step 752 is affirmative, whereupon CPU 100, in step 754, proceeds to call the RESTORE subroutine in FIG. 30. Both the SHED subroutine in FIG. 29 and the RESTORE subroutine in FIG. 30 make use of the LOAD ACTION subroutine in FIG. 31, and, as such, utilize certain common registers and pointers internal to CPU 100 and respectively denominated the PRI register, the SEC register, and the CPU PTR. Within the RESTORE subroutine, the PRI register, the SEC register, and the CPU PTR are respectively set equal to SLOAD, RLOAD, and SPTR, in steps 800, 802 and 804. In the example under consideration, PRI register=01010101; SEC register=00100010; and, CPU PTR=01000000.

Figure 31:
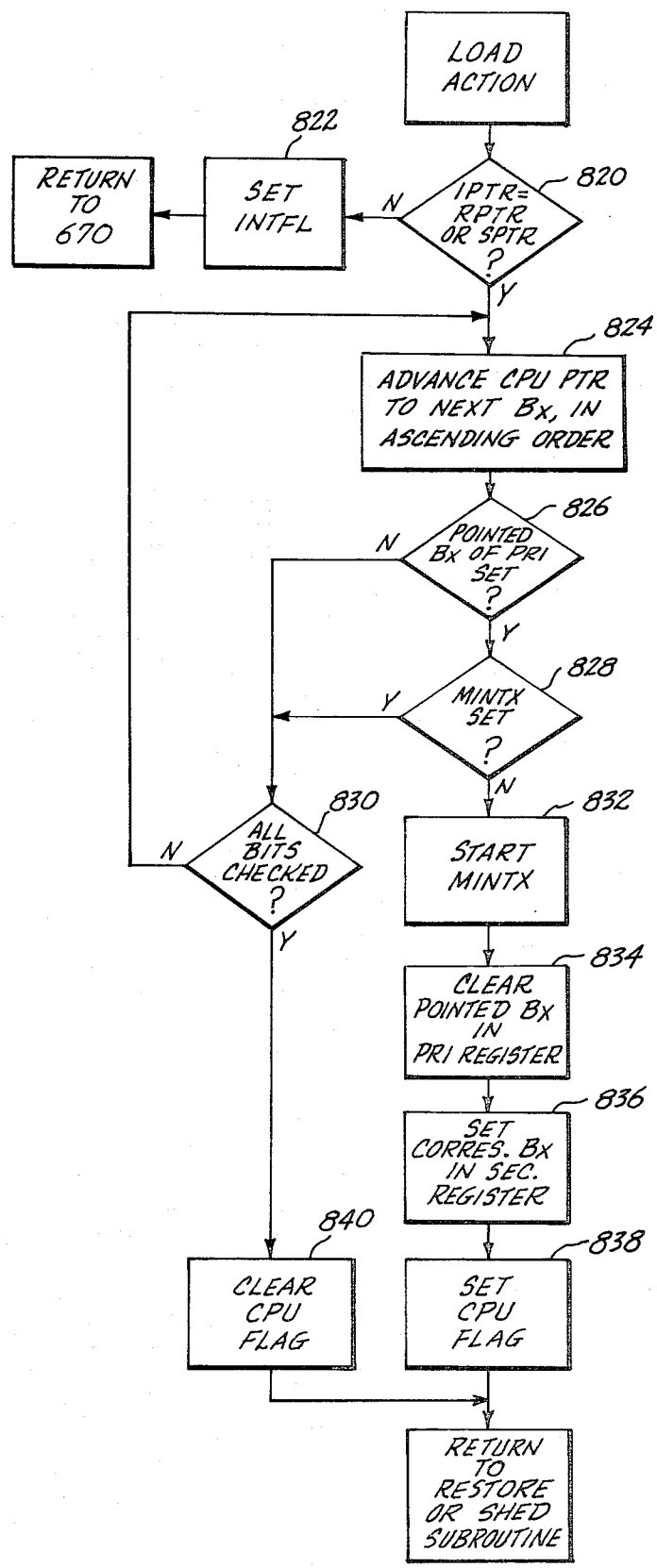
FIG. 31 is a flow chart of the program steps undertaken by the microprocessor in a LOAD ACTION subroutine.

CPUT 100 next proceeds, in step 806, to call the LOAD ACTION subroutine in FIG. 31. In step 820 therein, CPU 100 determines if a pointer error has occured by determining if IPTR=RPTR OR SPTR. Upon each pass of CPU 100 through the SHED and RESTORE subroutines, as discussed hereinafter, CPU 100 sets IPTR=RPTR OR SPTR. An error in either of the pointers RPTR, SPTR may occur upon the injection of noise in RAM 104, upon malfunction of RAM 104, or otherwise, so that a change occurs in the bits therein set during the SHED and RESTORE subroutines. If a pointer error has occurred, the determination in step 820 is negative, whereupon CPU 100, in step 822, sets the INTFL operation flag and then returns to step 670 (FIG. 26(b)), whereupon no change is made on the output status of any loads subject to demand limit control. CPU 100 then exits from the DLR2 routine by returning to step 513C as previously described. Upon the next pass through the DLR1 routine, initialization again occurs in step 608 (FIG. 24(a)).

Assuming, however, that a pointer error has not occurred, the determination in step 820 is positive, whereupon CPU 100, in step 824, proceeds to advance CPU PTR to the next bit Bx in ascending bit order. Accordingly, CPU PTR=10000000, e.g., CPU PTR is now pointing to bit B8 of the PRI register. In step 826, CPU 100 determines if the pointed bit Bx of the PRI register is set. In the example under consideration, the determination in step 826 is negative, since the pointed bit B8 of the PRI register is not set. Accordingly, CPU 100, in step 830, proceeds to determine if all bits of the PRI register have been checked. In the example under consideration, only bit B8 of the PRI register has been checked, so that the determination in step 830 is negative. Accordingly, CPU 100 returns to step 824 and advances CPU PTR to the next bit Bx in ascending bit order, whereupon CPU PTR=00000001, e.g., CPU PTR is now pointing to bit B1 of the PRI register. In step 826, CPU 100 determines if the pointed bit Bx of the PRI register is set. In the example under consideration, the determination in step 826 is affirmative, whereupon CPU 100, in step 828, determines if the minimum timer MINTx for the pointed bit Bx is running. In the example under consideration, none of the minimum timers are running, so that CPU 100, in step 832, proceeds to start MINT1 (by loading a count representing a time of three minutes therein). Thereafter CPU 100, in steps 834 and 836, clears the pointed bit Bx in the PRI register, and sets the corresponding bit Bx in the SEC register. Therefore, bit B1 in the PRI register is now cleared, and bit B1 in the SEC register is now set, so that PRI register=01010100 and SEC register=00100011. From step 836, CPU 100 proceeds, in step 838, to set an internal CPU flag to indicate that a load has been either SHED or RESTORED by the LOAD ACTION subroutine.

From step 838, CPU 100 returns to the particular portion of the SHED or RESTORE subroutine being processed prior to the time that the LOAD ACTION subroutine was called. In the example under consideration, CPU 100 proceeds to step 808 in the RESTORE subroutine (FIG. 30) and determines if a load was RESTORED, e.g., is the CPU flag set. In the example under consideration, the determination in step 808 is affirmative, whereupon CPU 100, in successive steps 810, 812, 814 and 816, proceeds to update SPTR, IPTR, RLOAD, and SLOAD as indicated. Thereafter, CPU 100, in step 818, decrements SHCTR by 1. As a result, SPTR=00000001; IPTR=00100001; RLOAD=00100011; SLOAD=01010100; and, SHCTR=three. Accordingly, load 1, the next load in the group of loads previously in a SHED state, is now in a RESTORED state, and the count within SHCTR represents the total number of loads in a SHED state. From step 818, CPU 100 proceeds to step 756 in the ROTATE DEMAND LIMIT LOADS subroutine (FIG. 28) and determines if a load was RESTORED, i.e., is the CPU flag set. The determination in step 756 is accordingly affirmative, whereupon CPU 100, in step 758, proceeds to set the corresponding bit Bx of IMAGE for that load which has just been placed in a RESTORED state, e.g., bit B1 of IMAGE is set whereby IMAGE=00100011. Thereafter, CPU 100, in step 760, sets the LRTMR timer to a count representing twenty-five minutes, whereupon LRTMR is decremented at a rate determined by the number of loads that are in a SHED state (e.g., 25÷(SHCTR=3)).

It is desired that the transition of any load from a SHED to a RESTORED state by the aforementioned operation in the ROTATE DEMAND LIMIT LOADS subroutine not effect any significant change in the total power consumption at the facility. Accordingly, a load previously in a RESTORED state must now be placed in a SHED state. For this purpose, CPU 100 proceeds, in step 762, to call the SHED subroutine in FIG. 29. In successive steps 770, 772 and 774, CPU 100 sets PRI register, SEC register, and CPU PTR, respectively equal to RLOAD, SLOAD, and RPTR. As a result, PRI register=00100011; SEC register=01010100; and CPU PTR=00100000. From step 774, CPU 100 proceeds, in step 776, to call the LOAD ACTION subroutine in FIG. 31. Assuming that a pointer error has not occurred, the determination in step 820 is affirmative, whereupon CPU 100, in step 824, advances CPU PTR to the next bit Bx in ascending order, whereupon CPU PTR=01000000. The determination in step 826 is negative, since the pointed bit B7 of the PRI register is not set. Accordingly, CPU 100 proceeds, in step 830, to determine if all bits of the PRI register have been checked. In the example under consideration, only bit B7 of the PRI register has been checked, so the determination in step 830 is negative. Accordingly, CPU 100 returns to step 824 and advances CPU PTR to the next ascending bit Bx, or, bit B8, whereupon CPU PTR=10000000. Again, the determination in step 826 is negative, and the determination in step 830 is also negative, since only bits B7 and B8 have been checked. As a result, CPU 100 returns to step 824 and advances CPU PTR to the next ascending bit Bx, or, bit B1, whereupon CPU PTR=00000001. At this time, the determination in step 826 is affirmative. However, since MINT1 was started during the previous pass through the LOAD ACTION subroutine, the determination in step 828 is also affirmative, reflecting the fact that load 1 has just been placed in a RESTORED state and that its RESTORE timer has not yet timed out. As a result, CPU 100 again loops through step 830 to step 824 and advances CPU PTR to the next ascending bit Bx, or, bit B2, whereupon CPU PTR=00000010. At this time, the determination in step 826 is affirmative, and the determination in step 828 is negative, e.g., load 2 is currently in a RESTORED state and MINT2 is not running. As a result, CPU 100, in steps 832, 834 and 836, starts MINT2, clears bit B2 of the PRI register, whereby PRI register=00100001, and sets bit B2 in the SEC register, whereby SEC register=01010110.

After setting the CPU flag in step 838, CPU 100 returns to step 778 in the SHED subroutine. Since the CPU flag was set in step 838, the determination in step 778 is affirmative, whereupon CPU 100 proceeds, in steps 780, 782, 784, and 786 to update RPTR, IPTR, SLOAD, and RLOAD, whereby RPTR=00000010; IPTR=00000011; SLOAD=01010110; and, RLOAD=00100001. Thereafter, in step 788, the count within SHCTR is incremented by one, whereby SHCTR=four. As a result of these operations, load 2, previously in a RESTORED state, is now in a SHED state, and the count within SHCTR represents the total number of loads in a SHED state.

From step 788, CPU 100 returns to step 764 in the ROTATE DEMAND LIMIT LOADS subroutine and determines if a load was SHED, i.e., is the CPU flag set. Since the CPU flag was set in step 838, the determination in step 764 is affirmative, whereupon CPU 100 proceeds in step 766, to clear the FORCE operation flag, and then returns to step 656 in the DLR2 routine (FIG. 26(a)).

From the preceding discussion, it will be appreciated that CPU 100 thereafter proceeds, in step 670 (FIG. 26(b)) to update the DLENA data byte to reflect the fact that load 1 is now RESTORED and that load 2 is now SHED, in accordance with the changes made to RLOAD as CPU 100 passed through the ROTATE DEMAND LIMIT LOADS subroutine. The actual change in output status of the loads is not made, however, until CPU 100 exits from the DLR2 routine and proceeds to step 513C in the OUTPUT & STAGE routine (FIG. 20), and thereafter through that routine as previously described.

Let it now be assumed that, in addition to the assumptions made in the previous example, the minimum timers for loads 2 and 6 have not timed out as CPU 100 passes through the ROTATE DEMAND LIMIT LOADS subroutine. Accordingly, CPU 100 proceeds as previously described through steps 750, 752, 754, 756, 758 and 760 to place load 1 in a RESTORED state and then to step 762, in which CPU 100 passes first into the SHED subroutine and then, in step 776, to the LOAD ACTION subroutine. Assuming that no pointer error has occurred, it will be seen that as CPU 100 successively advances CPU PTR in step 824, the determination in step 826 is negative for bits B3-B5 and B7-B8, since those bits are not set in the PRI register (e.g., loads 3-5 and 7-8 are SHED or not subject to demand limit control) and the determination in step 828 is negative for bits B1, B2 and B6 (e.g., the minimum timers MINT1, MINT2 and MINT6 are running for loads 1, 2 and 6). Accordingly, no additional load can be placed into a SHED state at this time. Therefore, the determination in step 830 is affirmative, whereupon CPU 100 proceeds, in step 840, to clear the CPU flag. The subsequent determination in step 778 in the SHED subroutine is also negative, and the determination in step 764 in the ROTATE DEMAND LIMIT LOADS subroutine is also negative, whereupon CPU 100 proceeds, in step 768, to set the FORCE operation flag. Upon the next pass of CPU 100 through the ROTATE DEMAND LIMIT LOADS subroutine, it will be seen that CPU 100 effectively bypasses the RESTORE subroutine, since the determination in step 750 is affirmative, and proceeds to loop through the SHED routine during that pass and during each subsequent pass until a load has been placed in a SHED state, e.g., the minimum timer for load 2 or load 6 has timed out, whereupon the FORCE operation flag is cleared in step 766. Therefore, even if the LRTMR timer times out, no additional loads will be placed in a RESTORED state until a load previously in a RESTORED state has been placed in a SHED state.

DETERMINATION OF DESIRED OUTPUT STATUS UNDER DEMAND LIMIT CONTROL

After passing through the ROTATE DEMAND LIMIT LOADS subroutine in step 654 (FIG. 26(a)), CPU 100 then determines if the actual rate of power consumption at the facility is such that one or more loads need to be turned on or to be turned off in order to maintain the actual rate of power consumption within a predetermined deadband having a predetermined relationship to the set point. The upper limit of the deadband is the set point, and the lower limit of the deadband is equal to the set point minus the deadband size selected by jumper JP1.

Accordingly, CPU 100, in step 656, determines the quantity $\Delta = (\text{SPBYT} - \text{INBYT})$, stores $\Delta$ in an internal register, and determines if $\Delta$ is less than zero, e.g., is the actual rate of power consumption represented by the input signal, or INBYT, greater than the desired rate of power consumption represented by the set point signal, or SPBYT. If the determination in step 656 is affirmative, the actual rate of power consumption is accordingly above the upper limit of the deadband, so that CPU 100 proceeds to place one or more loads currently in a RESTORED state into a SHED state in order to bring the actual rate of power consumption equal to or below that of the set point.

Specifically, CPU 100, in step 658, determines if the SRFLG operation flag has been set to its SHED state. Upon initialization, and at all other times when demand limit control is not calling for a load to be SHED, the determination in step 658 is negative, whereupon CPU 100, in step 660, sets the SRFLG operation flag to its SHED state. Thereafter, in step 662, CPU 100 sets the SRTMR timer to a count representing fifteen seconds. From step 662, CPU 100 proceeds, in step 664, to determine if the SRTMR timer has decremented to zero. Since SRTMR has just been set in previous step 662, the determination in step 664 is negative, whereupon CPU 100 proceeds to exit from the DLR2 routine through step 670 and then reenters the main program loop through step 513C in the OUTPUT & STAGE routine. Accordingly, no change is made in the output status of any load subject to demand limit control at this time.

Upon its next pass through the DLR2 routine, let it be assumed that the over set point condition has persisted and that the determination in step 656 is accordingly still affirmative. At this time, the determination in step 658 will also be affirmative, whereupon CPU 100 loops through steps 664 and 670 back to its main program loop. It will be appreciated that CPU 100 will continue to loop through its main program loop and through the aforementioned portions of the DLR2 routine for as long as the over set point condition persists. If such a condition still persists at the time that the SRTMR timer has decremented to zero, the determination in step 664 is affirmative, whereupon CPU 100 proceeds, in step 666, to call the SHED subroutine. From the preceding discussion, it will be appreciated that CPU 100 will, while proceeding through the SHED subroutine, attempt to change the output status of the next available load subject to demand limit control from a RESTORED state to a SHED state, with a consequent change in the corresponding bit Bx in both RLOAD and SLOAD. If CPU 100 is able to shed a load (e.g., at least one of the loads currently in a RESTORED state does not have its minimum timer running), the minimum timer for the load being placed in a SHED state is started and the CPU flag is set. Upon exiting from the SHED subroutine in step 666, CPU 100 proceeds, in step 668, to determine if a load was able to be shed, e.g., is the CPU flag set. If the determination in step 668 is affirmative, CPU 100 proceeds, in step 694, to clear the SRFLG operation flag, and then, in step 670 to update the output status of the load subject to demand limit control (e.g., DLENA) in accordance with the new status represented by RLOAD obtained during the SHED subroutine. Accordingly, the corresponding load that is now placed in a SHED state is turned off as CPU 100 proceeds through the OUTPUT & STAGE routine. If the over set point condition still persists at the time that CPU 100 next passes through the DLR2 routine, e.g., the reduction in the actual rate of power consumption occasioned by the turning off of the load just placed in a SHED state has not been sufficient to bring the actual rate of power consumption below the set point, the determination in step 656 is again affirmative, whereupon CPU 100 goes to step 658 and thereafter proceeds as previously described, whereupon an additional load is placed in a SHED state if the over set point condition persists for an additional period of fifteen seconds. By accordingly shedding a load only if an over set point condition persists for a predetermined period of time, e.g., fifteen seconds, changes in the output status of the loads subject to demand limit control that might otherwise occur due to short-term variations in the actual rate of power consumption are avoided.

If CPU 100 has been unable to place a load in a SHED state as it proceeds through the SHED routine in step 666, e.g., all of the loads currently in a RESTORED state have a minimum timer running or no loads are in a RESTORED state, the determination in step 668 is negative, whereupon CPU 100 proceeds directly to step 670 so that no changes are made in the output status of any of the loads subject to demand limit control, and continues looping through the main program loop and the portion of the DLR2 routine including steps 656, 658, 664, 666, 668 and 670 for as long as the over set point condition persists and until a load is able to be placed in a SHED state.

Let it now be assumed that the determination in step 656 is negative, that is, the actual rate of power consumption represented by the input signal, or INBYT, is below the desired rate of power consumption represented by the set point signal, or SPBYT. Since the actual rate of power consumption is now below the set point, a further determination must be made as to whether the actual rate of power consumption is within the deadband that has been selected. If the actual rate of power consumption is within the deadband, no change in the output status of the loads subject to demand limit control is to be made. If the actual rate of power consumption is under the deadband, one or more loads are to be placed in a RESTORED state until such a time that the actual rate of power consumption is brought within the deadband.

It is necessary to express the difference between the set point and the actual rate of power consumption as a percentage of the set point, since the size of the deadband is expressed as a percentage of the set point. This difference, termed with deviation, may be expressed as:

$$\text{deviation} = \frac{(\text{set point} - \text{input})}{\text{set point}} = \frac{\Delta}{\text{set point}}$$

If the deviation is greater than the deadband, the actual rate of power consumption, or the input, is under the deadband. Accordingly, $$\text{deviation} = \frac{\Delta}{\text{set point}} > \text{deadband}$$

By rearranging the foregoing equation, the following statement may be obtained for an under deadband condition:

$$\text{set point} - \frac{\Delta}{\text{deadband}} < 0$$

For a deadband of 10%,
the foregoing statement reduces to:

$$\left(\text{set point} - \frac{\Delta}{.10}\right) = (\text{set point} - 10\,\Delta) < 0$$

For a deadband of 20%,
the foregoing statement reduces to:

$$\left(\text{set point} - \frac{\Delta}{.20}\right) = (\text{set point} - 5\,\Delta) < 0$$

Returning now to FIG. 26(a), CPU 100, in step 672, multiplies the value of Δ obtained during step 656 by five, so that Δ=5Δ (with the value of Δ being stored in an internal register in CPU 100). From step 672, CPU 100 proceeds, in step 674, to determine the size of the deadband, that is, determines whether jumper JP1 has been installed or removed. If a deadband of 20% has been selected, no change is made to the value of Δ computed in step 672. If a deadband of 10% has been selected, CPU 100 proceeds, in step 676, to further multiply the value of Δ computed during step 672 by two, whereupon the value of Δ is ten times greater than that determined in step 656.

CPU 100 then proceeds to determine, in step 678, whether an under deadband condition exists, that is, CPU 100 determines whether (SPBYT−Δ)<0, where Δ is that value previously computed in steps 672 or 676. If the determination in step 678 is negative, e.g., the actual rate of power consumption is within the deadband, CPU 100 proceeds, in step 694, to clear the SRFLG operation flag and then to step 670 without making any change in the output status of the loads subject to demand limit control. However, if the determination in step 678 is affirmative, e.g., the actual rate of power consumption is under deadband, CPU 100 proceeds, in step 680, to determine if all bits of the LDENA data byte have been set.

As can be seen from a consideration of the OUTPUT & STAGE routine (FIG. 20), the determination in step 680 is affirmative only when CPU 100 has completed its staging of the turning on of one or more loads previously off. If the determination in step 680 is negative, CPU 100 proceeds to clear the SRFLG operation flag in step 694 and then to step 670 without effecting any change in the output status of those loads subject to demand limit control, in order to avoid interfering with the staging operation that is occuring during successive passes through the OUTPUT & STAGE routine. If the determination in step 680 is affirmative, CPU 100 proceeds, in step 682, to determine if the SRFLG operation flag has been set to its RSTOR state. Upon initialization, and at all other times when demand limit control is not calling for a load to be restored, the determination in step 682 is negative, whereupon CPU 100 proceeds, in step 684, to set the SRFLG operation flag to its RSTOR state. Thereafter, CPU 100, in step 686, sets the SRTMR timer to a count representing fifteen seconds. From step 686, CPU 100 proceeds, in step 688, to determine if the SRTMR timer has decremented to zero. Since SRTMR was just set in step 686, the determination in step 688 is negative, whereupon CPU 100 proceeds to step 670 without effecting any change in the output status of the loads subject to demand limit control. Thereafter, CPU 100 proceeds through its main program loop and returns to the DLR2 routine.

If the under deadband condition persists, and staging is not being accomplished, CPU 100 returns to step 682. At this time, the determination therein is affirmative, whereupon CPU 100 proceeds to step 688. It will be appreciated that CPU 100 will continue to loop through the DLR2 routine and through its main program loop until the determination in step 688 is affirmative, provided that the under deadband condition persists and staging is not being carried out. When the SRTMR timer has decremented to zero, the determination in step 688 is affirmative, whereupon CPU 100 proceeds, in step 690, to call the RESTORE subroutine. Provided that CPU 100 is able to place a load in a RESTORE state during the RESTORE subroutine (e.g., at least one load is previously in a SHED state and does not have a minimum timer running), the corresponding bit in SLOAD is cleared and the corresponding bit in RLOAD is set, and the S/R flag is also set. Upon exiting from the RESTORE subroutine in step 690, CPU 100 determines, in step 692, if a load was able to be restored, e.g., is the S/R flag set. If the determination in step 692 is affirmative, CPU 100 proceeds to clear the SRFLG operation flag in step 694, and to thereafter update the output status of the load now placed in a RESTORED state by changing the corresponding bit in the DLENA data byte in accordance with the clearing of that bit in RLOAD. The corresponding load is not turned on, however, until CPU 100 returns to the OUTPUT & STAGE routine. If the determination in step 692 is negative (e.g., either there is no load presently in a SHED state or minimum timers are running for all loads presently in a SHED state), CPU 100 returns directly to step 670 without effecting any change in the output status of the loads subject to demand limit control. If the under deadband condition persists, however, CPU 100 will, upon each pass through the DLR2 routine, proceed through the RESTORE subroutine in step 690 until such a time as a load is able to be placed in a RESTORED state.

If, after having placed a load in a RESTORED state in response to an under deadband condition, the under deadband condition persists for another fifteen seconds, it will be appreciated that CPU 100 will again enter the RESTORE subroutine in step 690 in an attempt to place another load in a RESTORED state. This process will continue until the actual rate of power consumption has been brought within the deadband and the determination in step 678 is negative.

While the invention has been described with reference to a preferred embodiment, it is to be clearly understood by those skilled in the art that the invention is not limited thereto. For example, the structure of the microprocessor and the set of program instructions stored therein may be easily modified to permit the user to enter, in any appropriate manner, desired values for the predetermined maximum interval during which any load is permitted to be SHED, the minimum intervals during which any load must be SHED or RESTORED, or the predetermined interval at which loads are either shed or restored in response, respectively, to an over set point or under deadband condition. Likewise, the user may be permitted to select and enter any desired value for the deadband, rather than being limited to a selection of one of two predetermined values thereof. As yet another example, the set of program instructions may be configured so as to permit the display of the actual rate of power consumption and the set point directly in units of power, such as kilowatts, rather than in percentages. Accordingly, the scope of the present invention is to be determined only in conjunction with the appended claims.

The embodiments of the invention in which an exclusive property or privilege is claimed are defined as follows:

1. An electronic controller for controlling the energization states of a plurality of electrical loads, said controller comprising:

a plurality of load control circuits, each said load control circuit being adapted to be interconnected with a load, and having a load-on state when its load is to be on, and a load-off state when its load is to be off;

clock means for determining real-time;

sensor means for measuring the actual rate of power consumption by the plurality of electrical loads;

set point selector means for selecting a set point representing a desired rate of power consumption by the plurality of electrical loads;

event memory means for storing a time schedule for real-time control of the plurality of electrical loads;

program memory means storing a set of program instructions;

processing means responsive to said set of program instructions for:

determining a desired real-time control output status for each load by: obtaining real-time from said clock means; obtaining said time schedule from said event memory means; and through comparison of said real-time with said time schedule, establishing an on state or an off state for each load, said on state representing a desired load-on state for the associated load control circuit and said off state representing a desired load-off state for the associated load control circuit;

determining a desired demand limit control output status for each load by: obtaining said actual power rate from said sensor means; obtaining said set point from said set point selector means; determining a shed condition when said actual power rate equals or exceeds said set point, and determining a restore condition when said actual power rate is less than said set point; establishing a demand group of the plurality of electrical loads; transferring a load into said demand group upon occurrence of an on state for the load and transferring a load out of said demand group upon occurrence of an off state for the load; establishing a shed group and a restored group within said demand group, the loads within said shed group having a shed state representing a desired load-off state for the associated load control circuit and the loads within said restored group having a restored state representing a desired load-on state for the associated load control circuit; upon determination of said shed condition, transferring at least one load from said restored group to said shed group; and, upon determination of said restore condition, transferring at least one load from said shed group to said restored group; and, controlling the actual energization state of each load by, for each load in said demand group, placing said load control circuit for the load into said load-on state upon occurrence of said restored state for the load and into said load-off state upon occurrence of said shed state for the load, and, for each remaining load, placing said load control circuit for the load into said load-on state upon occurrence of said on state for the load and into said load-off state upon occurrence of said off state for the load.

2. A controller as recited in claim 1, further comprising means for detecting an inhibit signal; and, wherein said processing means is responsive to said detected inhibit signal to control the actual energization state of each load in accordance only with the desired real-time control output status thereof for the duration of said detected inhibit signal.

3. A controller as recited in claim 1, further comprising means for selecting any load of the plurality of electrical loads for demand limit control; and, wherein said processing means is operative to maintain in said demand group only those ones of the plurality of electrical loads that have been selected for demand limit control.

4. A controller as recited in claim 3, wherein said means for selecting comprises a manually-actuable switch for each load; and, wherein said processing means is operative to interrogate each said manually-actuable switch to establish and maintain said demand group.

5. A controller as recited in claim 3, wherein said processing means is operative to inhibit the removal of any load from said demand group by deselection of the load when the load has a shed state, until the elapse of a predetermined interval following the time that the load was transferred into said shed group.

6. A controller as recited in claim 5, further comprising a minimum timer for each load, each said minimum timer being controlled by said processing means to run for said predetermined interval when started by said processing means; and wherein said processing means is operative to start the minimum timer for a load that the time that the load is transferred into said shed group, and to inhibit the removal of the load from said demand group until said minimum timer has stopped running.

7. A controller as recited in claim 1, wherein said processing means is operative to inhibit any load in one of said shed and restored groups from being transferred to the other of said shed and restored groups, until the elapse of a predetermined interval following the time that the load was transferred into said one of said shed and restored groups.

8. A controller as recited in claim 7, further comprising a minimum timer for each load; each said minimum timer being controlled by said processing means to run for said predetermined interval when started by said processing means; and, wherein said processing means is operative to start the minimum timer for a load at the time that the load is first placed into said one of said shed and restored groups and to inhibit the transfer of the load from said one of said shed and restored groups until said minimum timer has stopped running.

9. A controller as recited in claim 1, wherein said processing means is operative to limit the amount of time that any load is in said shed group.

10. A controller as recited in claim 9, wherein said processing means is operative to automatically transfer a load from said shed group to said restored group and another load from said restored group to said shed group, at intervals whose duration is inversely proportional to the number of loads in said shed group.

11. A controller as recited in claims 1 or 10, wherein said processing means is operative to transfer loads between said shed group and said restored group in a predetermined order.

12. A controller as recited in claim 1, wherein said processing means is operative to: establish a deadband whose upper limit is defined by said set point and whose lower limit is a predetermined amount below said set point; determine said shed condition when said actual power rate equals or exceeds the upper limit of said deadband; and, determine said restore condition when said actual power rate is less than the lower limit of said deadband.

13. A controller as recited in claim 12, further comprising means for selecting the predetermined amount of said deadband.

14. A controller as recited in claims 1 or 12, wherein said processing means is operative to transfer a load from said restored group to said shed group only if said shed condition persists for a predetermined interval.

15. A controller as recited in claims 1 or 12, wherein said processing means is operative to transfer a load from said shed group to said restored group only if said restore condition persists for a predetermined interval.

16. A controller as recited in claim 1, wherein said processing means is operative to detect an initialization condition, and to transfer all of the plurality of electrical loads into said shed group upon detection of said initialization condition.

17. A controller as recited in claim 1, further comprising display means for displaying data related to said real-time control and to said demand limit control.

18. A controller as recited in claim 17, further comprising display selection means for enabling the display of either data related to real-time control or data related to demand limit control; and, wherein said processing means is responsive to said display selection means to transfer either said data related to said real-time control or said data related to said demand limit control to said display means for display thereby.

19. A controller as recited in claim 18, wherein said display selection means comprises a manually-actuable switch having rest, set point and actual power rate positions; and wherein said processing means is operative to transfer said data related to real-time control to said display means when said switch is in said rest position, to transfer data related to said actual power rate to said display means when said switch is in said actual power rate position, and to transfer data related to said set point to said display means when said switch is in said set point position.

20. An apparatus that permits an electronic controller, adapted to provide real-time control of the energization states of a plurality of electrical loads, to also provide demand limit control of the loads, the controller including a clock means determining real-time, an event memory storing a time schedule for real-time control, a program memory storing a set of program instructions for real-time control, and a processing means for excuting the set of program instructions to implement real-time control by comparing real-time from the clock means with the time schedule in the event memory, and accordingly determining an on state or an off state for each load, and by energizing those loads in an on state and by de-energizing those loads in an off state, said apparatus comprising:

a second program memory storing a set of program instructions for demand limit control;

first means for providing an input analog signal representing the actual rate of power consumption by the plurality of electrical loads;

second means for providing a set point analog signal representing a desired rate of power consumption;

digital-to-analog signal conversion means for converting a digital signal from said processing means into a corresponding analog signal;

a first comparator for comparing said input analog signal with said analog signal from said digital-to-analog signal conversion means to provide a first digital signal representative of the difference therebetween;

a second comparator for comparing said set point analog signal with said analog signal from said digital-to-analog signal conversion means to provide a second digital signal representative of the difference therebetween;

input/output port means for transferring said first and said second digital signals to said processing means, and for transferring a digital signal which selectively represents an approximation of said actual rate of power consumption and said desired rate of power consumption from said processing means to said digital-to-analog signal conversion means;

said processing means being operative to execute said set of program instructions stored in said second program memory to implement demand limit control by:

obtaining actual rate and set point data by causing said digital signal transferred to said digital-to-analog signal conversion means through said input/output port means to selectively approximate said actual rate of power consumption and said desired rate of power consumption and by selectively monitoring, through said input/output port means, said first and said second digital signals from said first and second comparators;

comparing said actual rate data with set point data; and, for those loads in an on state under real-time control, varying the number of loads actually energized and de-energized so as to maintain said actual rate substantially equal to said set point.

21. An apparatus as recited in claim 20, further comprising a plurality of demand select switches interconnected with said input/output port means, with the actuation and deactuation of each said demand select switch representing, respectively, the selection and de-selection of an associated load for demand limit control; and, wherein said processing means is operative to interrogate said plurality of demand select switches through said input/output port means, and to implement demand limit control only for those loads whose associated demand select switch has been actuated.

22. An apparatus as recited in claim 20, further comprising a source of a demand limit control inhibit signal; wherein said input/output port means is further operative to transmit said demand limit control inhibit signal to said processing means; and, wherein said processing means is responsive to said demand limit control inhibit signal to inhibit the implementation of demand limit control for the plurality of electrical loads.

23. An apparatus as recited in claim 20, for use with a controller that further includes display means and in which said processing means is further operative to store data related to real-time control, and to transfer said data related to real-time control to said display means for display thereby, said apparatus further comprising a display select switch having rest, set point and actual rate positions, said display select switch being interconnected with said input/output port means; and wherein said processing means is further operative to interrogate said display select switch through said input/output port means, to transfer said data related to real-time control means to said display means when said display select switch is in said rest position, to transfer said actual rate data to said display means upon actuation of said display select switch to said actual rate position, and to transfer said set point data to said display means upon actuation of said display select switch to said set point position.

* * * * *

UNITED STATES PATENT AND TRADEMARK OFFICE
CERTIFICATE OF CORRECTION

PATENT NO. : 4,357,665

DATED : November 2, 1982

INVENTOR(S) : William W. Korff

Page 1 of 4

It is certified that error appears in the above-identified patent and that said Letters Patent are hereby corrected as shown below:

Column 3, line 55, "A" should read --a--
Column 12, line 23, "11111" should read --leads--
Column 13, line 46, "RD1" should read --$\overline{RD1}$--
Column 13, line 46, "WR1" should read --$\overline{WR1}$--
Column 17, line 26, "vols" should read --volts--
Column 17, line 37, "minatained" should read --maintained--
Column 18, line 37, "cetain" should read --certain--
Column 20, line 51, insert --when-- after "cleared"
Column 27, line 40, "of" should read --if--
Column 27, line 66, "therefore" should read --therefor--
Column 29, line 15, insert --,--(comma) after "function"
Column 29, line 52, insert --,--(comma) after "318"
Column 31, line 15, delete --,--(comma) after "100"
Column 35, line 49, insert --:--after "when"
Column 36, line 42, Table V, line 14, "LDIEN" should read --LD1EN--
Column 36, line 43, Table V, line 15, "LDIEN" should read --LD1EN--
Column 37, line 1, Table VI, line 10, "LDIEN" should read --LD1EN--
Column 37, line 2, Table VI, line 11, "LDIEN" should read --LD1EN--
Column 37, line 32, delete --,--(comma) after "100"
Column 38, line 25, "RD1" should read --$\overline{RD1}$--

UNITED STATES PATENT AND TRADEMARK OFFICE
CERTIFICATE OF CORRECTION

PATENT NO. : 4,357,665

DATED : November 2, 1982

INVENTOR(S) : William W. Korff

It is certified that error appears in the above-identified patent and that said Letters Patent are hereby corrected as shown below:

Column 38, line 25, "WR1" should read --$\overline{WR1}$--
Column 38, line 27, "RD1" should read --$\overline{RD1}$--
Column 40, line 20, insert --,--(comma) after "respectively"
Column 41, line 63, delete --of-- after "switch"
Column 43, line 2, "IN/SP$_{100}$represent" should read --IN/SP$_{100}$, represent--
Column 43, line 7, "ther" should read --the--
Column 43, line 35, insert --,--(comma) after "600"
Column 48, line 29, "in" should read --it--
Column 49, line 9, "SLOAD" should read --$\overline{SLOAD}$--
Column 49, line 19, "(OLD) RLOAD" should read --$\overline{(OLD)}$ $\overline{RLOAD}$--
Column 49, line 38, "remained" should read --remain--
Column 49, line 68, "DLOAD" should read --$\overline{DLOAD}$--
Column 50, line 14, "power up" should read --POWER UP--
Column 50, line 28, "If" should read --It--
Column 50, line 33, insert --as-- after "However,"
Column 50, line 55, "indicated" should read --indicate--
Column 50, line 58, "step" should read --steps--
Column 51, line 6, "let" should read --Let--
Column 53, line 11, "ae" should read --are--
Column 53, line 48, "FIG. 28)" should read --(FIG. 28)--

UNITED STATES PATENT AND TRADEMARK OFFICE
CERTIFICATE OF CORRECTION

PATENT NO. : 4,357,665                        Page 3 of 4

DATED : November 2, 1982

INVENTOR(S) : William W. Korff

It is certified that error appears in the above—identified patent and that said Letters Patent is hereby corrected as shown below:

Column 53, line 62, "it" should read --is--
Column 55, line 54, "CPUT" should read --CPU--
Column 58, line 58, after "state." a new paragraph should be started
Column 59, line 63, insert --,--(comma) after "670"
Column 61, line 52, "occuring" should read --occurring--
Column 64, line 41, "that" should read --at--
Column 65, line 62, "excuting" should read --executing--
Column 66, line 40, insert --, respectively-- after "comparators"

Columns 3 and 4 should appear as shown per attached sheet.

Signed and Sealed this

Twelfth Day of July 1983

[SEAL]

Attest:

Attesting Officer

GERALD J. MOSSINGHOFF

Commissioner of Patents and Trademarks provided by the programmable electronic real-time load controller.

It is yet another object of this invention to provide such an apparatus which allows the user to select or de-select any given load for demand limit control.

It is still another object of this invention to provide such an apparatus whose implementation of demand limit control can be enabled or disabled in response to an external device, or, at predetermined times established by the programmable electronic real-time load controller.

It is a further object of this invention to provide such an apparatus which permits the controller to maintain any load selected for demand limit control either on or off for predetermined, minimum times so as to avoid excessive on-off cycling of the load.

It is yet a further object of this invention to provide such an apparatus which permits the controller to rotate the off states of those loads selected for demand limit control so as to minimize the maximum off time of any such load.

It is still a further object of this invention to provide such an apparatus which permits the controller to rotate the on/off states of loads selected for demand limit control in a predetermined order.

It is still a further object of this invention to provide such an apparatus which can be implemented in an easy and inexpensive manner by the use of readily available, integrated circuit, microprocessor components which are compatible with and which function under control of the data processor within the programmable electronic real-time load controller.

SUMMARY OF THE INVENTION

The foregoing objects, and other objects and advantages that will be apparent from a consideration of the specification, are achieved in an apparatus that permits an electronic controller, adapted to provide real-time control of the energization states of the plurality of electrical loads, to also provide demand limit control of the loads. The apparatus is particularly adapted for use with a controller of the type including a clock means determining real-time, an event memory storing a time schedule for real-time control, a program memory storing a set of program instructions for real-time control, and a processing means for executing the set of program instructions to implement real-time control by comparing real-time from the clock means with the time schedule in the event memory, and accordingly determining an on state or an off state for each load, and by energizing those loads in an on state and by deenergizing those loads in an off state.

The apparatus comprises:

A second program memory storing a set of program instructions for demand limit control;

first means for providing an input analog signal representing the actual rate of power consumption by the plurality of electrical loads;

second means for providing a set point analog signal representing a desired rate of power consumption;

digital-to-analog signal conversion means for converting a digital signal from the processing means into a corresponding analog signal;

a first comparator for comparing the input analog signal with the analog signal from the digital-to-analog signal conversion means to provide a first digital signal representative of the difference therebetween;

a second comparator for comparing the set point analog signal with the analog signal from the digital-to-analog signal conversion means to provide a second digital signal representative of the difference therebetween; and, input/output port means for transferring the first and second digital signals to the processing means, and for transferring a digital signal which selectively represents an approximation of the actual rate of power consumption and the desired rate of power consumption from the processing means to the digital-to-analog signal conversion means.

The processing means is operative to execute the set of program instructions stored in the second program memory to implement demand limit control by:

obtaining actual power rate and set point data by causing the digital signal transferred to the digital-to-analog signal conversion means through the input/output port means to selectively approximate the actual rate of power consumption and the desired rate of power consumption and by selectively monitoring, through the input/output port means, of the first and second digital signals from the first and second comparators, respectively;

comparing the actual rate data with the set point data; and, for those loads in an on state under real-time control, varying the number of loads actually energized and de-energized so as to maintain the actual rate substantially equal to the set point.

The foregoing objects, as well as other objects and advantages, are also realized in an electronic controller for controlling the energization states of the plurality of electrical loads to implement both real-time control and demand limit control thereof. A plurality of load control circuits are provided, each said load control circuit being adapted to be interconnected with a load, and having a load-on state when its load is to be on, and a load-off state when its load is to be off. Also provided are a clock means for determining real-time; a sensor means for measuring the actual rate of power consumption by the plurality of electrical loads; and, set point selector means for selecting a set point representing a desired rate of power consumption by the plurality of electrical loads. An event memory means is provided for storing a time schedule for real-time control, and a program memory means is provided which stores a set of program instructions.

A processing means is responsive to the set of program instructions for:

determining a desired real-time control output status for each load by: obtaining real-time from the clock means; obtaining the time schedule from the event memory means; and, through comparison of real-time with the time schedule, establishing an on state or an off state for each load, the on state representing a desired load-on state for the associated load control circuit and the off state representing a desired load-off state for the associated load control circuit;

determining a desired demand limit control output status for each load by: obtaining the actual power rate from the sensor means; obtaining the set point from the set point selector means; determining a shed condition when the actual power rate equals or exceeds the set point, and determining a restore condition when the actual power rate is less than the set point; establishing a demand group of the plurality of electrical loads; transferring a load into the demand group upon occur-